(12) United States Patent
Hwang et al.

(10) Patent No.: US 10,700,085 B2
(45) Date of Patent: Jun. 30, 2020

(54) VERTICAL MEMORY DEVICES

(71) Applicant: SAMSUNG ELECTRONICS CO., LTD., Suwon-si (KR)

(72) Inventors: Sung-Min Hwang, Hwaseong-si (KR);
Dong-Sik Lee, Hwaseong-si (KR);
Joon-Sung Lim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/010,743

(22) Filed: Jun. 18, 2018

(65) Prior Publication Data

US 2019/0035808 A1    Jan. 31, 2019

(30) Foreign Application Priority Data

Jul. 31, 2017    (KR) .................. 10-2017-0096719

(51) Int. Cl.
| | | |
|---|---|---|
| *H01L 27/11582* | (2017.01) | |
| *H01L 27/11568* | (2017.01) | |
| *H01L 27/11573* | (2017.01) | |
| *H01L 23/528* | (2006.01) | |
| *H01L 23/522* | (2006.01) | |
| *H01L 27/11565* | (2017.01) | |

(Continued)

(52) U.S. Cl.
CPC ...... *H01L 27/11582* (2013.01); *H01L 23/528* (2013.01); *H01L 23/5226* (2013.01); *H01L 27/1157* (2013.01); *H01L 27/11565* (2013.01); *H01L 27/11568* (2013.01); *H01L 27/11573* (2013.01); *H01L 27/11575* (2013.01); *H01L 21/0217* (2013.01); *H01L 21/0273* (2013.01); *H01L 21/02636* (2013.01); *H01L 21/26513* (2013.01); *H01L 21/31053* (2013.01); *H01L 21/31144* (2013.01); *H01L 21/7684* (2013.01); *H01L 21/76897* (2013.01); *H01L 29/40117* (2019.08)

(58) Field of Classification Search
CPC ....................... H01L 27/11582; H01L 23/5226
USPC ......................................................... 257/324
See application file for complete search history.

(56) References Cited

U.S. PATENT DOCUMENTS

| | | |
|---|---|---|
| 8,268,687 B2 | 9/2012 | Hyun et al. |
| 8,335,109 B2 | 12/2012 | Seol et al. |

(Continued)

FOREIGN PATENT DOCUMENTS

KR    10-2012-0121171 A    11/2012

*Primary Examiner* — Igwe U Anya
(74) *Attorney, Agent, or Firm* — Sughrue Mion, PLLC

(57) ABSTRACT

A vertical memory device is provided. The vertical memory device includes a substrate, first gate electrodes, a channel, first wirings, and second wirings. The substrate includes a cell region and a peripheral circuit region. The first gate electrodes are spaced apart from each other in a first direction on the cell region of the substrate, the first direction being substantially perpendicular to the substrate. The channel extends through a portion of the first gate electrodes in the first direction on the cell region. The first wirings are formed on the cell region, and are disposed at first levels that are higher in the first direction than gate electrode levels on which the first gate electrodes are respectively formed. The second wirings are formed on the peripheral circuit region, and are disposed at the first levels and at a second level that is higher than the gate electrode levels.

19 Claims, 56 Drawing Sheets

(51) Int. Cl.
    *H01L 27/11575*    (2017.01)
    *H01L 27/1157*     (2017.01)
    *H01L 21/768*      (2006.01)
    *H01L 21/265*      (2006.01)
    *H01L 21/311*      (2006.01)
    *H01L 21/027*      (2006.01)
    *H01L 21/3105*     (2006.01)
    *H01L 21/02*       (2006.01)
    *H01L 21/28*       (2006.01)

(56) References Cited

U.S. PATENT DOCUMENTS

| | | | |
|---|---|---|---|
| 8,450,176 B2 | 5/2013 | Son et al. | |
| 8,811,082 B2 | 8/2014 | Kwon et al. | |
| 9,153,705 B2 | 10/2015 | Zhang et al. | |
| 9,449,986 B1* | 9/2016 | Yoon | H01L 27/11582 |
| 9,455,268 B2 | 9/2016 | Oh et al. | |
| 2012/0299082 A1* | 11/2012 | Park | H01L 27/11573 |
| | | | 257/319 |
| 2015/0129878 A1* | 5/2015 | Shin | H01L 27/11578 |
| | | | 257/66 |
| 2015/0137216 A1 | 5/2015 | Lee et al. | |
| 2015/0294977 A1* | 10/2015 | Kim | H01L 27/11573 |
| | | | 257/314 |
| 2015/0294997 A1* | 10/2015 | Kim | H01L 27/1463 |
| | | | 257/432 |
| 2016/0204111 A1* | 7/2016 | Park | H01L 23/3171 |
| | | | 257/324 |
| 2016/0225714 A1* | 8/2016 | Yun | H01L 27/11573 |
| 2017/0103993 A1* | 4/2017 | Lee | H01L 27/11565 |
| 2018/0358374 A1* | 12/2018 | Kim | H01L 27/1157 |

\* cited by examiner

VERTICAL MEMORY DEVICES

CROSS-REFERENCE TO RELATED APPLICATIONS

This application claims priority under 35 USC § 119 to Korean Patent Application No. 10-2017-0096719, filed on Jul. 31, 2017 in the Korean Intellectual Property Office (KIPO), the contents of which are herein incorporated by reference in their entirety.

BACKGROUND

1. Field

Apparatuses, devices, and articles of manufacture consistent with the present disclosure relate to vertical memory devices and, more particularly, to vertical non-volatile memory devices including upper wirings.

2. Description of the Related Art

In a VNAND flash memory device, word lines in a single cell block have to be electrically connected to each other, and connecting wirings may be disposed on contact plugs on the word lines. Thus, the connecting wirings may be disposed in a complicated layout on a mold including the word lines in a cell region.

SUMMARY

It is an aspect to provide a vertical memory device having good characteristics.

According to an aspect of an example embodiment, there is provided a vertical memory device comprising a substrate including a cell region and a peripheral circuit region; a plurality of first gate electrodes spaced apart from each other on the cell region of the substrate, the plurality of first gate electrodes spaced apart from each other in a first direction substantially perpendicular to an upper surface of the substrate; a channel extending through at least a portion of the plurality of first gate electrodes in the first direction on the cell region of the substrate; a plurality of first wirings on the cell region of the substrate, the plurality of first wirings being disposed at a plurality of first levels that are higher in the first direction than a plurality of gate electrode levels on which the plurality of first gate electrodes are respectively formed; and a plurality of second wirings on the peripheral circuit region of the substrate, the plurality of second wirings being disposed at the plurality of first levels and at a second level that is higher than the plurality of gate electrode levels.

According to an aspect of an example embodiment, there is provided a vertical memory device comprising a substrate including a cell region and a peripheral circuit region; a plurality of gate electrodes spaced apart from each other on the cell region of the substrate in a first direction substantially perpendicular to an upper surface of the substrate; a channel extending through at least a portion of the plurality of gate electrodes in the first direction on the cell region of the substrate; a plurality of first contact plugs contacting gate electrode upper surfaces of the plurality of gate electrodes, respectively, and extending in the first direction; a plurality of second contact plugs extending in the first direction on the peripheral circuit region of the substrate, second contact plug upper surfaces of the plurality of second contact plugs being substantially coplanar with first contact plug upper surfaces of the plurality of first contact plugs; a plurality of first vias contacting the first contact plug upper surfaces, respectively, and extending in the first direction; and a first wiring commonly contacting the second contact plug upper surfaces of at least two of the plurality of second contact plugs on the peripheral circuit region of the substrate.

According to an aspect of an example embodiment, there is provided a vertical memory device comprising a substrate including a cell region and a peripheral circuit region; a plurality of gate electrodes spaced apart from each other on the cell region of the substrate in a first direction substantially perpendicular to an upper surface of the substrate; a channel extending through at least a portion of the plurality of gate electrodes in the first direction on the cell region of the substrate; a plurality of first contact plugs contacting gate electrode upper surfaces of the plurality of gate electrodes, respectively, and extending in the first direction; a second contact plug extending in the first direction on the peripheral circuit region of the substrate, a second contact plug upper surface of the second contact plug being substantially coplanar with first contact plug upper surfaces of the plurality of first contact plugs; a plurality of first vias contacting the first contact plug upper surfaces of the plurality of first contact plugs, respectively, and extending in the first direction; a first wiring including a first portion and a second portion on the peripheral circuit region of the substrate, the first portion extending in a second direction substantially parallel to the upper surface of the substrate, and the second portion extending in a third direction substantially parallel to the upper surface of the substrate and substantially perpendicular to the second direction; a second via contacting a first wiring upper surface of the first wiring and extending in the first direction; a second wiring contacting a second via upper portion of the second via and extending in at least one of the second direction and the third direction on the peripheral circuit region of the substrate; and a third wiring contacting first via upper portions of the first vias and extending in at least one of the second direction and the third direction on the cell region of the substrate.

DETAILED DESCRIPTION

The above and other aspects of various example embodiments will become readily understood from detail descriptions that follow, with reference to the accompanying drawings.

In the vertical memory device in accordance with example embodiments, upper wirings for electrically connecting word lines to each other in the same word line block are not formed, so that more space for the upper wirings may be obtained on the cell region of the substrate.

FIGS. 1 to 11 are plan views, cross-sectional views, and perspective views illustrating a vertical memory device in accordance with example embodiments. Particularly, FIGS.

Figure 10:
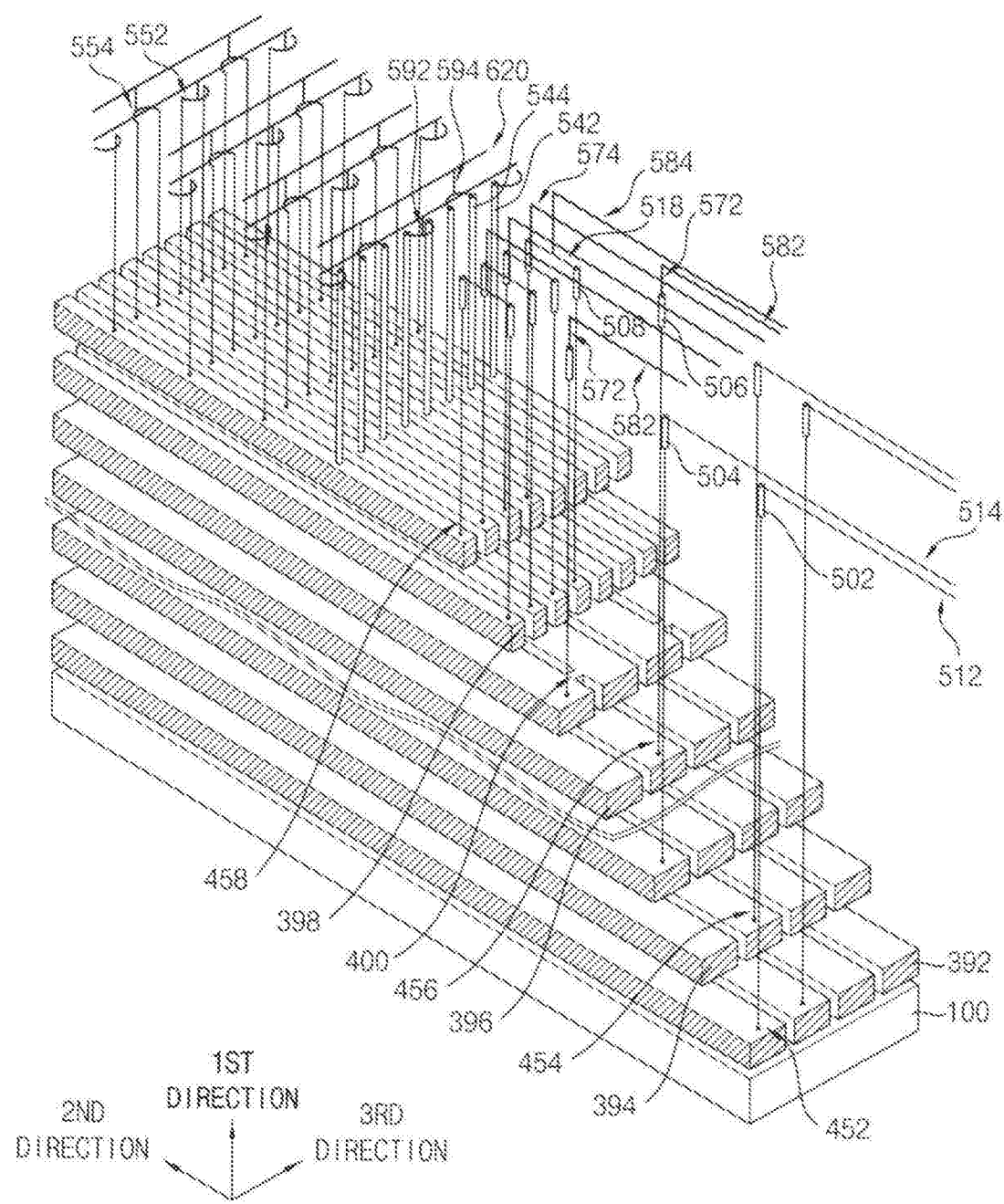
Figure 11:
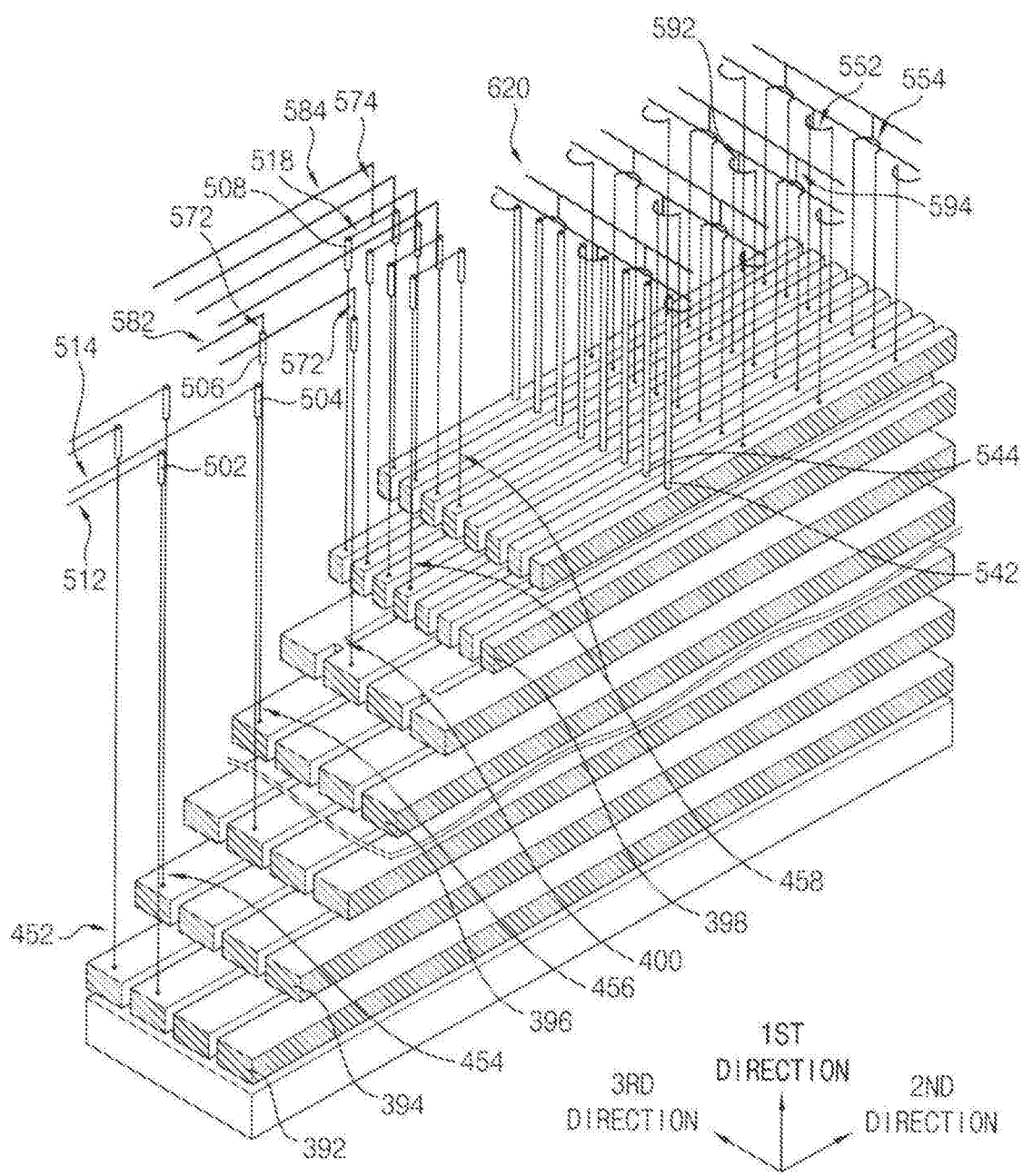

1 and 2 are plan views, FIGS. 3 to 9 are cross-sectional views, and FIGS. 10 and 11 are perspective views.

Figure 1:
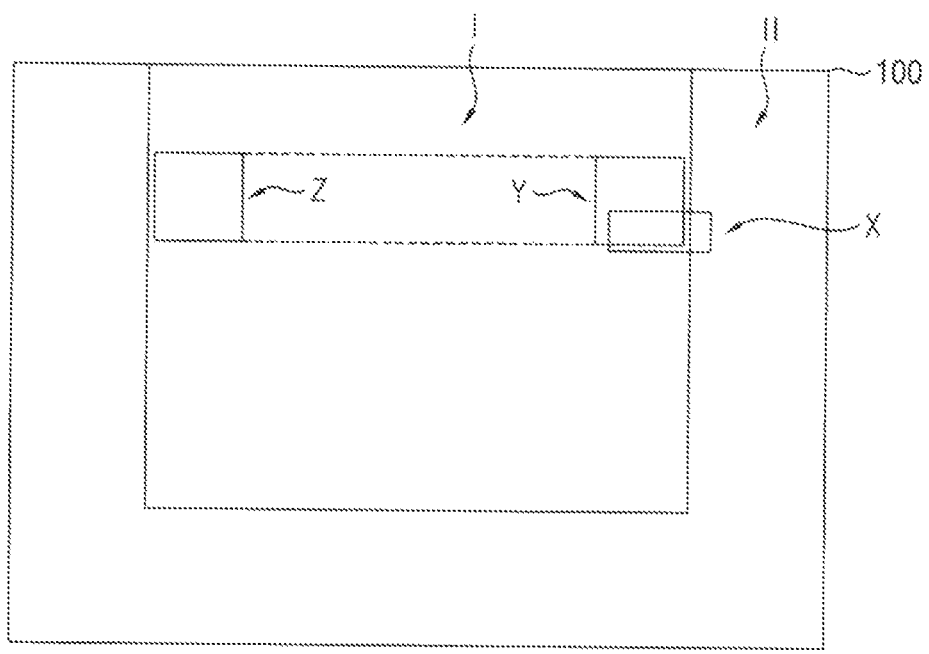
FIGS. 1 to 11 are plan views, cross-sectional views, and perspective views illustrating a vertical memory device in accordance with example embodiments.

The plan views and the cross-sectional views are drawings showing a region X of FIG. 1, and the perspective views are drawings showing a region Y or a region Z of FIG. 1. In order to avoid introducing too much complexity into the drawings, some elements are not shown or are differently shown in the perspective views. For example, some of sixth and seventh vias 542 and 544 are shown not by cylinders but by lines.

Figure 2:
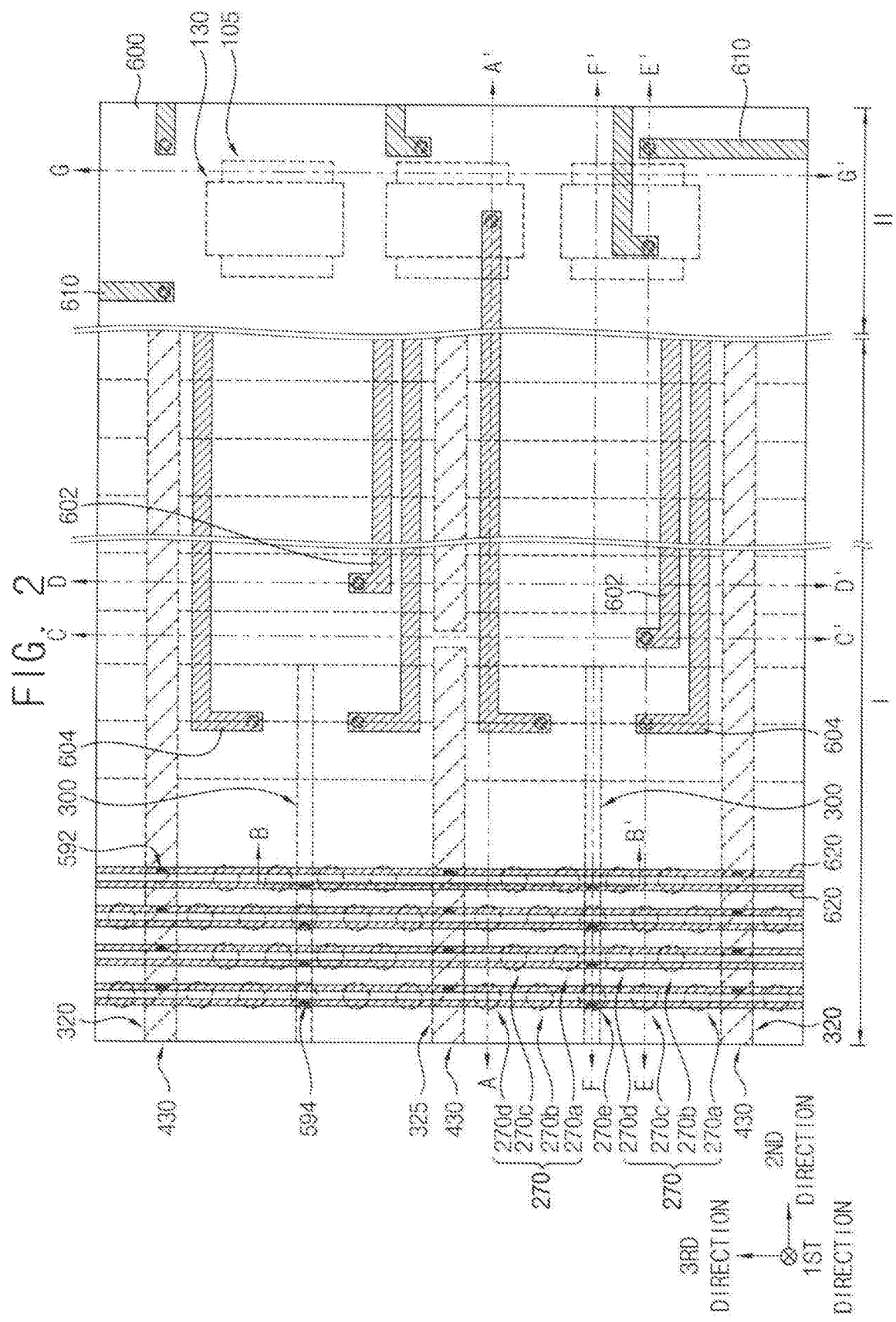
Figure 3:
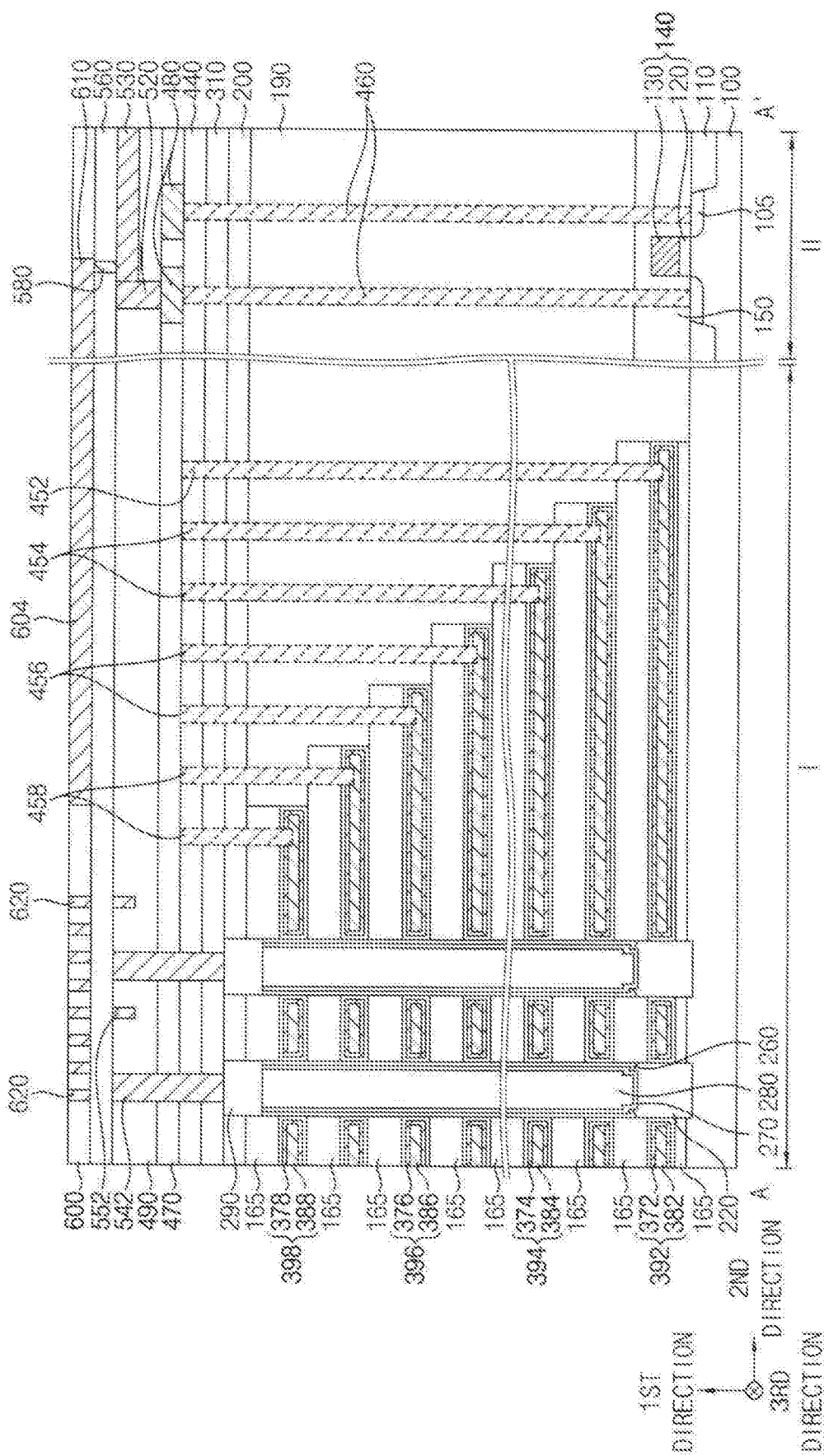

FIGS. 3 to 9 are cross-sectional views taken along lines A-A', B-B', C-C', D-D', E-E', F-F' and G-G', respectively, of FIG. 2.

Hereinafter, a direction substantially perpendicular to an upper surface of a substrate may be defined as a first direction, and two directions substantially parallel to the upper surface of the substrate and crossing each other may be defined as a second direction and a third direction, respectively. In example embodiments, the second and third directions may be substantially perpendicular to each other.

Referring to FIG. 1, a substrate 100 may include a first region I and a second region II.

The substrate 100 may include silicon, germanium, silicon-germanium or a III-V compound such as GaP, GaAs, GaSb, etc. In some example embodiments, the substrate 100 may be a silicon-on-insulator (SOI) substrate or a germanium-on-insulator (GOI) substrate.

In example embodiments, the first region I and the second region II of the substrate 100 may serve as a cell region and a peripheral circuit region, respectively. Memory cells may be formed on the first region I of the substrate 100, and peripheral circuits for driving the memory cells may be formed on the second region II of the substrate 100.

Hereinafter, only the region X including portions of the first region I and the second region II of the substrate 100 will be explained, and the region Y or the region Z that is larger than the region X in the first region I will be explained, only if it is necessary.

Referring to FIGS. 2 to 11, the vertical memory device may include a first gate electrode 392, a second gate electrode 394, a third gate electrode 396, and a fourth gate electrode 398, a second wiring 512, a third wiring 514, and a fourth wiring 518, a sixth wiring 552, a seventh wiring 554, an eighth wiring 602, and a ninth wiring 604, and an eleventh wiring 620 on the first region I of the substrate 100, and a gate structure 140, and a first wiring 480, a fifth wiring 530, and a tenth wiring 610 on the second region II of the substrate 100.

The vertical memory device may further include a conductive connection portion 400, a first contact plug 452, a second contact plug 454, a third contact plug 456, and a fourth contact plug 458, a first via 502, a second via 504, a third via 506, and a fourth via 508, a sixth via 542 and a seventh via 544, a sixth contact plug 572 and a seventh contact plug 574, and a ninth contact plug 592 and a tenth contact plug 594 on the first region I of the substrate 100, and a fifth contact plug 460 and an eighth contact plug 580 and a fifth via 520 on the second region II of the substrate 100.

Furthermore, the vertical memory device may include an insulation pattern 165, a first division layer 180 and a second division layer 300, a semiconductor pattern 220, a charge storage structure 260, a filling pattern 280, a capping pattern 290, a second blocking layer 340, a common source line (CSL) 430, a second spacer 420, and a first insulating interlayer 150, a second insulating interlayer 190, a third insulating interlayer 200, a fourth insulating interlayer 310, a fifth insulating interlayer 440, a sixth insulating interlayer 470, a seventh insulating interlayer 490, an eighth insulating interlayer 560, and a ninth insulating interlayer 600 on the substrate 100. A first impurity region 105 and a second impurity region 410 may be formed at upper portions of the first and second regions I and II, respectively, of the substrate 100.

The first to fourth gate electrodes 392, 394, 396 and 398 may be formed at a plurality of levels on the first region I of the substrate 100, and may be spaced apart from each other in the first direction.

The insulation pattern 165 may be formed between neighboring ones of the first to fourth gate electrodes 392, 394, 396 and 398 sequentially stacked in the first direction. The insulation pattern 165 may include an oxide, e.g., silicon oxide.

Figure 4:
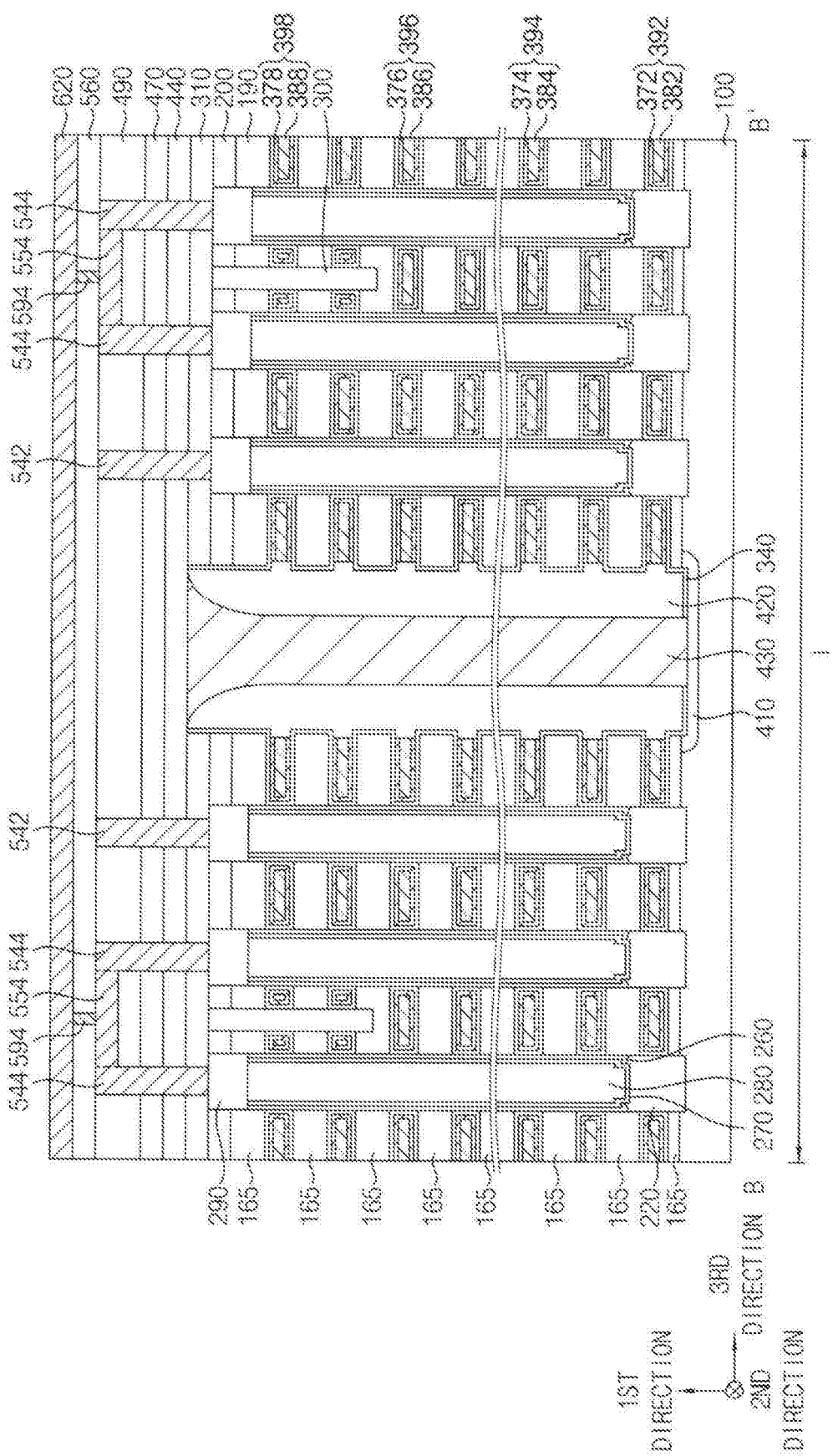
Figure 5:
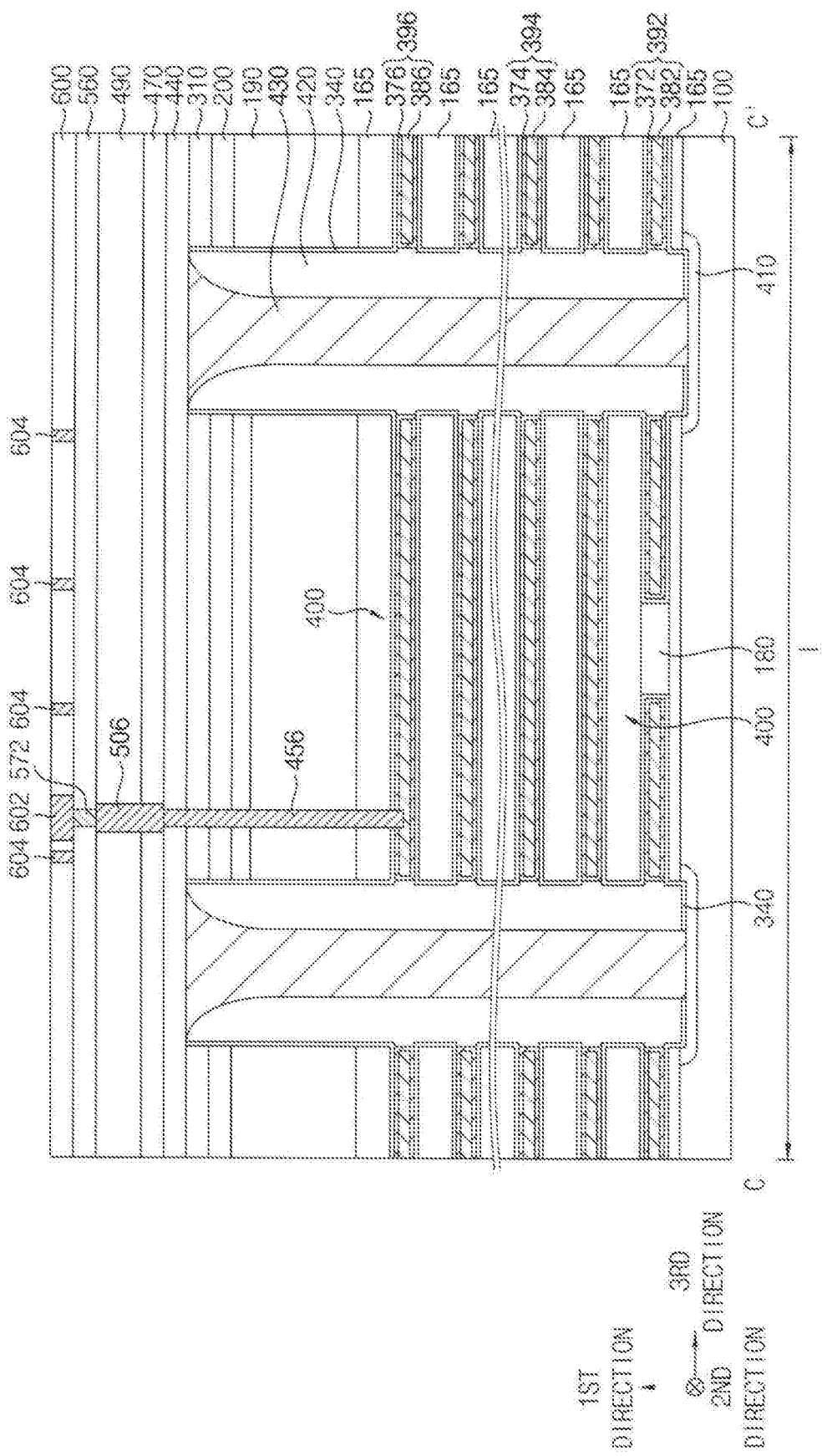
Figure 6:
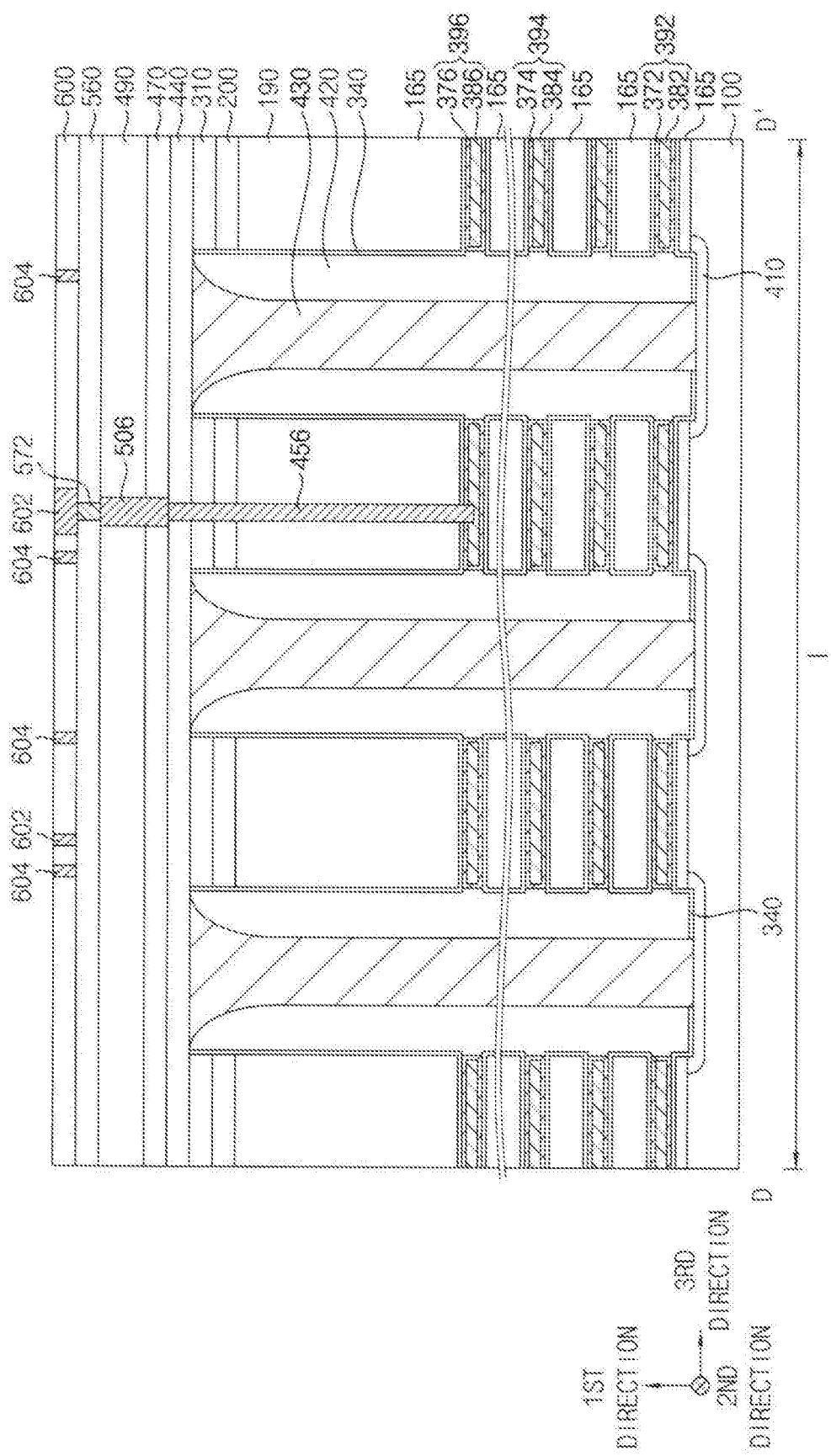
Figure 7:
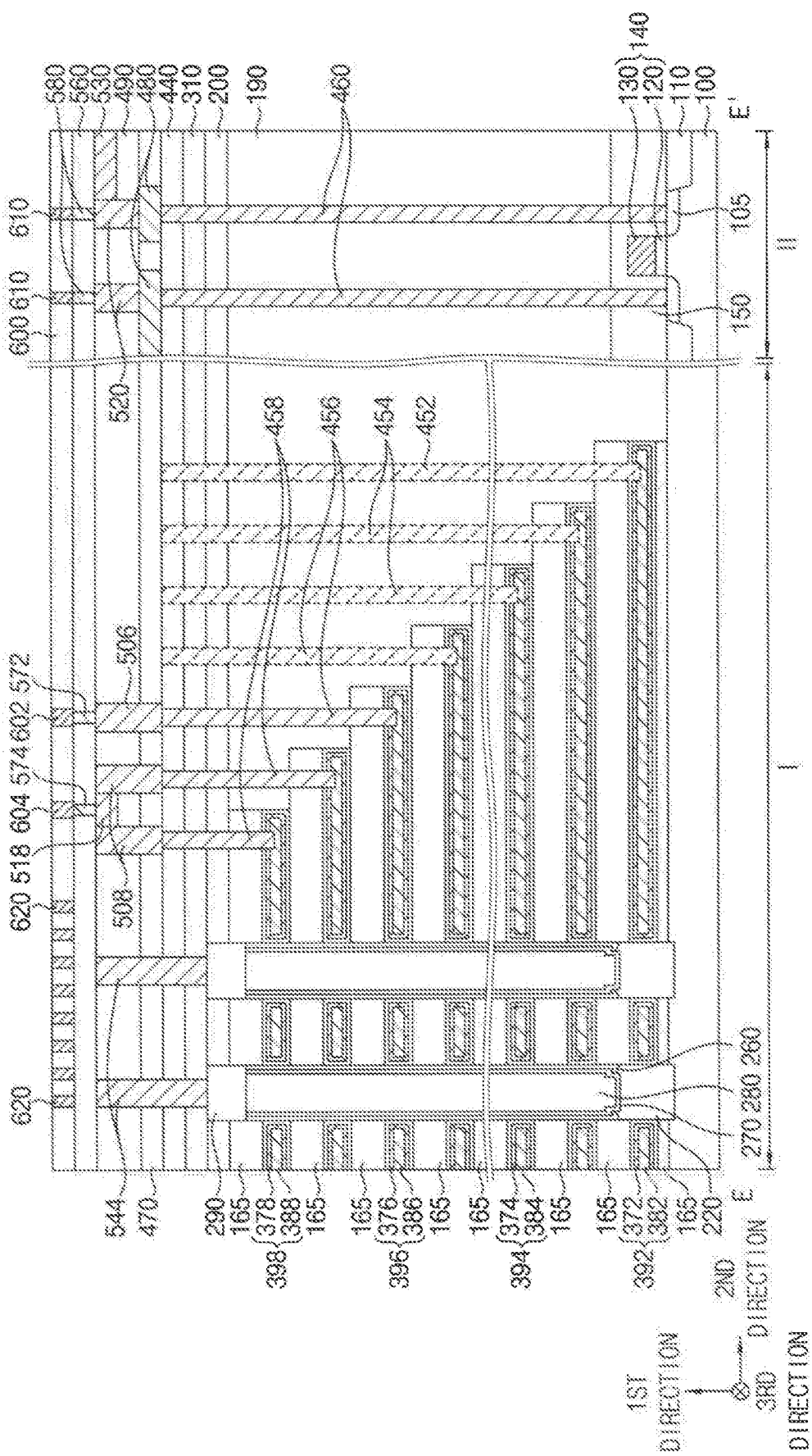
Figure 8:
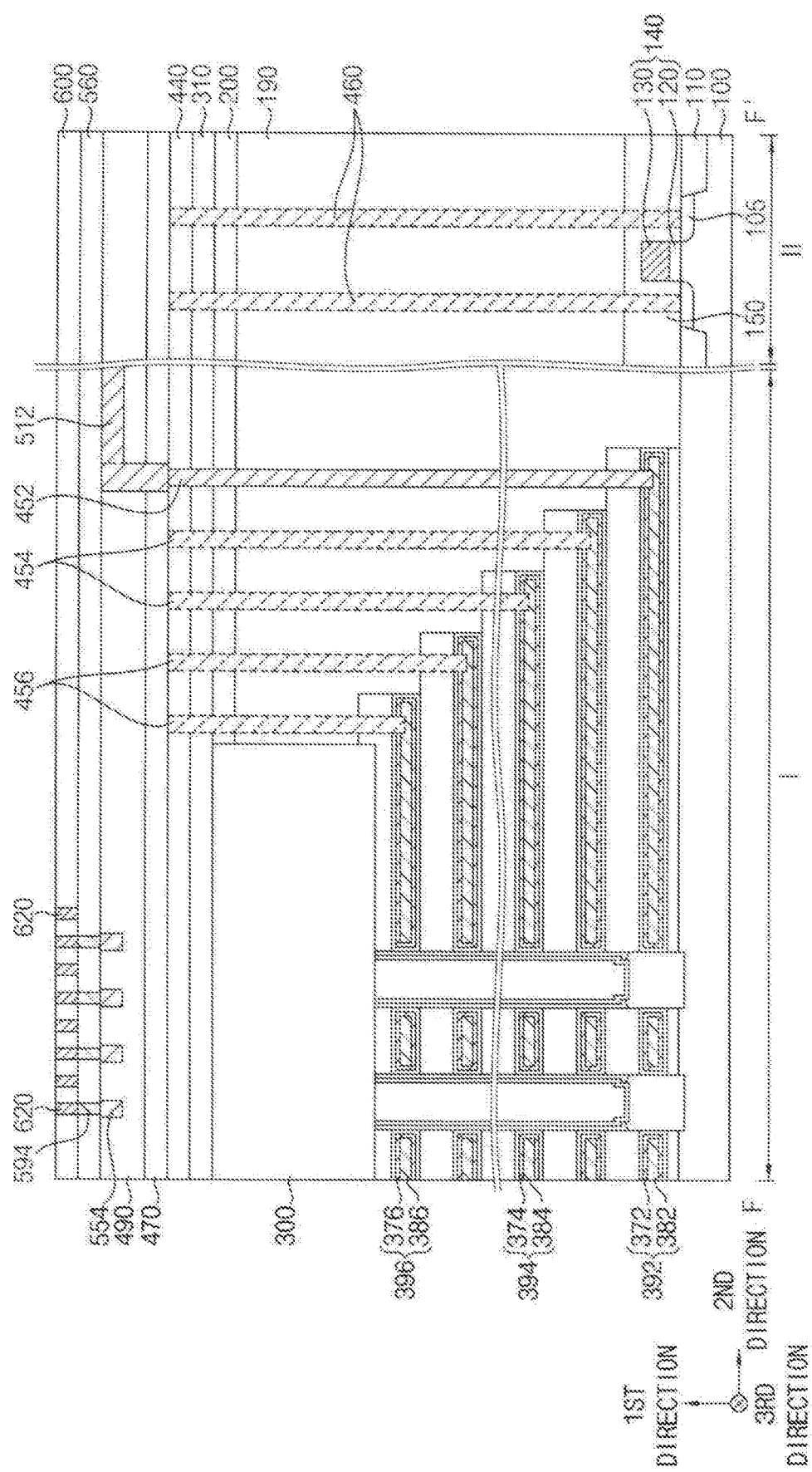
Figure 9:
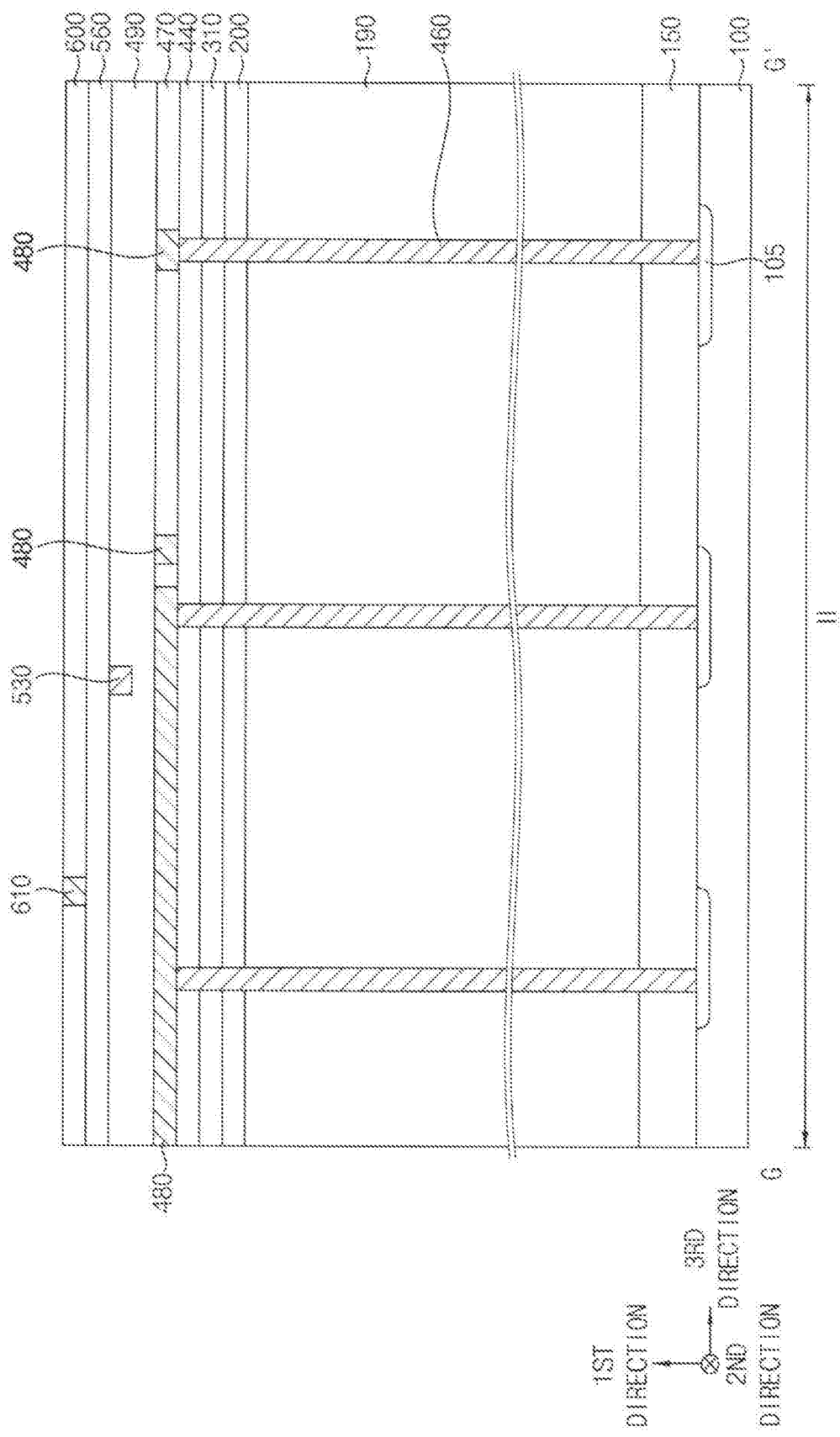

Each of the gate electrodes 392, 394, 396 and 398 may extend in the second direction, and may be formed in plural numbers at each level, which may be separated from each other by the CSL 430 extending in the second direction and the second spacer 420 on each of opposite sidewalls of the CSL 430 (see FIG. 4).

The CSL 430 may include a metal, a metal nitride and/or a metal silicide, and the second spacer 420 may include an oxide, e.g., silicon oxide. The second impurity region 410 may be formed at an upper portion of the substrate 100 adjacent the CSL 430. The second impurity region 410 may include n-type impurities, e.g., phosphorus, arsenic, etc.

Each of the gate electrodes 392, 394, 396 and 398 at each level and the insulation pattern 165 directly on each of the gate electrodes 392, 394, 396 and 398 may form one step, and a plurality of steps may be stacked in the first direction to form a staircase structure (see, e.g., FIGS. 7, 8, 10, 11). The staircase structure may include the steps of which lengths in the second direction may decrease from a lower level toward an upper level, and thus lengths of the gate electrodes 392, 394, 396 and 398 and lengths of the insulation patterns 165 may also decrease from a lower level toward an upper level. A portion of each step that may not be covered or overlapped by upper steps may be referred to as a pad area, and each of opposite ends of the gate electrodes 392, 394, 396 and 398 corresponding to the pad area may be referred to as a pad. In other words, for example, FIGS. 10-11 show the region X in region Y in FIG. 1, but there is a similar region to the region X in the region Z that is not shown. Thus, FIGS. 10-11 show one end of the gate electrodes, and another end (i.e., the opposite end located in region Z not shown) will also have the step structure and corresponding pads.

In example embodiments, the first gate electrode 392 may be formed at a lowermost level, the fourth gate electrode 398 may be formed at an uppermost level of the gate electrodes and at a second level from the uppermost level of the vertical memory device, and each of the second and third gate electrodes 394 and 396 may be formed at a plurality of levels between the first and fourth gate electrodes 392 and 398. The second gate electrodes 394 may be formed at levels lower than those of the third gate electrodes 396. However, the inventive concepts are not limited thereto, and the number of the levels may be changed. That is, there may be more or less that four gate electrodes arranged in the manner described above.

In example embodiments, the first gate electrode 392 may serve as a ground selection line (GSL), each of the second and third gate electrodes 394 and 396 may serve as a word line, and the fourth gate electrode 398 may serve as a string selection line (SSL).

As illustrated above, each of the first to fourth gate electrodes 392, 394, 396 and 398 at each level may be divided into plural ones in the third direction by the CSL 430 and the second spacer 420 extending in the second direction (see, e.g., FIGS. 4, 10, 11). However, unlike the CSL 430 and the second spacer 420 in a third opening 320, the CSL 430 and the second spacer 420 in a fourth opening 325 may not continuously extend to opposite ends of the staircase structure in the second direction, but some portions thereof may be broken at some areas.

Thus, two neighboring one of the plural second gate electrodes 394 or two neighboring ones of the plural third gate electrodes 396 at opposite sides of the fourth opening 325 in the third direction may not be separated from each other, but may be connected with each other by the conductive connection portion 400 (see, e.g., FIGS. 10-11). The conductive connection portion 400 may include a material substantially the same as that of the second and third gate electrodes 394 and 396.

That is, two neighboring ones of the plural word lines in the third direction may be electrically connected with each other by the conductive connection portion 400 to form one word line block, and a plurality of word line blocks may be spaced apart from each other in the third direction by the CSL 430 and the second spacer 420 in the third opening 320. However, as illustrated above, the inventive concepts are not limited thereto, and for example, four neighboring ones of the plural word lines in the third direction may be electrically connected with each other by the conductive connection portions 400 to form one word line block.

Two neighboring ones of the plural fourth gate electrodes 398 at opposite sides of the fourth opening 325 in the third direction may be separated from each other by the CSL 430 and the second spacer 420 in the fourth opening 325. Additionally, the fourth gate electrode 398 between the third and fourth openings 320 and 325 may be divided into two pieces by the second division layer 300.

The second division layer 300 may extend in the second direction, and may extend through the third insulating interlayer 200, the second insulating interlayer 190, the first gate electrodes 392, and the insulation patterns 165 between the first gate electrodes 392. The second division layer 300 may include an oxide, e.g., silicon oxide.

Two neighboring ones of the plural first gate electrodes 392 at opposite sides of the fourth opening 325 in the third direction may be separated from each other by the CSL 430 and the second spacer 420 in the fourth opening 325, and by the first division layer 180 as well, which may overlap the conductive connection portion 400 in the first direction.

The first division layer 180 may be formed at the same level as that of the first gate electrode 392, and may include an oxide, e.g., silicon oxide.

As a result, between neighboring two third openings 320 in the third direction, which may be filled with the CSL 430 and the second spacer 420, one word line block including two word lines electrically connected to each other by the conductive connection portion 400 may be formed, two GSLs may be separated from each other by the CSL 430 and the second spacer 420 in the fourth opening 325 and by the first division layer 180, and four SSLs may be separated from each other by the CSL 430 and the second spacer 420 in the fourth opening 325 and by the two second division layers 300 at opposite sides of the fourth opening 325, respectively.

Each of the gate electrodes may include a gate conductive pattern and a gate barrier pattern covering lower and upper surfaces and a sidewall of the gate conductive pattern. That is, the first gate electrode 392 may include a first gate conductive pattern 382 and a first gate barrier pattern 372, the second gate electrode 394 may include a second gate conductive pattern 384 and a second gate barrier pattern 374, the third gate electrode 396 may include a third gate conductive pattern 386 and a third gate barrier pattern 376, and the fourth gate electrode 398 may include a fourth gate conductive pattern 388 and a fourth gate barrier pattern 378.

The first to fourth gate conductive patterns 382, 384, 386 and 388 may include a metal having a low resistance, e.g., tungsten, titanium, tantalum, platinum, etc., and the first to fourth gate barrier patterns 372, 374, 376 and 378 may include a metal nitride, e.g., titanium nitride, tantalum nitride, etc.

Lower and upper surfaces and a sidewall of each of the first to fourth gate electrodes 392, 394, 396 and 398 may be covered by the second blocking layer 340. The second blocking layer 340 may also cover sidewalls of the insulation patterns 165, sidewalls of the second to fourth insulating interlayers 190, 200 and 310, and an upper surface of the second impurity region 410. The second blocking layer 340 may include a metal oxide, e.g., aluminum oxide, hafnium oxide, zirconium oxide, etc.

The charge storage structure 260, the channel 270 and the filling pattern 280 may form a first structure, and the semiconductor pattern 220, the first structure and the capping pattern 290 may form a second structure.

In example embodiments, the first structure may have a pillar shape or a bar shape. The filling pattern 280 may have a pillar shape or a bar shape, and the channel 270 may have a cup-like shape covering a sidewall and a lower surface of the filling pattern 280. The charge storage structure 260 may cover an outer sidewall of the channel 270, and may have a cup-like shape of which a bottom is opened. The charge storage structure 260 may include a tunnel insulation pattern 250, a chare storage pattern 240 and a first blocking pattern 230 sequentially stacked on the outer sidewall of the channel 270.

The filling pattern 280 may include an oxide, e.g., silicon oxide, and the channel 270 may include undoped or doped crystalline silicon. The tunnel insulation pattern 250 and the first blocking pattern 230 may include an oxide, e.g., silicon oxide, and the charge storage pattern 240 may include a nitride, e.g., silicon nitride.

The first structure may extend through the second to fourth gate electrodes 394, 396 and 398, and the insulation patterns 165 therebetween. A plurality of first structures may be formed in each of the second and third directions to form a first structure array, which may be referred to as a channel array, hereinafter.

In example embodiments, the channel array may include a first channel column 270a including first channels disposed in the second direction, and a second channel column 270b including second channels disposed in the second direction and being spaced apart from the first channel column 270a in the third direction. The second channels may be disposed to have acute angles with the second direction or the third direction from the first channels, and the first and second channels may be arranged in a zigzag layout along the second direction.

The first and second channel columns 270a and 270b may be alternately and repeatedly arranged in the third direction. In example embodiments, five first channel columns 270a and four second channel columns 270b may be alternately arranged in the third direction, which may form one channel group.

Hereinafter, four channel columns disposed in the third direction in one channel group may be referred to as a first channel column 270a, a second channel column 270b, a third channel column 270c, and a fourth channel column 270d, respectively, in this order, one channel column at a central position in the third direction in the channel group may be referred to as a fifth channel column 270e, and the other four channel columns disposed in the third direction in the channel group may be referred to as the first, second, third and fourth channel columns 270a, 270b, 270c and 270d, respectively, again in this order.

The first to fourth channel columns 270a, 270b, 270c and 270d may define one channel block. FIG. 2 shows a channel array including two channel groups spaced apart from each other in the third direction, each of the channel groups includes two channel blocks disposed in the third direction, and the fifth channel column 270e is disposed between the two channel blocks. However, the number of the channel blocks in each channel group, and/or the number of the channel columns in each channel block are not limited thereto. The channels 270 in the fifth channel column 270e may be dummy channels, and the second division layer 300 may extend through upper portions of the dummy channels in the second direction.

In example embodiments, the second structure may have a pillar shape or a bar shape. The semiconductor pattern 220 may be formed between an upper surface of the substrate 100 and a lower surface of the first structure, and an upper surface of the semiconductor pattern 220 may be positioned between lower and upper surfaces of one of the insulation pattern 165 at a second level from the upper surface of the substrate 100 in the first direction. The semiconductor pattern 220 may serve as a channel like the channel 270, which may be referred to as a lower channel. The semiconductor pattern 220 may include single crystalline silicon or single crystalline germanium.

The capping pattern 290 may contact an upper surface of the first structure, and may include doped or undoped crystalline silicon.

The first to ninth insulating interlayers 150, 190, 200, 310, 440, 470, 490, 560 and 600 may be sequentially stacked on the substrate 100, which may, for example, an oxide, e.g., silicon oxide, and some of which may be merged with each other.

The first insulating interlayer 150 may be formed on the second region II of the substrate 100, and may cover the gate structure 140 and the first impurity region 105.

The second region II of the substrate 100 may include a field region on which an isolation pattern 110 is formed, and an active region on which no isolation pattern is formed. The first impurity region 105 may be formed at an upper portion of the active region of the substrate 100 adjacent the gate structure 140. The isolation pattern 110 may include an oxide, e.g., silicon oxide, and the first impurity region 105 may include n-type or p-type impurities.

The gate structure 140 may include a gate insulation pattern 120 and a gate electrode pattern 130 sequentially stacked. The gate insulation pattern 120 may include an oxide, e.g., silicon oxide, and the gate electrode pattern 130 may include, e.g., a metal, a metal nitride, doped polysilicon, etc.

The second insulating interlayer 190 may cover a sidewall of the staircase structure on the first region I of the substrate 100, and may be formed on the first insulating interlayer 150 on the second region II of the substrate 100.

Referring to FIGS. 38 to 41, the first to fourth contact plugs 452, 454, 456 and 458 on the first region I of the substrate 100 may extend through the second to fifth insulating interlayers 190, 200, 310 and 440, the insulation pattern 165, and the second blocking layer 340, and contact the first to fourth gate electrodes 392, 394, 396 and 398, respectively. In example embodiments, the first to fourth contact plugs 452, 454, 456 and 458 may extend through the first to fourth barrier patterns 372, 374, 376 and 378 to contact upper surfaces of the first to fourth gate conductive patterns 382, 384, 386 and 388, respectively. Each of the first to fourth contact plugs 452, 454, 456 and 458 may be formed on each of the pads of the staircase structure.

In example embodiments, one first contact plug 452 may be formed on each of the plural first gate electrodes 392, one second contact plug 454 may be formed on each pair of the plural second gate electrodes 394 connected with each other by the conductive connection portion 400, one third contact plug 456 may be formed on each pair of the plural third gate electrodes 396 connected with each other by the conductive connection portion 400, and one fourth contact plug 458 may be formed on each of the plural fourth gate electrodes 398. Thus, corresponding to one second contact plug 454 or one third contact plug 456 in one word line at each level, two first contact plugs 452 may be formed on the GSL at each level, and four fourth contact plugs 458 may be formed on the SSL at each level.

In example embodiments, in a plan view, the second and third contact plugs 454 and 456 may be arranged in a zigzag fashion in the second direction; however, the inventive concepts are not limited thereto.

In example embodiments, the second and third contact plugs 454 and 456 may be alternately arranged on opposite ends in the second direction of the word line blocks disposed in the third direction. That is, when the word line blocks include first to fourth word line blocks disposed in the third direction in this order, for example, the second and third contact plugs 454 and 456 may be formed on a right step of each of the first and third word line blocks and on a left step of each of the second and fourth word line blocks. The first and fourth contact plugs 452 and 454 may be arranged on the GSL and SSL, respectively, on the same sides of steps as those of the second and third contact plugs 454 and 456.

As the first to fourth contact plugs 452, 454, 456 and 458 are alternately arranged on the opposite steps of the staircase structure, broader areas for upper wirings over the first to fourth contact plugs 452, 454, 456 and 458 may be obtained. However, the inventive concepts are not limited thereto, and in some example embodiments, the first to fourth contact plugs 452, 454, 456 and 458 and the upper wirings connected thereto may be arranged only at one side of the staircase structure.

The fifth contact plug 460 on the second region II of the substrate 100 may extend through the first to fifth insulating interlayers 150, 190, 200, 310 and 440 to contact an upper surface of the first impurity region 105. In the figures, the fifth contact plug 460 is shown to be formed on the first impurity region 105; however, it may be formed on, e.g., the gate electrode pattern 130.

Figure 42:
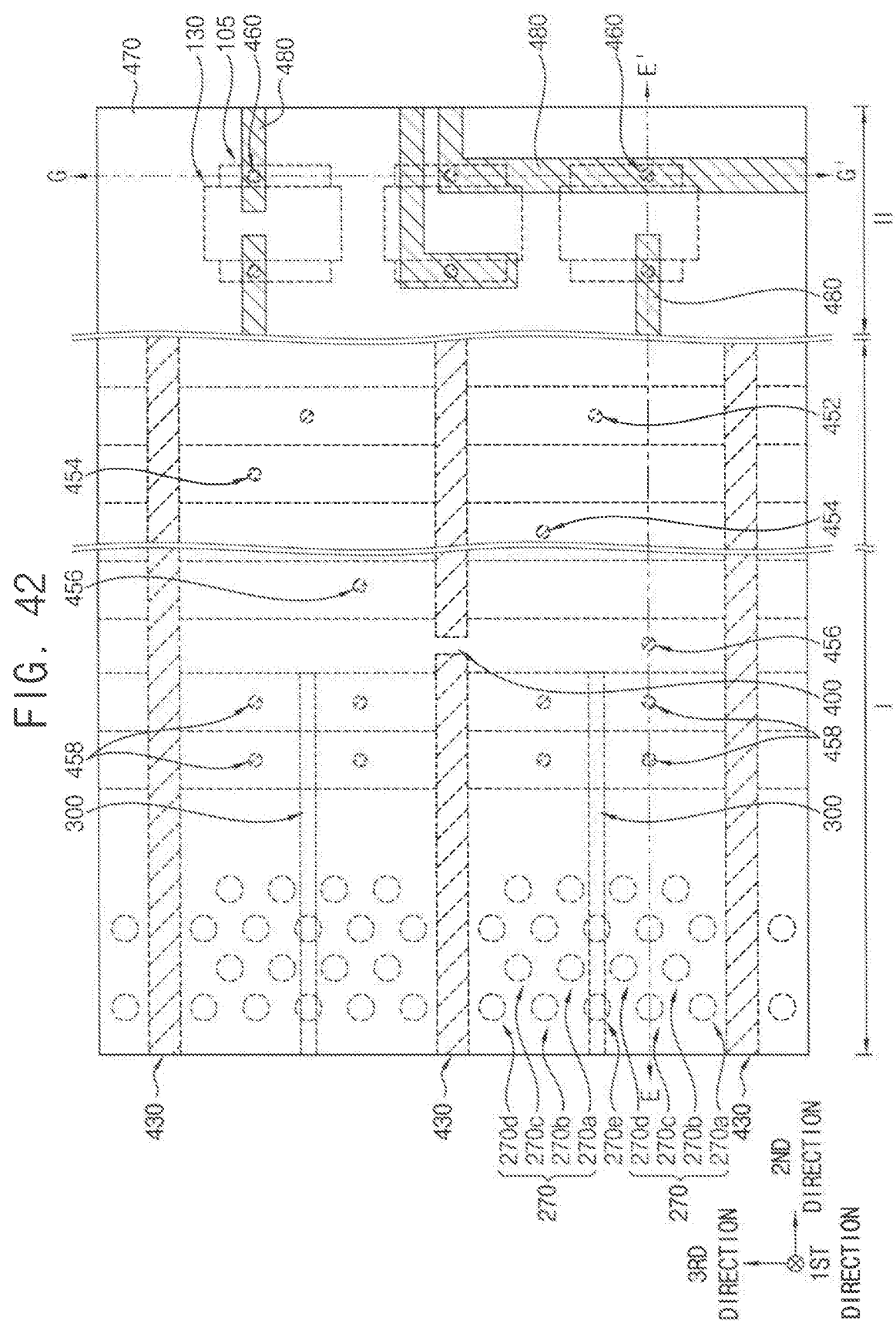
Figure 43:
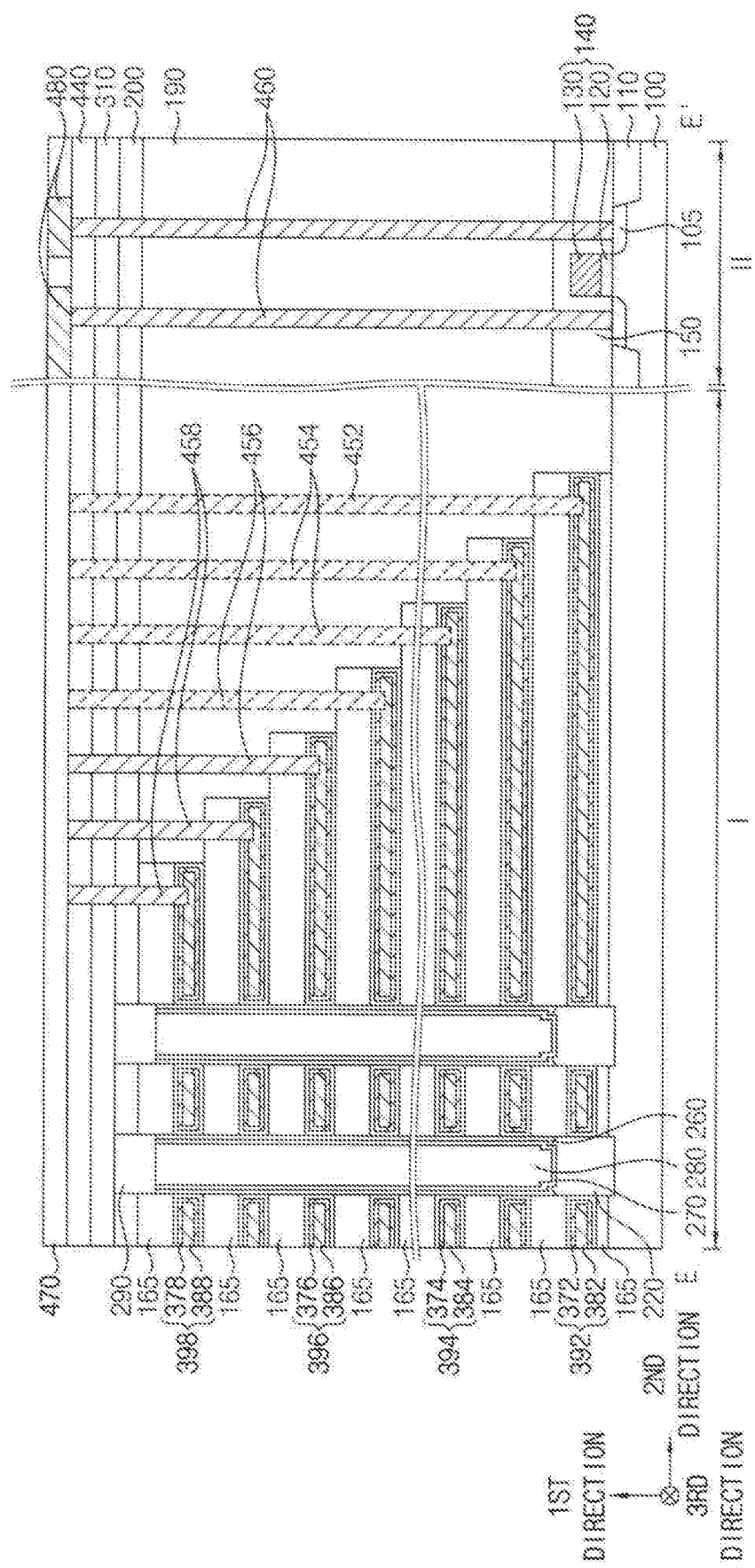
Figure 44:
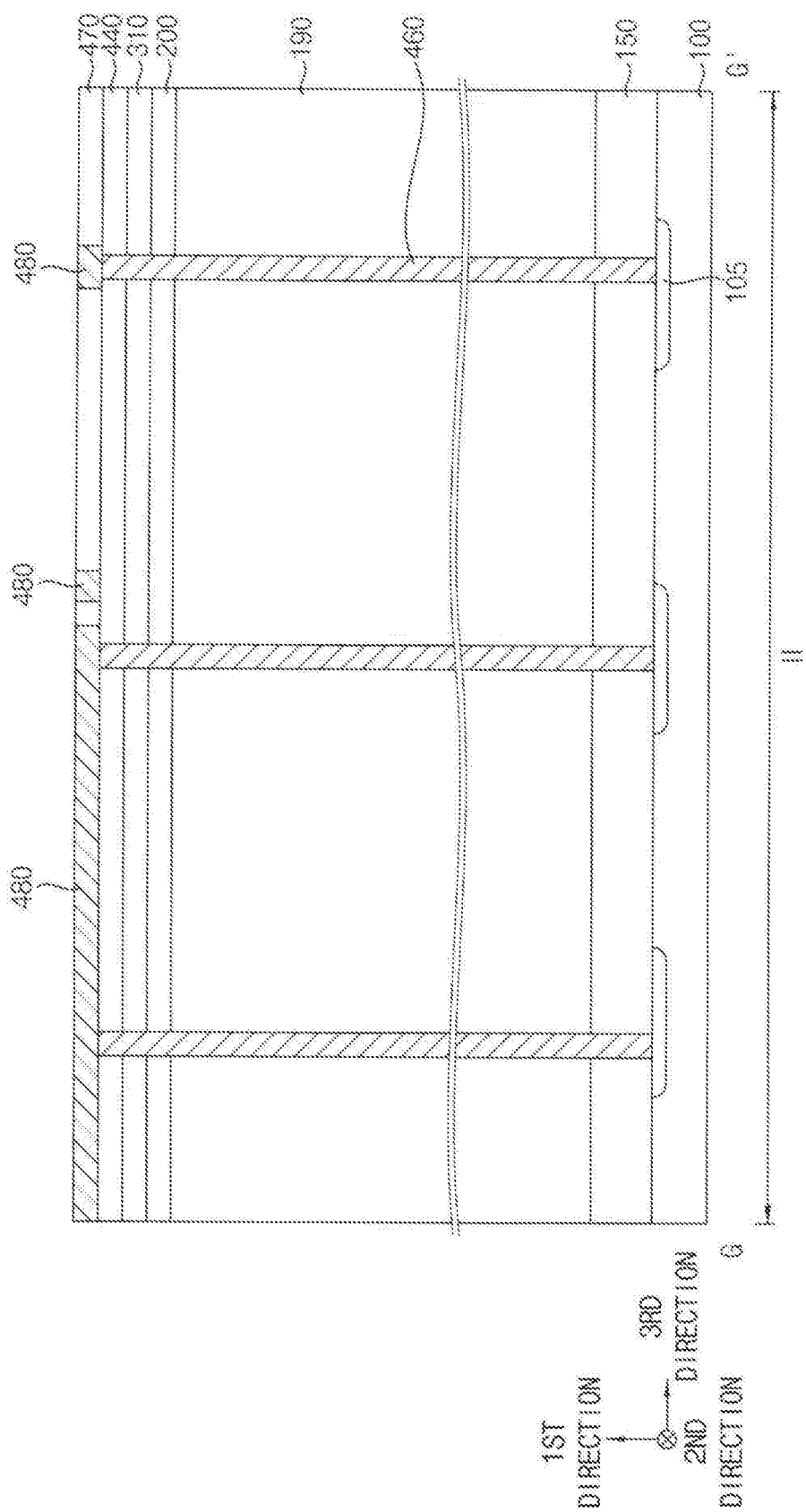
Figure 45:
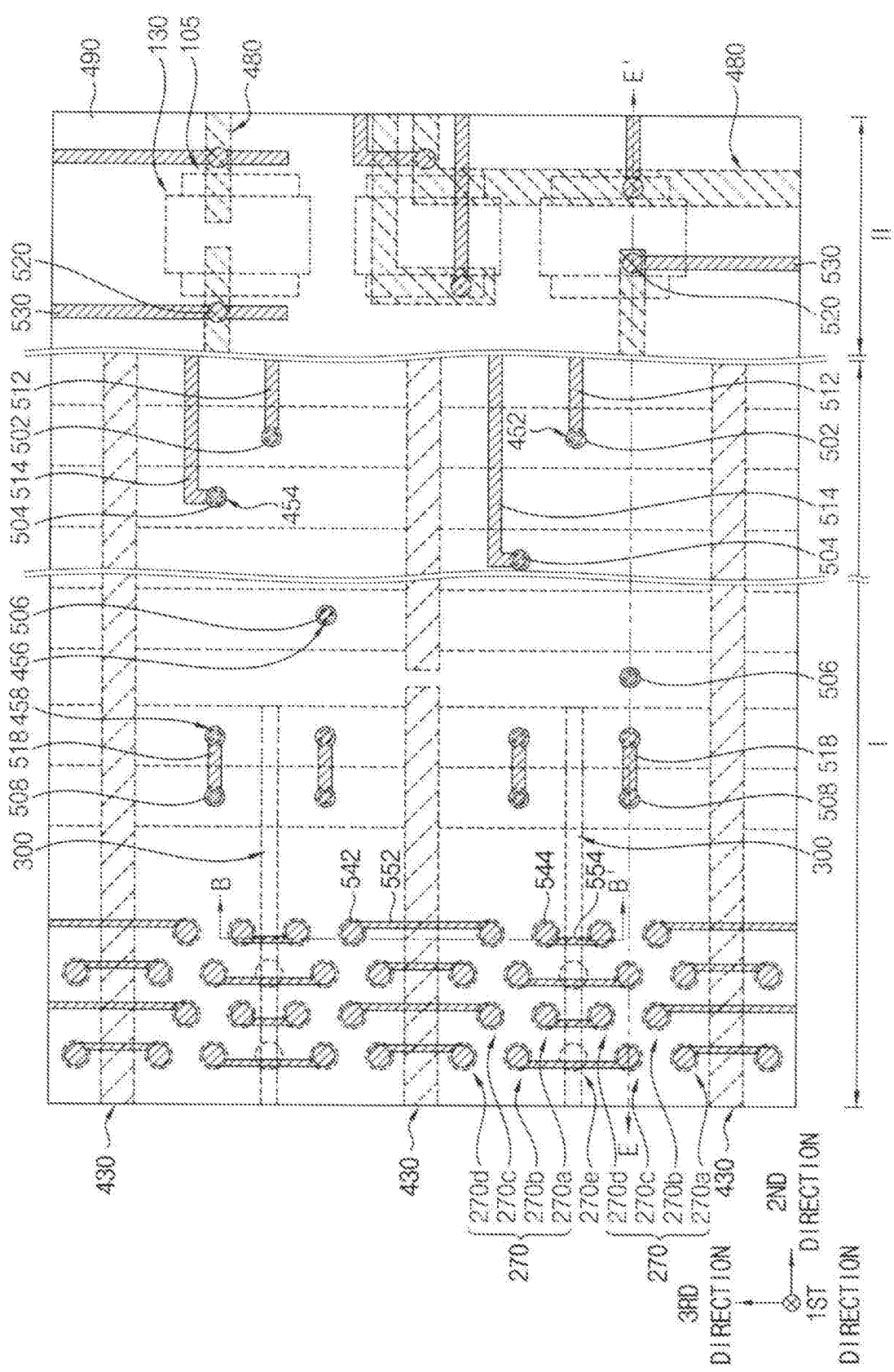
Figure 46:
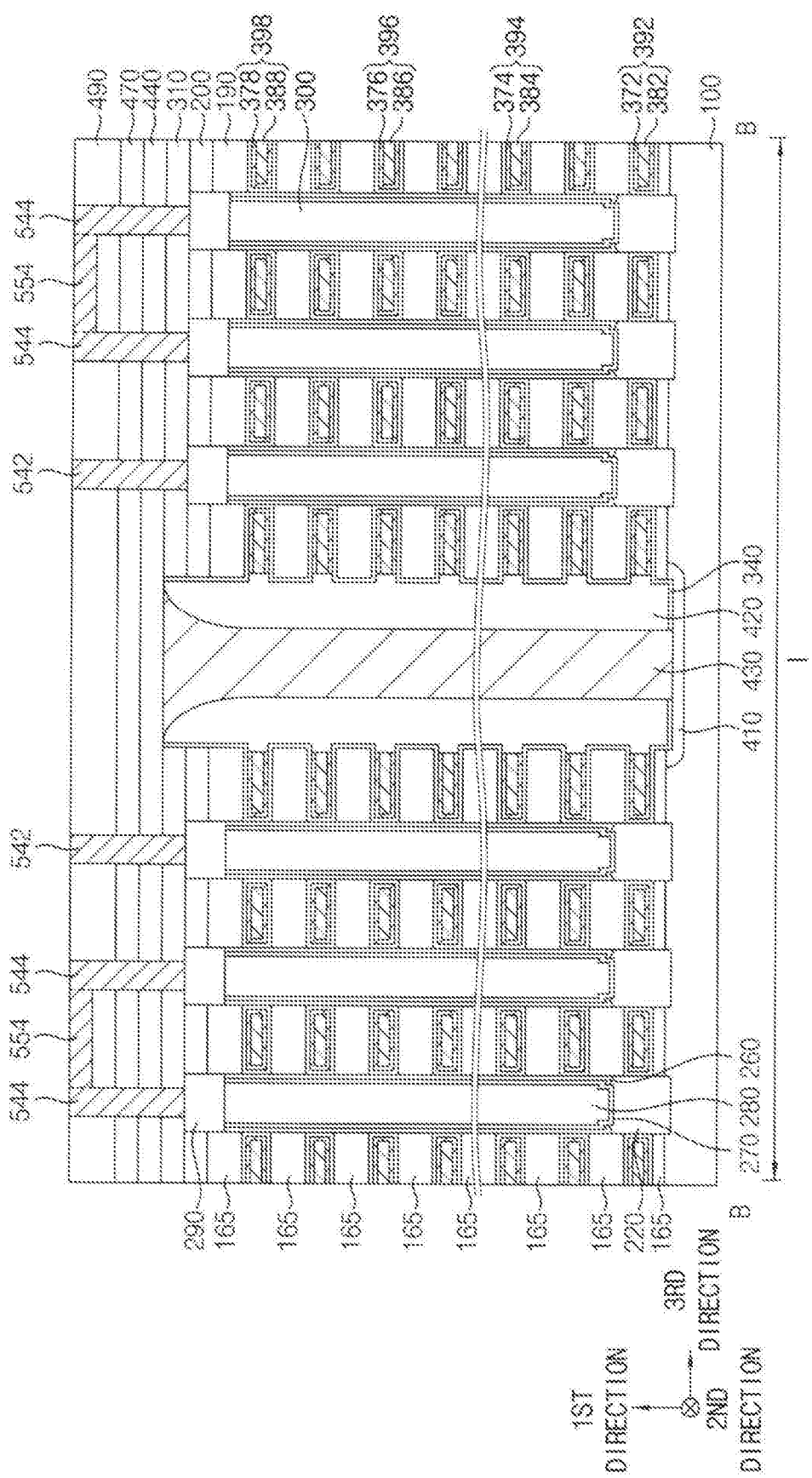
Figure 47:
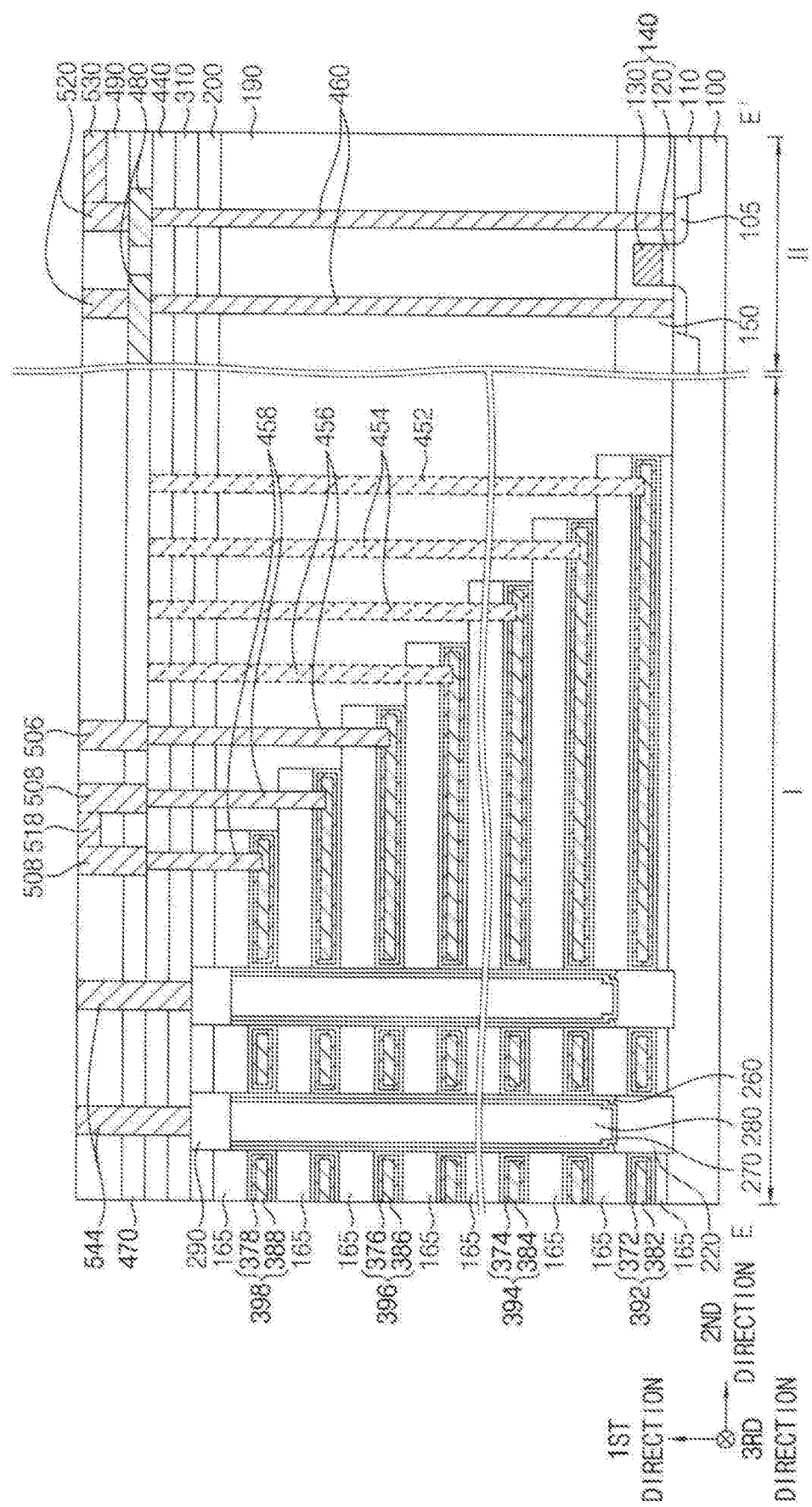
Figure 48:
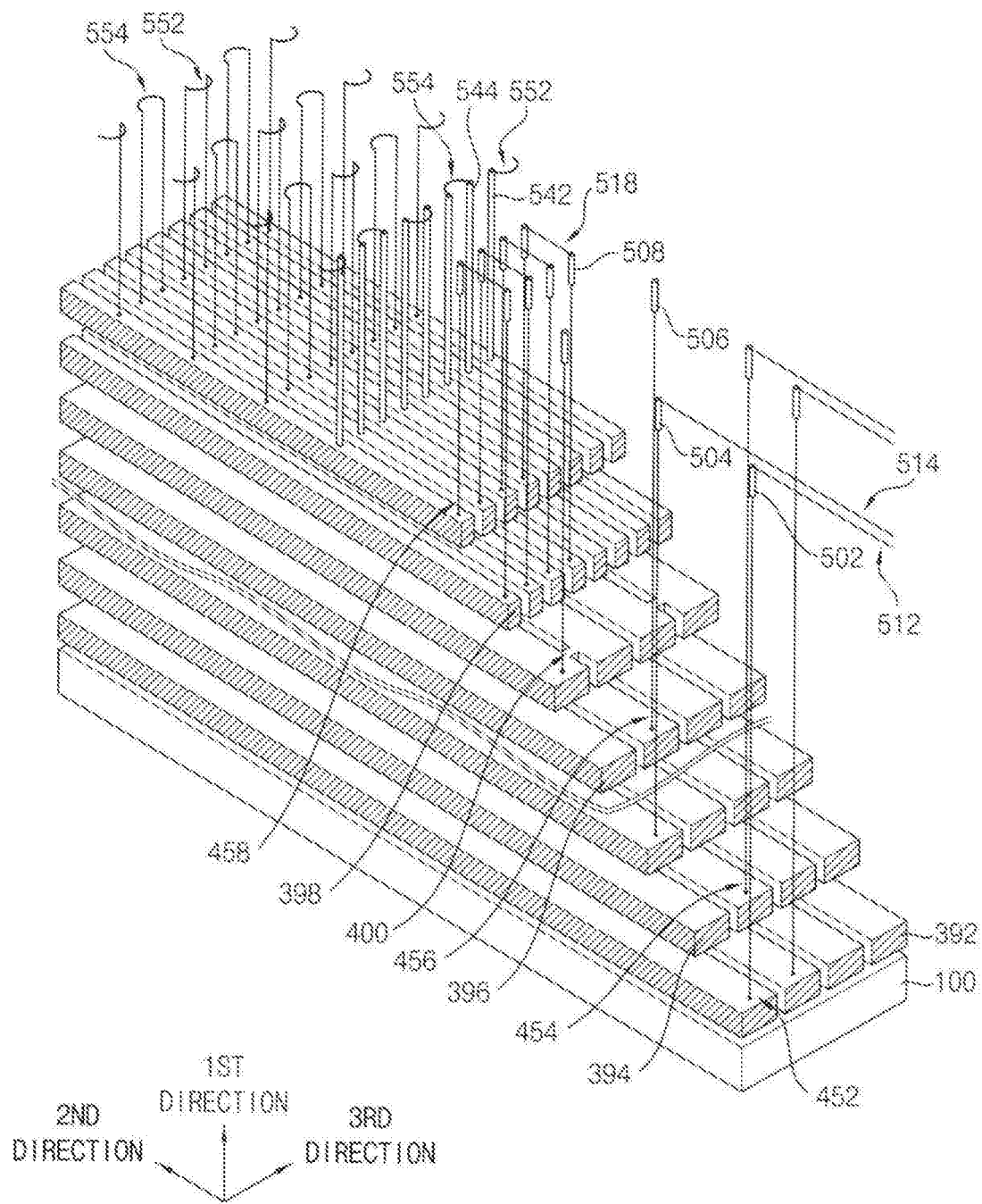
Figure 49:
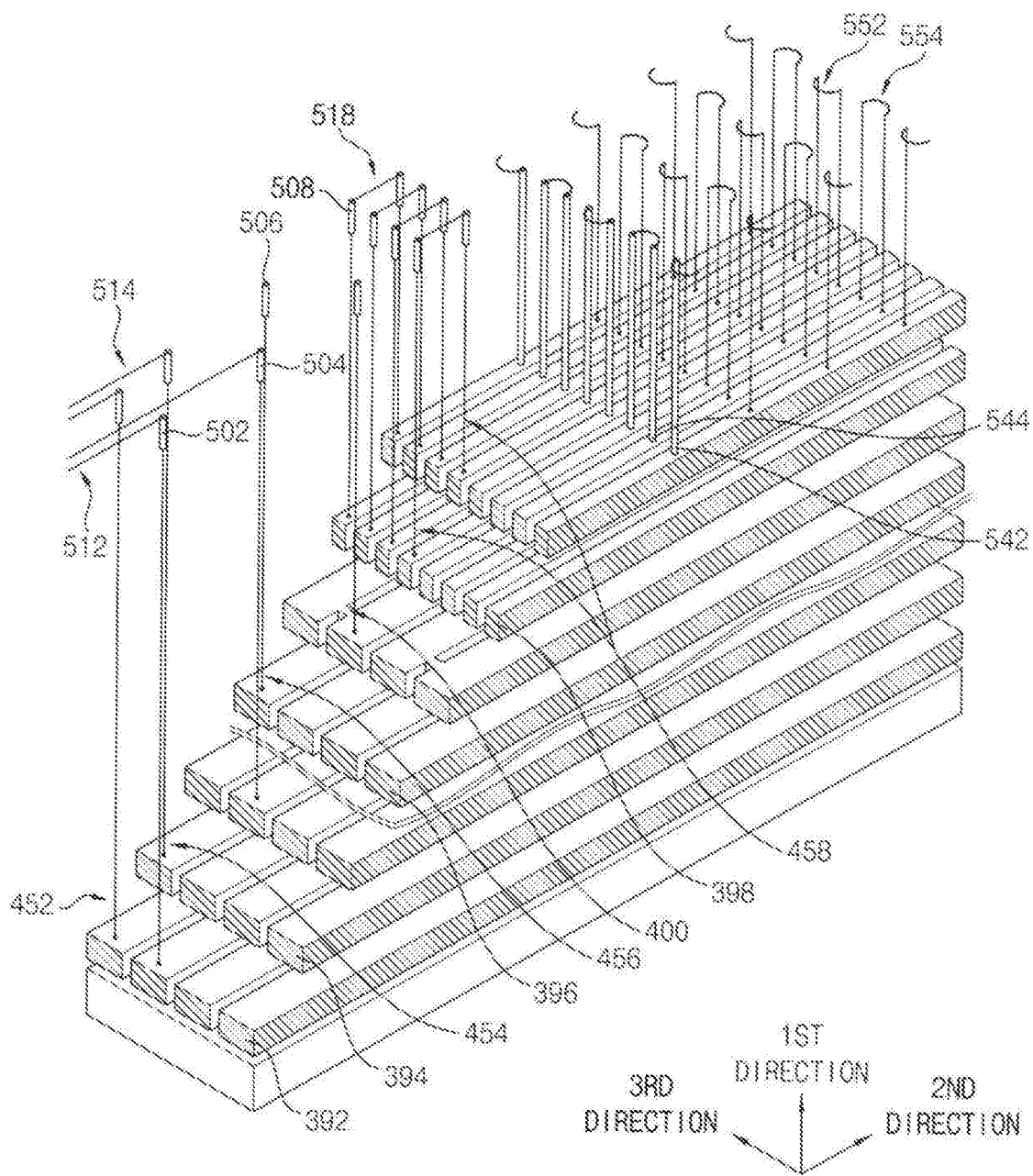

Referring to FIGS. 42 to 44, the first wiring 480 on the second region II of the substrate 100 may extend through the sixth insulating interlayer 470 to contact an upper surface of the fifth contact plug 460.

In example embodiments, the first wiring 480 may extend at least in one direction on the second region II of the substrate 100, and may contact and connect upper surfaces of at least two fifth contact plugs 460 to each other. A plurality of first wirings 480 may be formed in each of second and third directions. FIG. 42 shows an illustrative layout of the first wirings 480, but the layout is not limited thereto.

In example embodiments, at least one of the plurality of first wirings 480 may include a first portion extending in the second direction, and a second portion extending in the third direction.

By contrast to the first wirings 480 formed in the sixth insulating interlayer 470 on the second region II, no wirings may be formed in the sixth insulating interlayer 470 on the first region I of the substrate 100 (see, e.g., FIG. 43).

Referring to FIGS. 45 to 49, the first to fourth vias 502, 504, 506 and 508 on the first region I of the substrate 100 may extend through the sixth and seventh insulating interlayers 470 and 490 to contact upper surfaces of the first to fourth contact plugs 452, 454, 456 and 458, respectively. The sixth and seventh vias 542 and 544 may extend through the fourth to seventh insulating interlayers 310, 440, 470 and 490 to contact an upper surface of the capping pattern 290.

In example embodiments, two sixth vias 542 in the third direction may form one pair of sixth vias 542, and two seventh vias 544 in the third direction may form one pair of seventh vias 544. Thus, one pair of sixth vias 542 and one pair of seventh vias 544 may be alternately arranged in the third direction.

The second, third and fourth wirings 512, 514 and 518 may extend through an upper portion of the seventh insulating interlayer 490 to contact upper surfaces of the first, second and fourth vias 502, 504 and 508, respectively. The sixth and seventh vias 552 and 554 may extend through the seventh insulating interlayer 490 to contact upper surfaces of the sixth and seventh vias 542 and 544, respectively.

Each of the second and third wirings 512 and 514 may extend in the second direction. In some example embodiments, a portion of each of the second and third wirings 512 and 514 may extend in the third direction. In example embodiments, the fourth wiring 518 may extend in the second direction, and may contact upper surfaces of neighboring two fourth vias 508 in the second direction.

The sixth wiring 552 may connect the pair of sixth vias 542 with each other, and the seventh wiring 554 may connect the pair of seventh vias 544 with each other. In example embodiments, the sixth and seventh wirings 552 and 554 may be arranged in a zigzag fashion in the third direction.

The fifth via 520 on the second region II of the substrate 100 may extend through the seventh insulating interlayer 490 to contact an upper surface of the fifth contact plug 460, and the fifth wiring 530 may extend through an upper portion of the seventh insulating interlayer 490 to contact an upper surface of the fifth via 520.

Referring to FIGS. 50 to 54, the sixth and seventh contact plugs 572 and 574 on the first region I of the substrate 100 may extend through the eighth insulating interlayer 560 to contact upper surfaces of the third via 506 and the fourth wiring 518, respectively. The ninth and tenth contact plugs 592 and 594 may extend through the eighth insulating interlayer 560 to contact upper surfaces of the sixth and seventh wirings 552 and 554, respectively. The eighth contact plug 580 on the second region II of the substrate 100 may extend through the eighth insulating interlayer 560 to contact an upper surface of the fifth wiring 530.

Referring to FIGS. 2 to 11, the eighth and ninth wirings 602 and 604 on the first region I of the substrate 100 may extend through the ninth insulating interlayer 600 to contact upper surfaces of the sixth and seventh contact plugs 572 and 574, respectively. The eleventh wiring 620 may extend through the ninth insulating interlayer 600 to contact an upper surface of each of the ninth and tenth contact plugs 592 and 594. (It is noted that the figures do not include a cross-section showing the ninth contact plugs 592; that is, FIG. 4 is taken along B-B' in FIG. 2 and thus shows only the tenth contact plugs 594 and not the ninth contact plugs 592.) Each of the eighth and ninth wirings 602 and 604 may extend in the second direction, and in some example embodiments, a portion of each of the eighth and ninth wirings 602 and 604 may extend in the third direction.

In example embodiments, the eleventh wiring 620 may extend in the third direction, and a plurality of eleventh wirings 620 may be formed in the second direction. Each of the eleventh wirings 620 may contact upper surfaces of the ninth contact plugs 592 disposed in the third direction, or upper surfaces of the tenth contact plugs 594 disposed in the third direction. The eleventh wiring 620 may serve as a bit line of the vertical memory device.

The tenth wiring 610 on the second region II of the substrate 100 may extend through the ninth insulating interlayer 600 to contact an upper surface of the eighth contact plug 580.

In example embodiments, the first to tenth contact plugs 452, 454, 456, 458, 460, 572, 574, 580, 592 and 594, the first to seventh vias 502, 504, 506, 508, 520, 542 and 544, and the first to eleventh wirings 480, 512, 514, 516, 518, 530, 552, 554, 602, 604, 610 and 612 may include a metal, e.g., tungsten, titanium, tantalum, copper, aluminum, etc., and/or a metal nitride, e.g., titanium nitride, tantalum nitride, tungsten nitride, etc.

Up to now, the first and second contact plugs 452 and 454 on the first and second gate electrodes 392 and 394, respectively, at relatively lower levels of the staircase structure may be electrically connected to the second and third wirings 512 and 514 in the seventh insulating interlayer 490 through the first and second vias 502 and 504, respectively, while the third and four gate electrodes 396 and 398 at relatively higher levels of the staircase structure may be electrically connected to the eighth and ninth wirings 602 and 604 in the ninth insulating interlayer 600 through the third and fourth vias 506 and 508 and the sixth and seventh contact plugs 572 and 574, respectively; however, the inventive concepts are not limited thereto. Thus, the first and second gate electrodes 392 and 394 may be electrically connected to relatively upper wirings, and the third and fourth gate electrodes 396 and 398 may be electrically connected to relatively lower wirings. Alternatively, all of the first to fourth gate electrodes 392, 394, 396 and 398 may be formed in a single insulating interlayer.

Additionally, the vertical memory device may further include other upper wirings at higher levels than the above-mentioned wirings.

As illustrated above, each of the second and third gate electrodes 394 and 396 serving as word lines in the vertical memory device may be connected to each other by the conductive connection portion 400, and thus upper wirings for electrically connecting the word lines in the same word line block are not needed.

Particularly, no wirings contacting the second and third contact plugs 454 and 456 may be formed in the sixth insulating interlayer 470, and no wirings contacting the second and third contact plugs 454 and 456 may be formed in the fifth insulating interlayer 440 through which the second and third contact plugs 454 and 456 on the second and third gate electrodes 394 and 396, respectively, extend. Further, no wirings may be formed in the sixth insulating interlayer 470 on the first region I of the substrate 100. By contrast, when compared with the second region II, the first wirings 480 are formed in the sixth insulating interlayer 470 on the second region II of the substrate 100.

The first to fourth vias 502, 504, 506 and 508 and the sixth and seventh vias 542 and 544 may extend through the sixth insulating interlayer 470 even on the first region I of the substrate 100; however, each of the vias 502, 504, 506, 508, 542, and 544 may contact only one underlying contact plug, and does not extend in a horizontal direction in the sixth insulating interlayer 470. That is, the vias 502, 504, 506, 508, 542, and 544 are different from the first wiring 480 on the second region II of the substrate 100. In contrast to the vias 502, 504, 506, 508, 542, and 544, the first wiring 480 commonly contacts at least two fifth contact plugs 460 to electrically connect them with each other or extends in the second direction or in the third direction in the second region II.

Accordingly, the numbers of the levels at which the upper wirings are formed on the first and second regions I and II, respectively, may be different from each other. That is, the number of the levels at which the upper wirings are formed on the second region II of the substrate 100 may be more than the number of the levels at which the upper wirings are formed on the first region I of the substrate 100. For example, in some example embodiments, the number of levels are which the upper wirings are formed on the second region II of the substrate 100 may be one more than the number of levels at which the upper wirings are formed on the first region I of the substrate 100.

FIGS. 12 to 54 are plan views, cross-sectional views, and perspective views illustrating a method of manufacturing a vertical memory device in accordance with example embodiments. Particularly, FIGS. 12-13, 22, 26, 28, 33, 38, 42, 45 and 50 are plan views, FIGS. 14, 16-17, 19, 21, 23-25, 27, 29-32, 34-37, 39, 43-44, 46-47 and 51-52 are cross-sectional views, and FIGS. 15, 18, 20, 40-41, 48-49 and 53-54 are perspective views. The plan views and the cross-sectional views related thereto are drawings about a region X of FIG. 1, and the perspective views and the cross-sectional views related thereto are drawings about a region Y or a region Z of FIG. 1.

Figure 13:
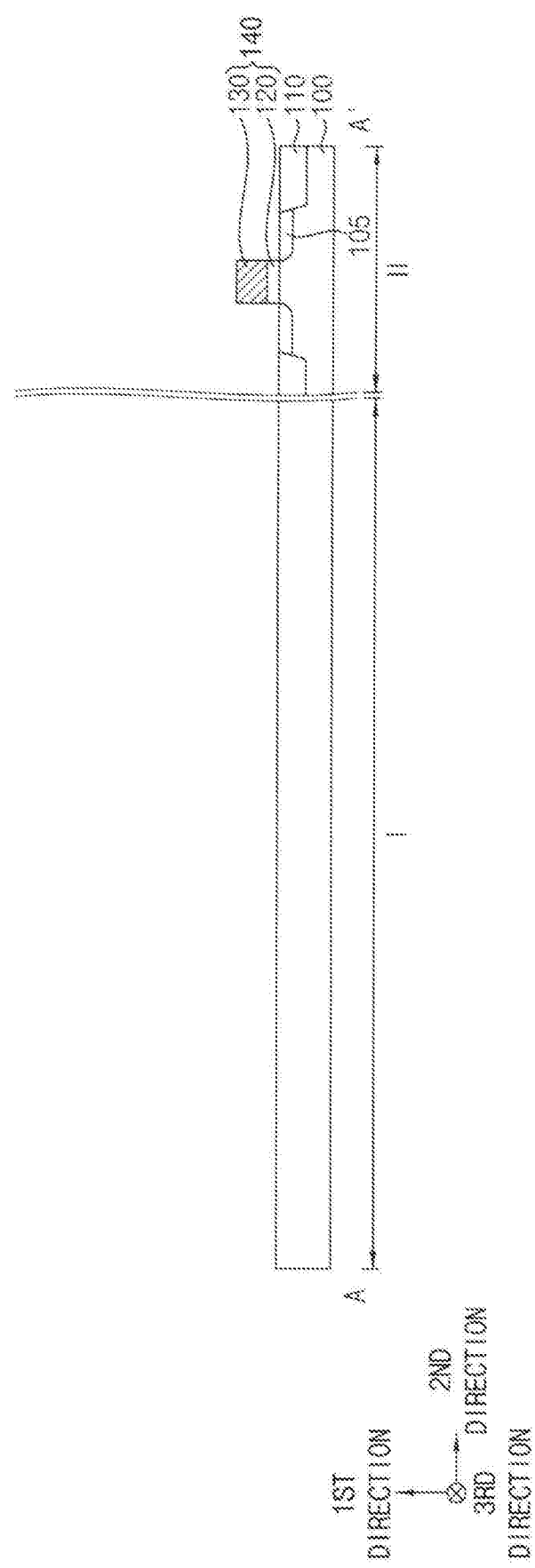
Figure 14:
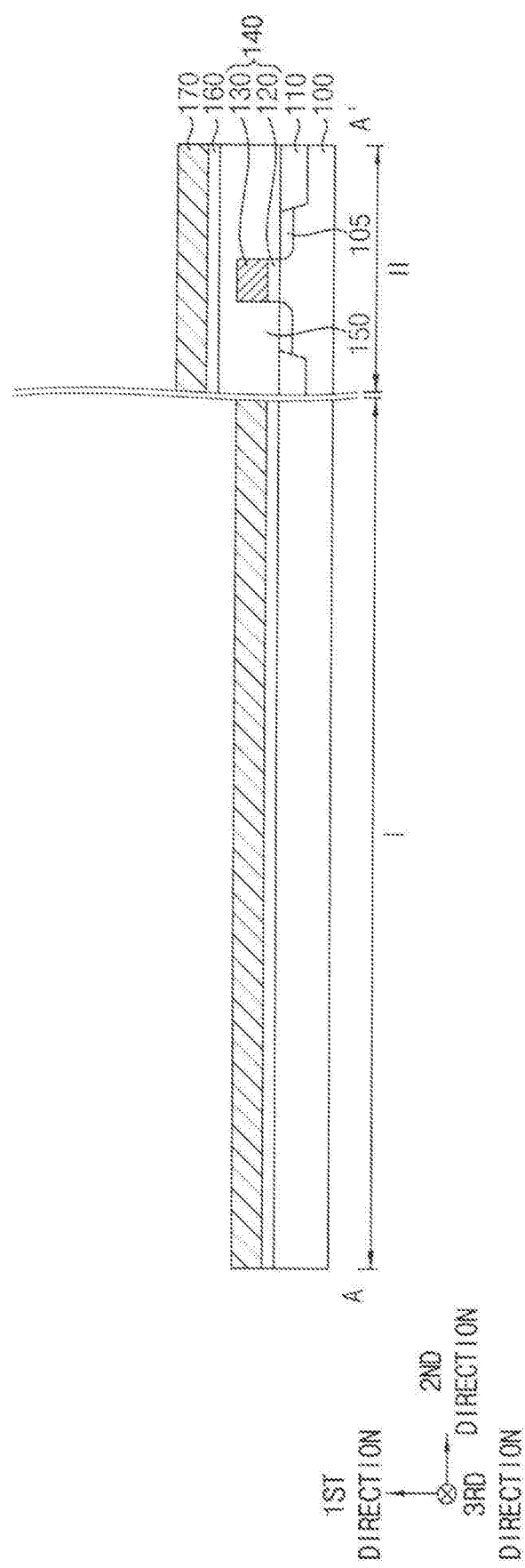
Figure 15:
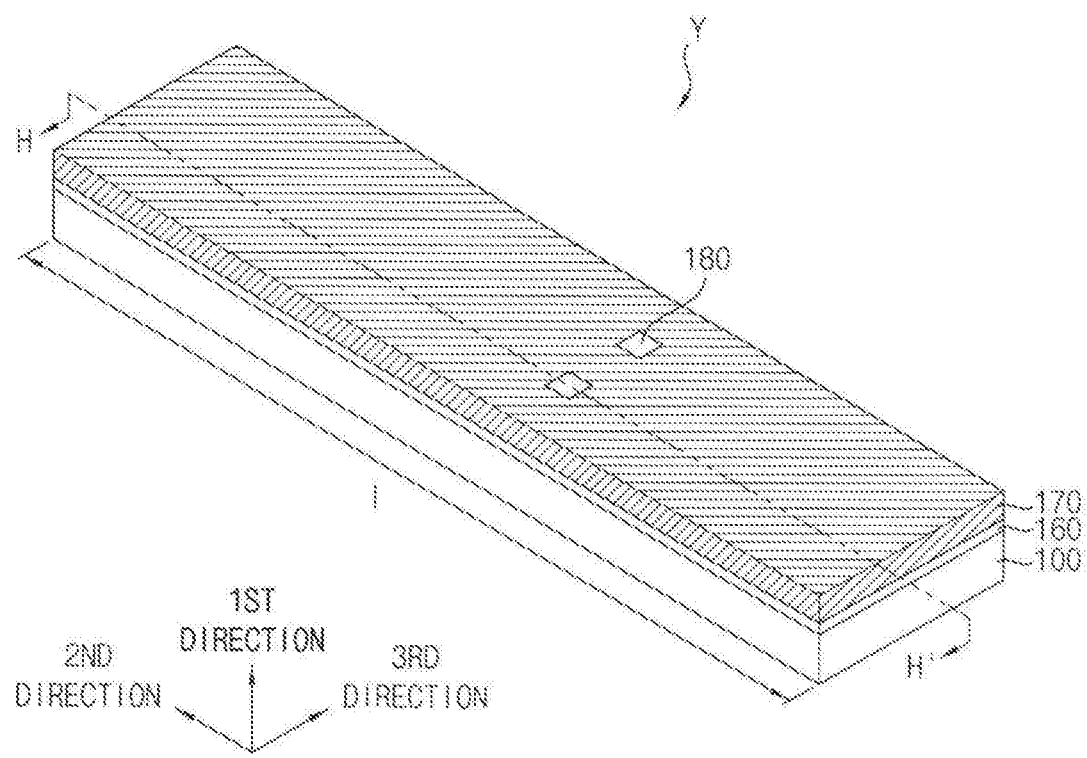
Figure 16:
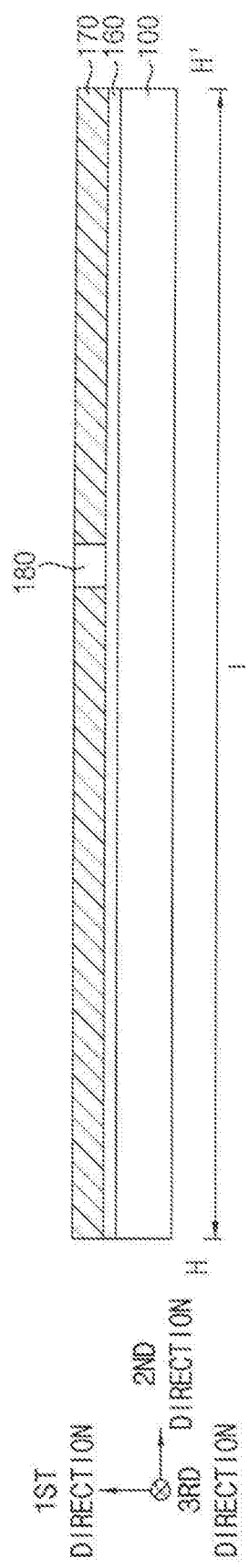
Figure 29:
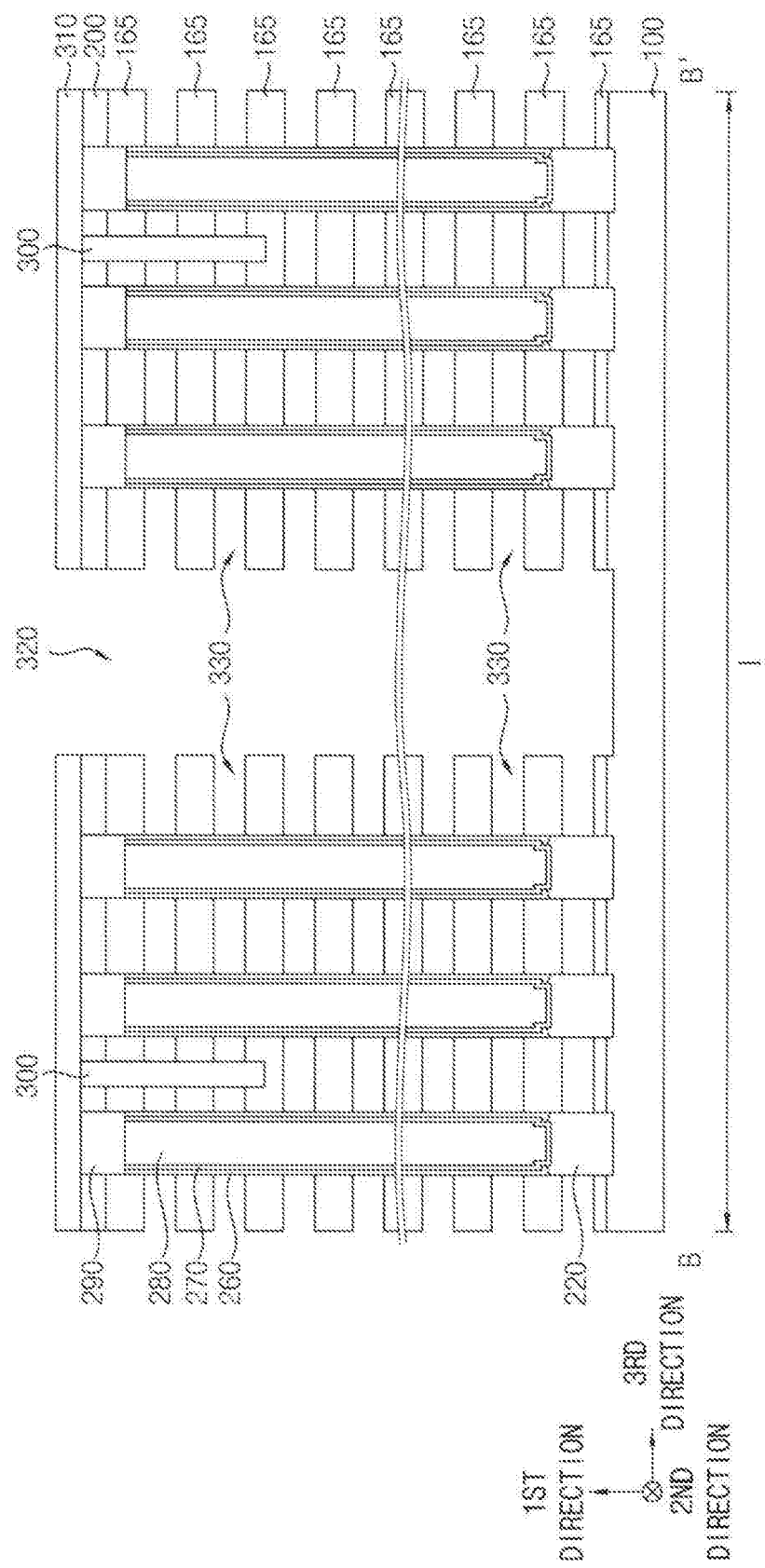
Figure 30:
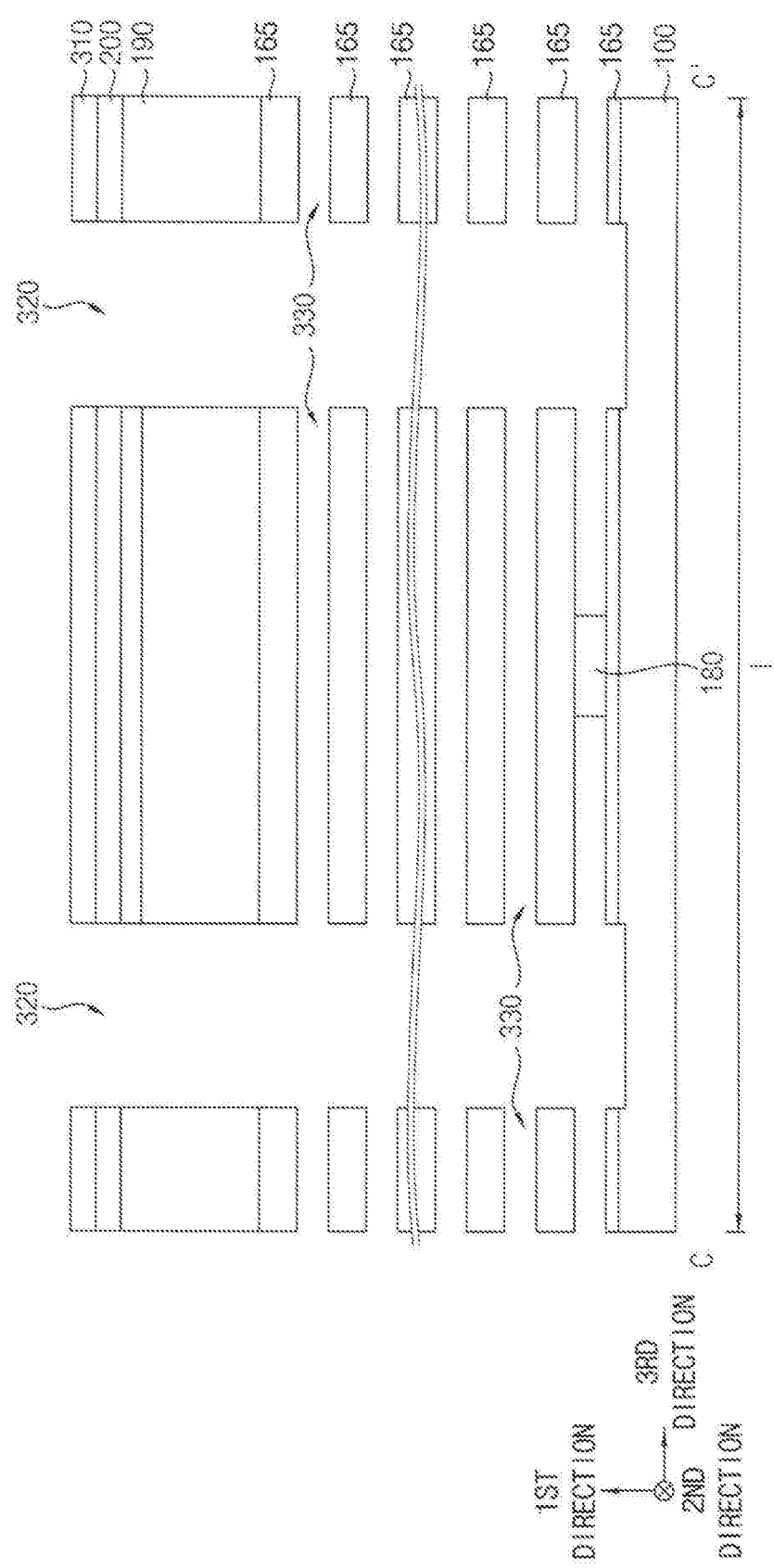
Figure 36:
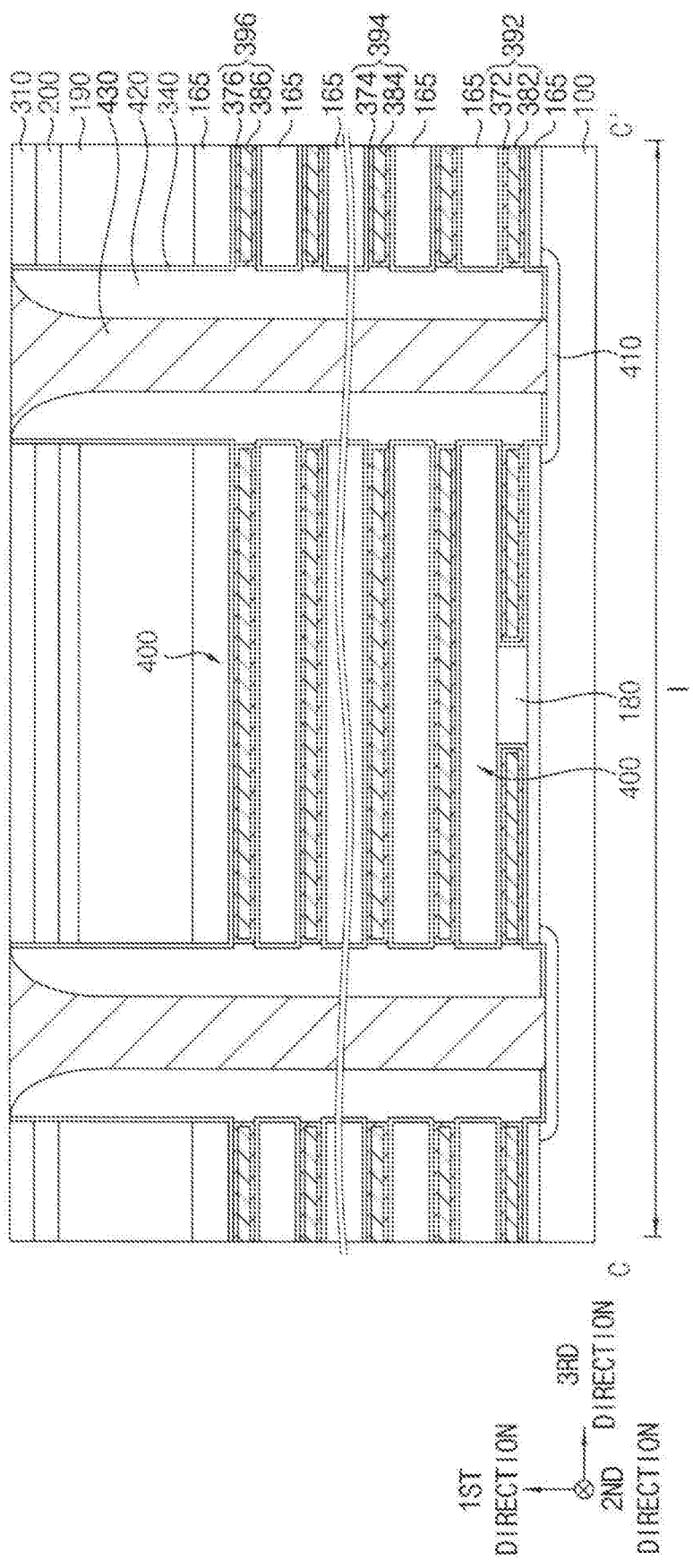
Figure 37:
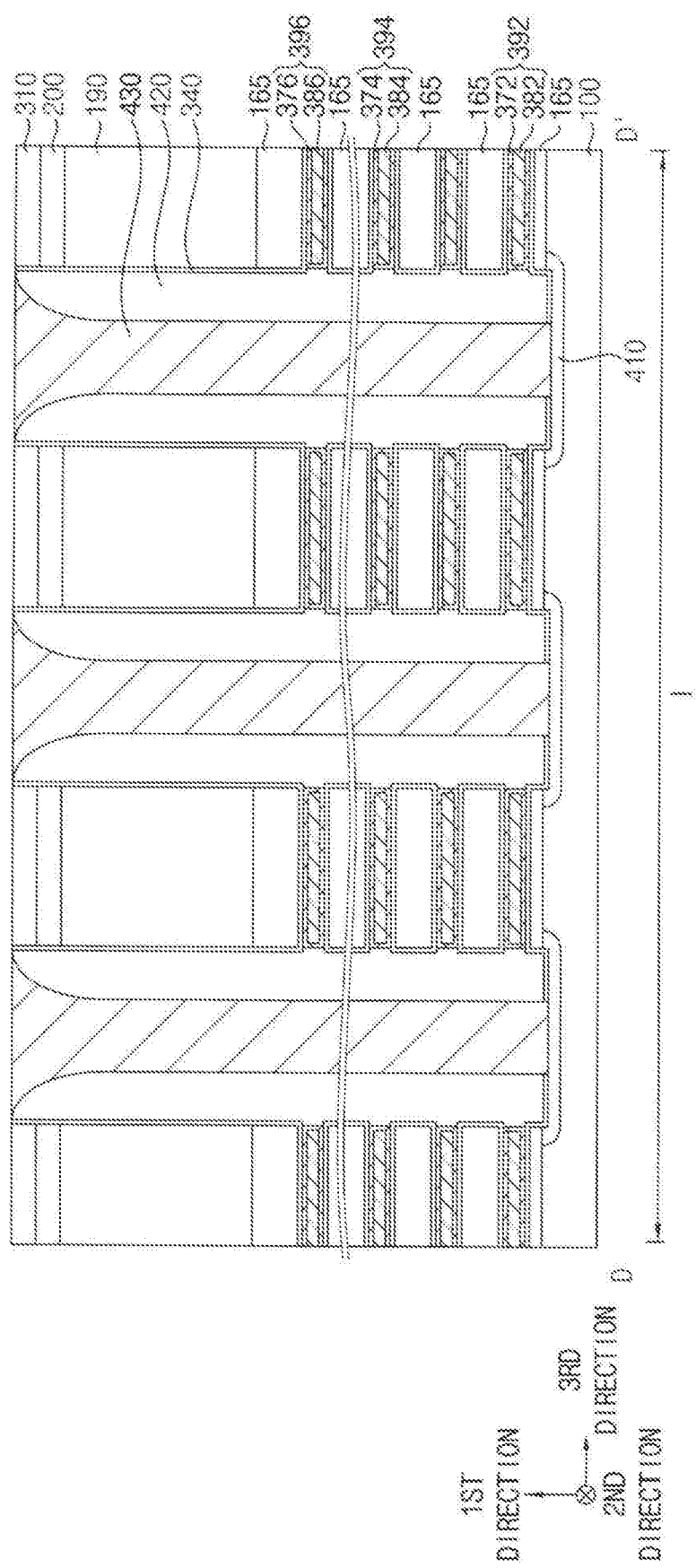
Figure 38:
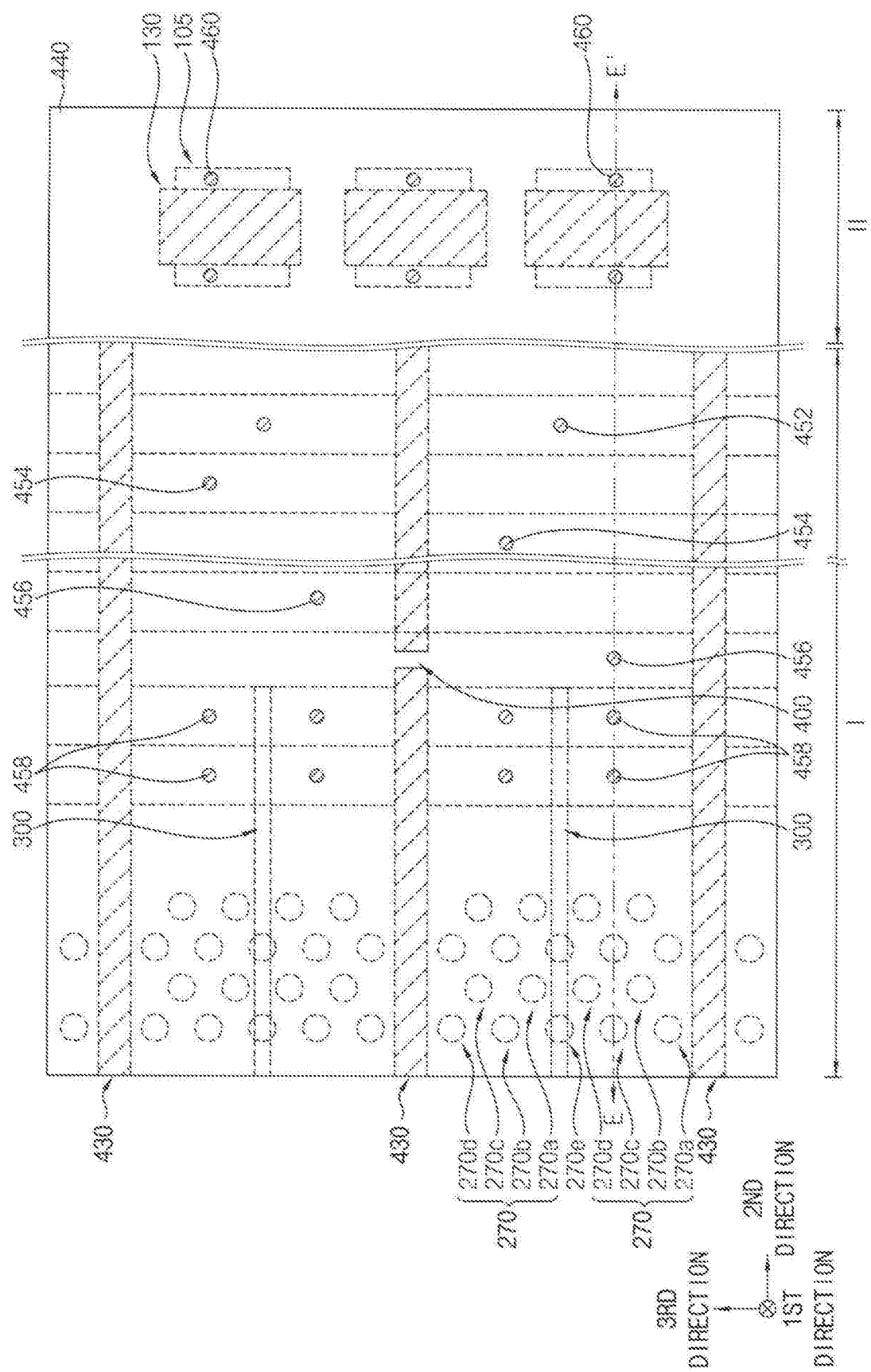
Figure 39:
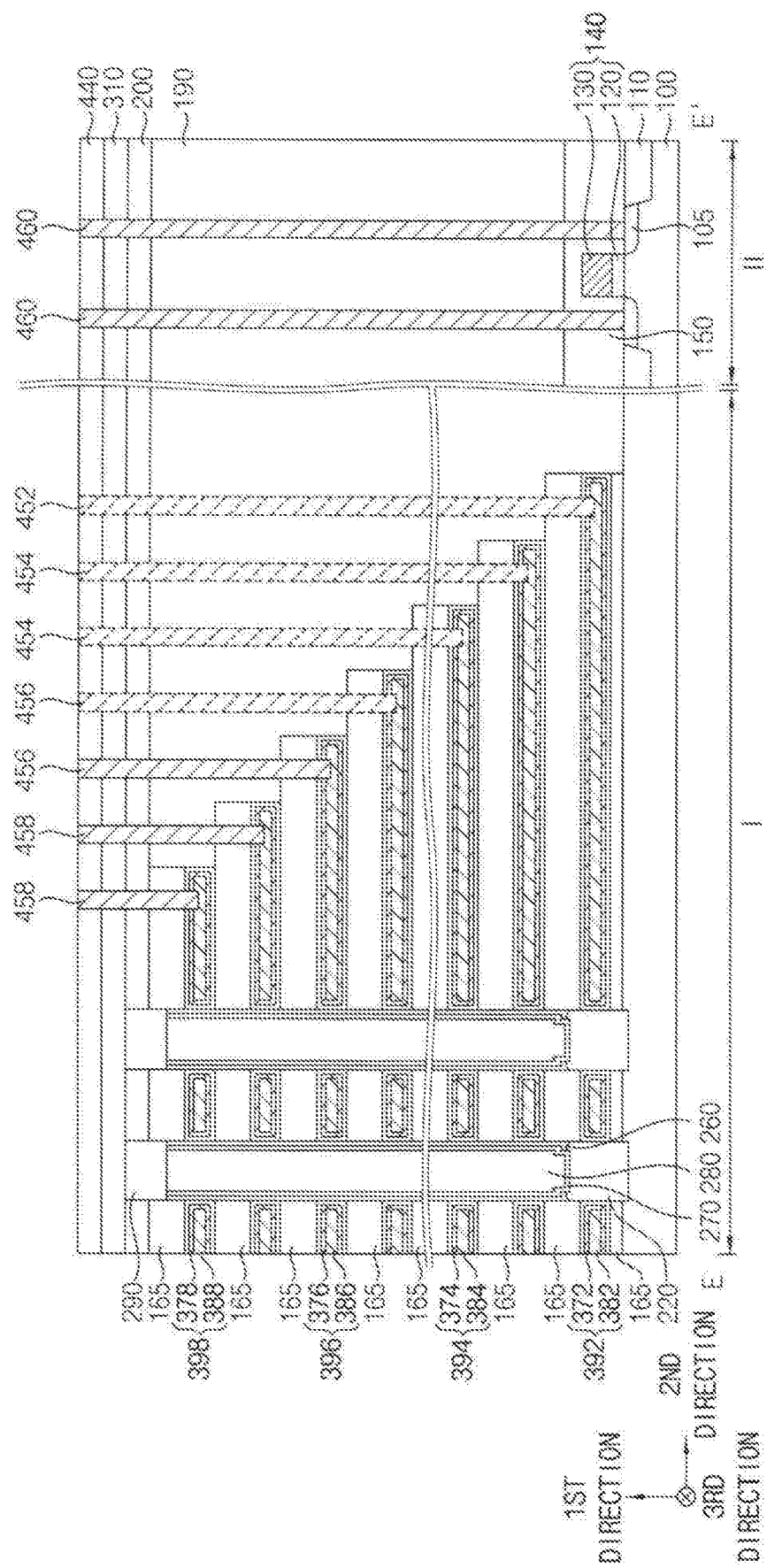
Figure 40:
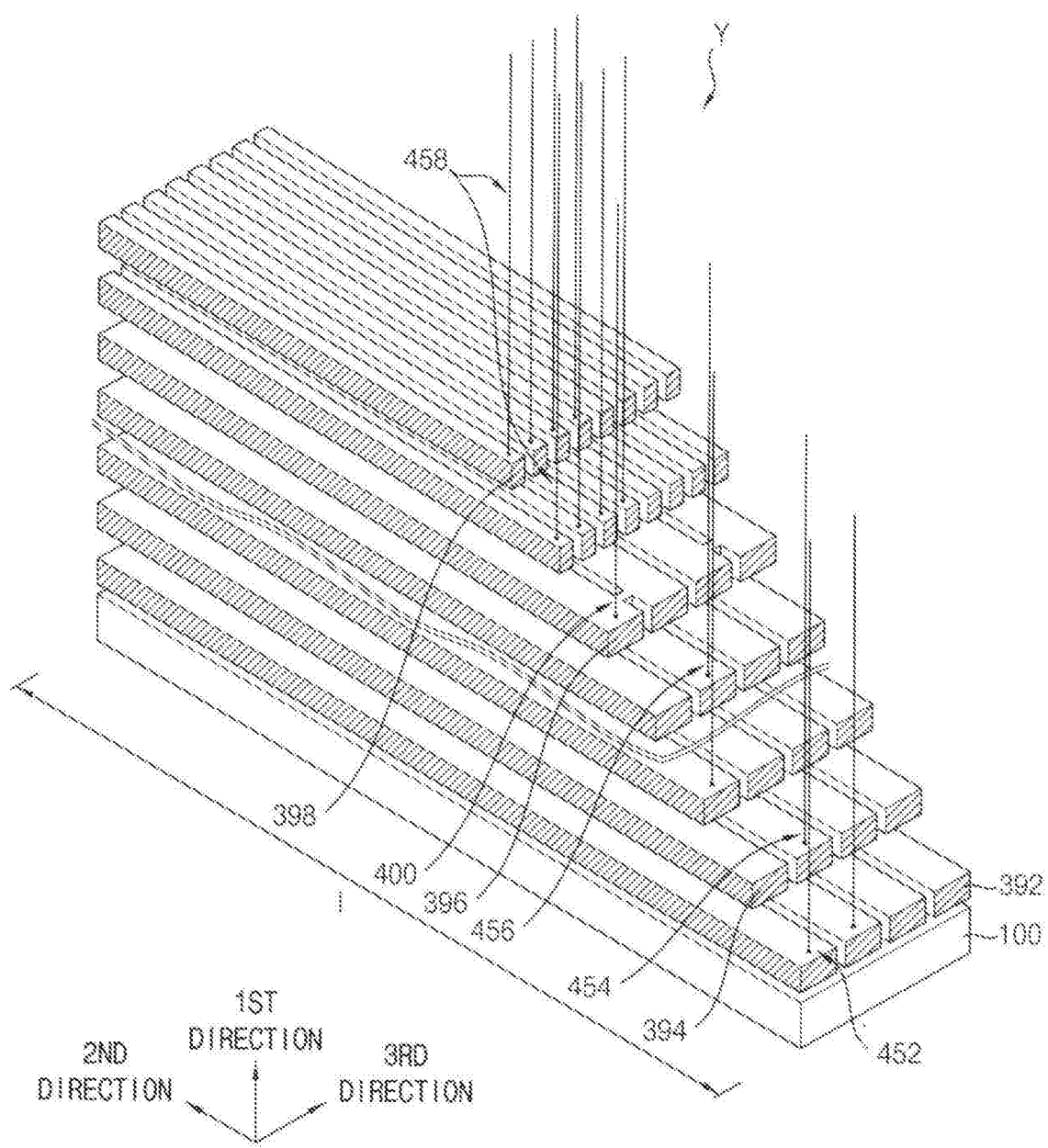
Figure 41:
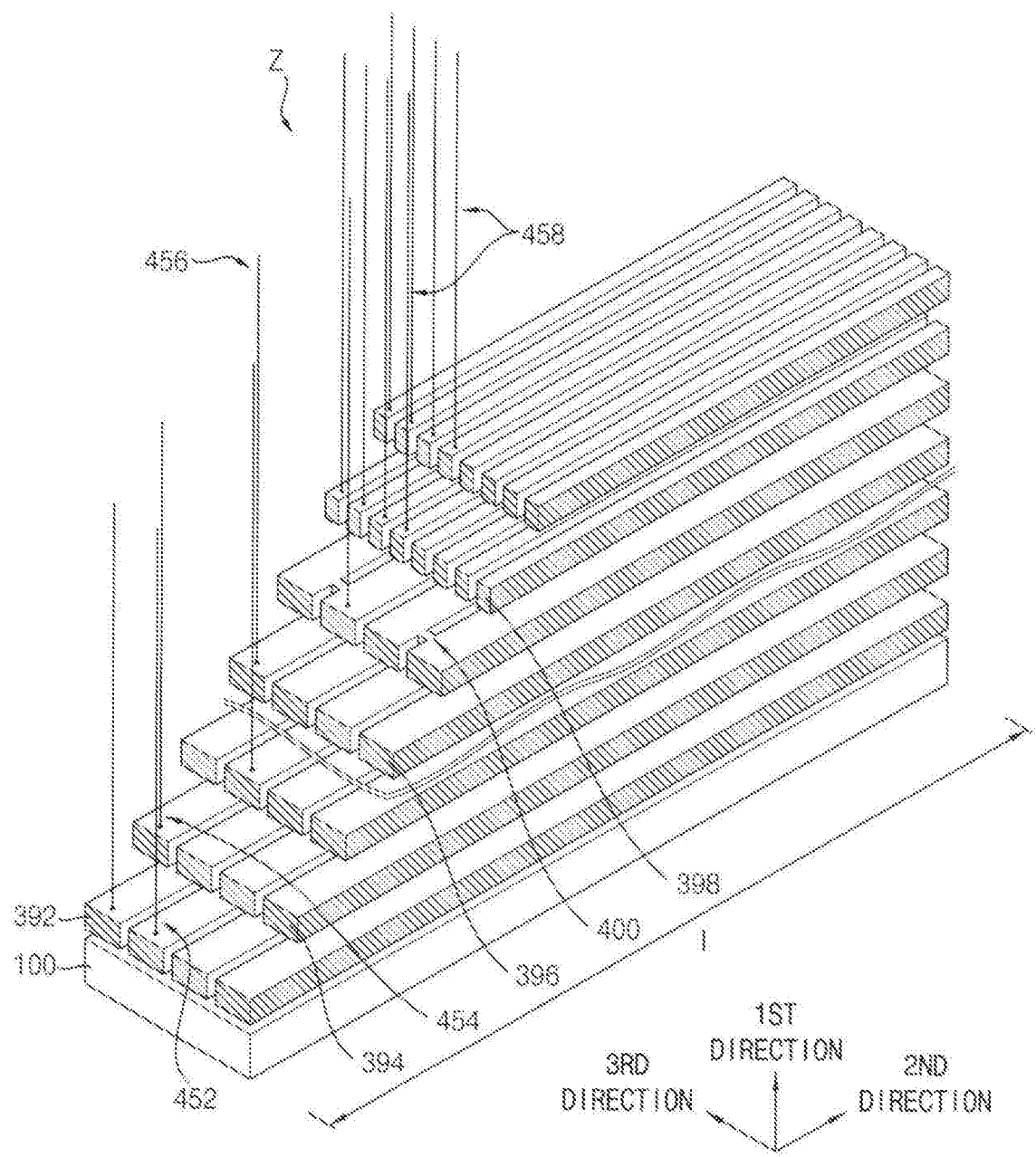
Figure 50:
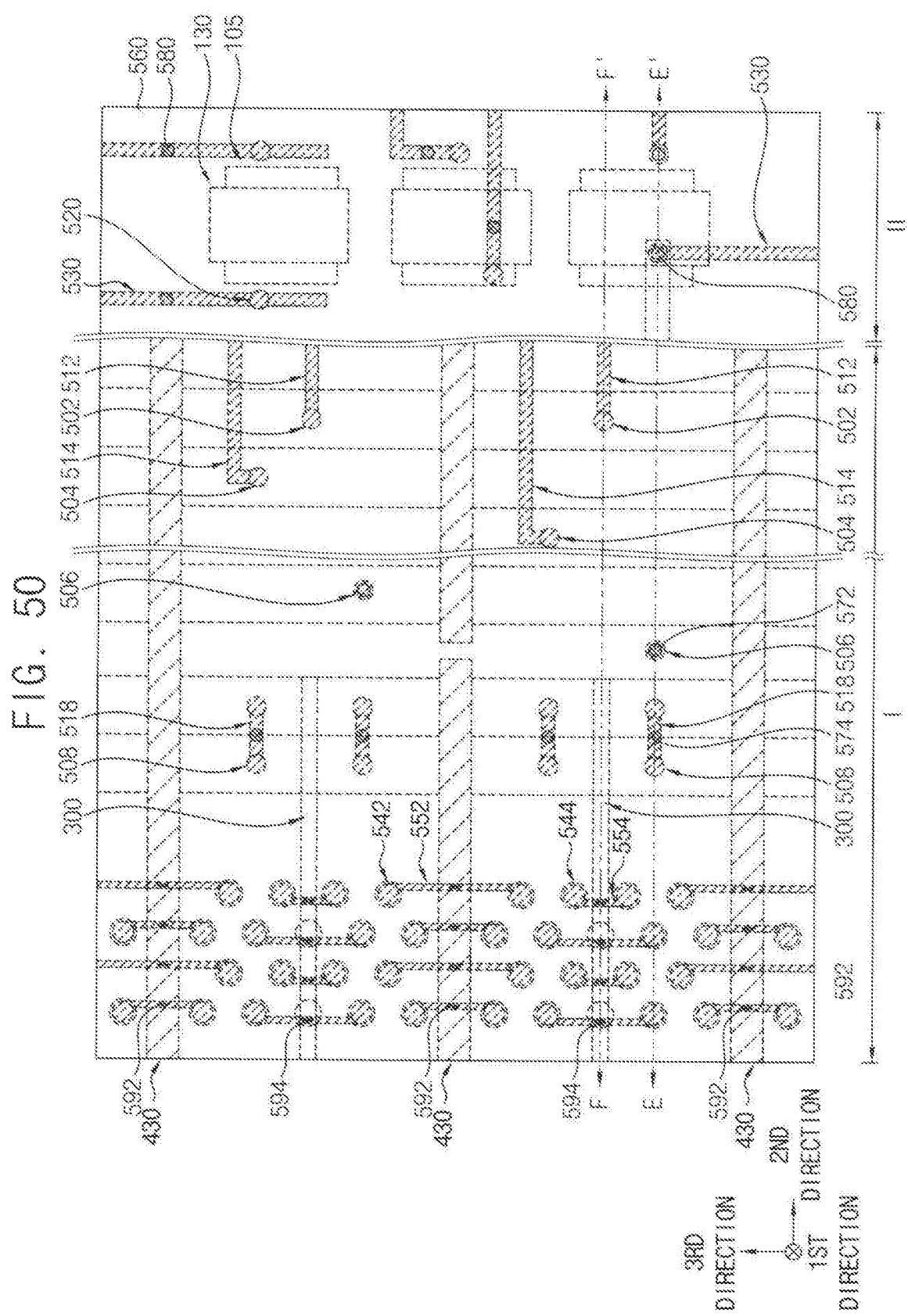
Figure 51:
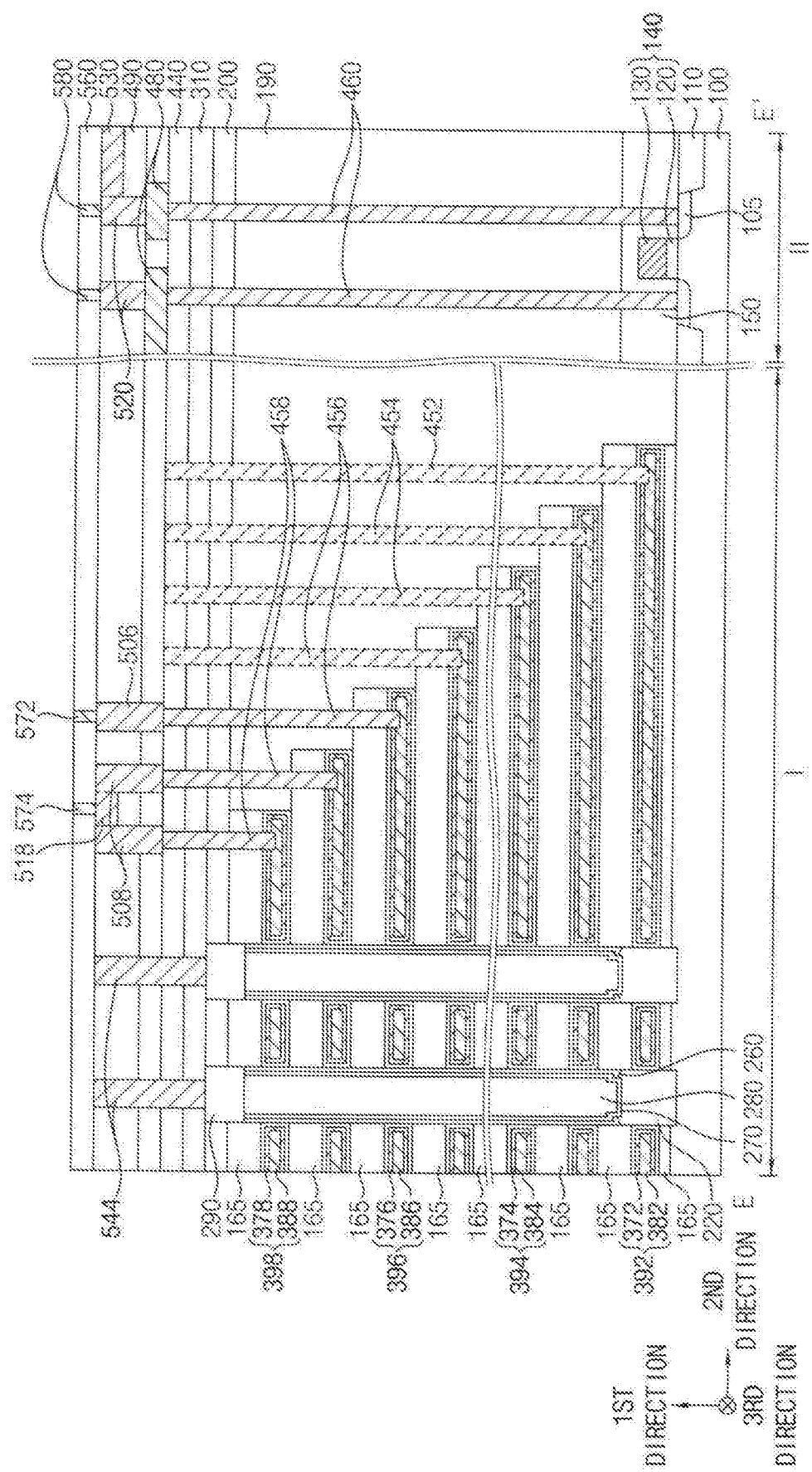
Figure 52:
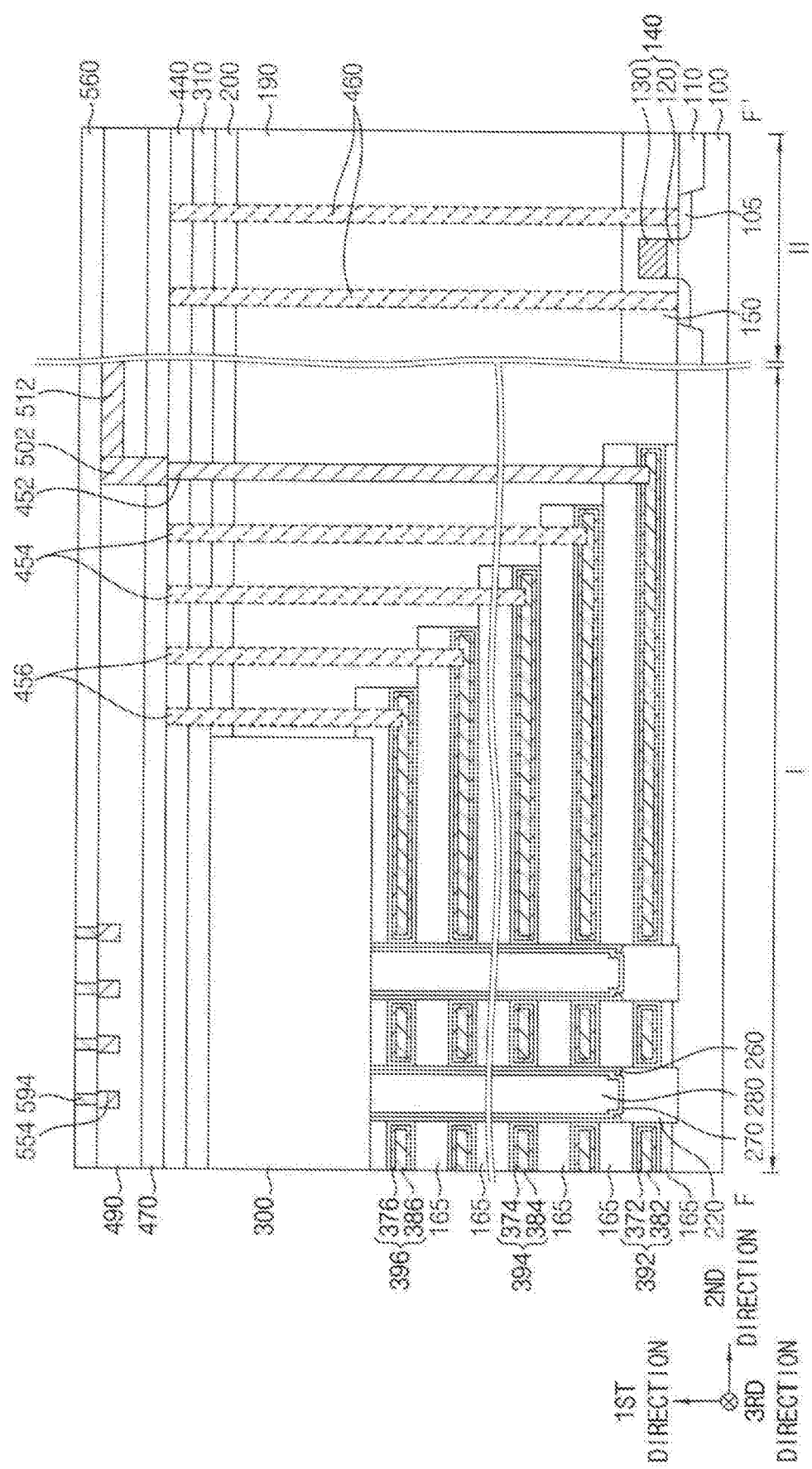
Figure 53:
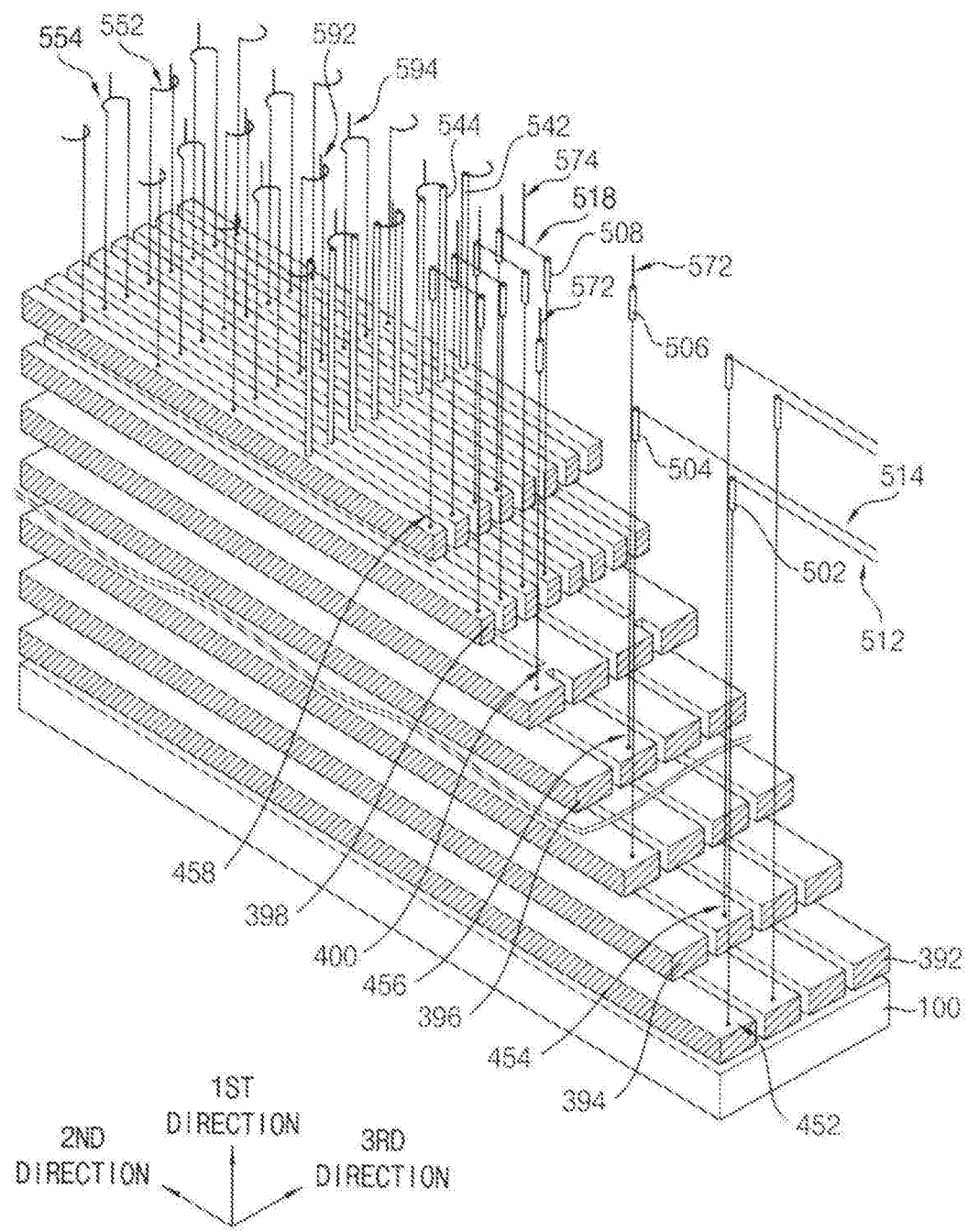
Figure 54:
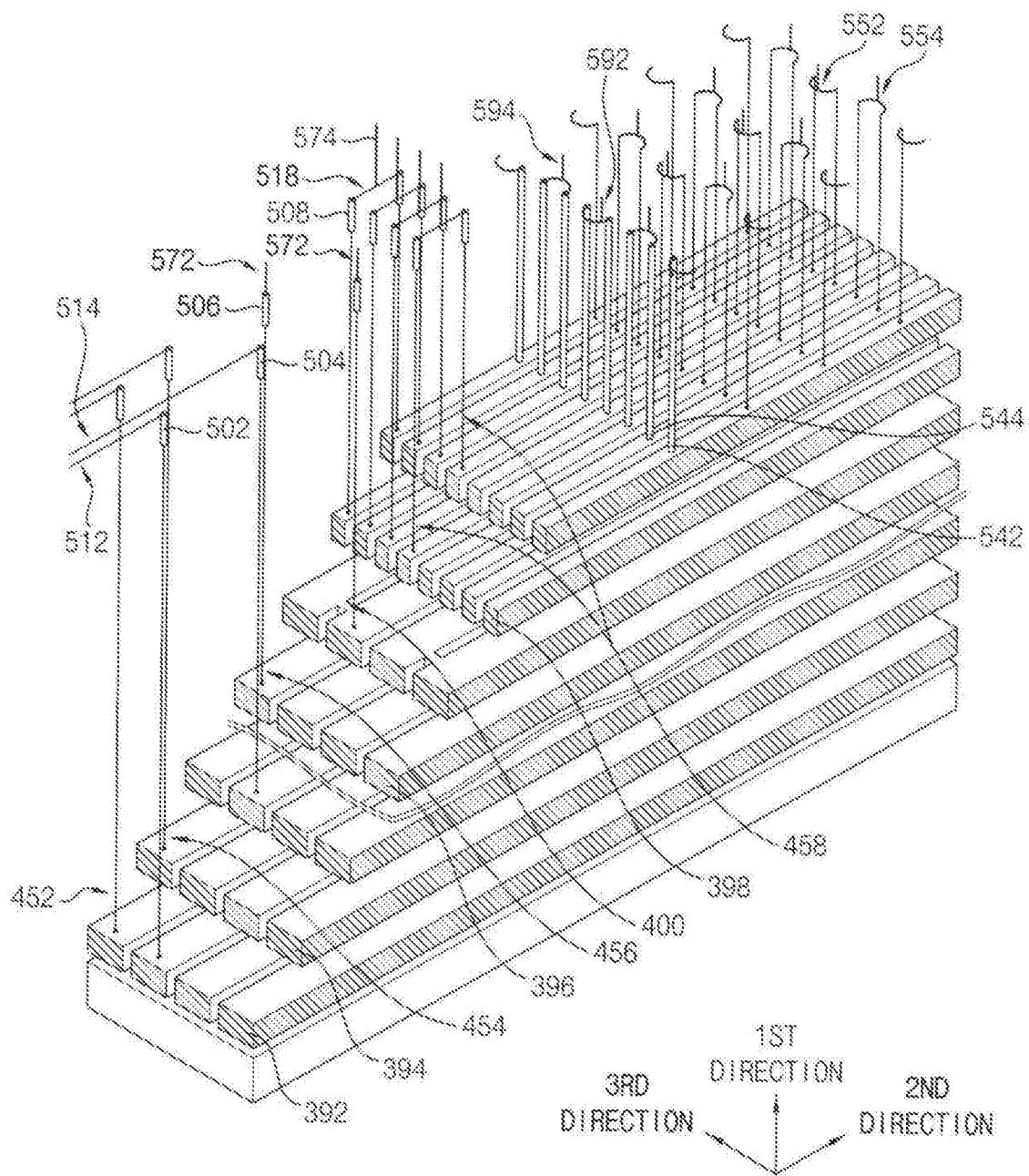

FIGS. 13, 14, 17, 19, 21, 23, 24 and 34 are cross-sectional views taken along lines A-A' of corresponding plan views, FIGS. 27, 29, 31, 32, 35 and 46 are cross-sectional views taken along lines B-B' of corresponding plan views, FIGS. 30 and 36 are cross-sectional views taken along lines C-C' of corresponding plan views, FIG. 37 is a cross-sectional view taken along a line D-D' of FIG. 33, FIGS. 39, 43, 47 and 51 are cross-sectional views taken along lines E-E' of corresponding plan views, FIG. 52 is a cross-sectional view taken along a line F-F' of FIG. 50, FIG. 44 is a cross-sectional view taken along lines G-G' of FIG. 42, and FIG. 16 is a cross-sectional view taken along a line H-H' of FIG. 15.

Figure 12:
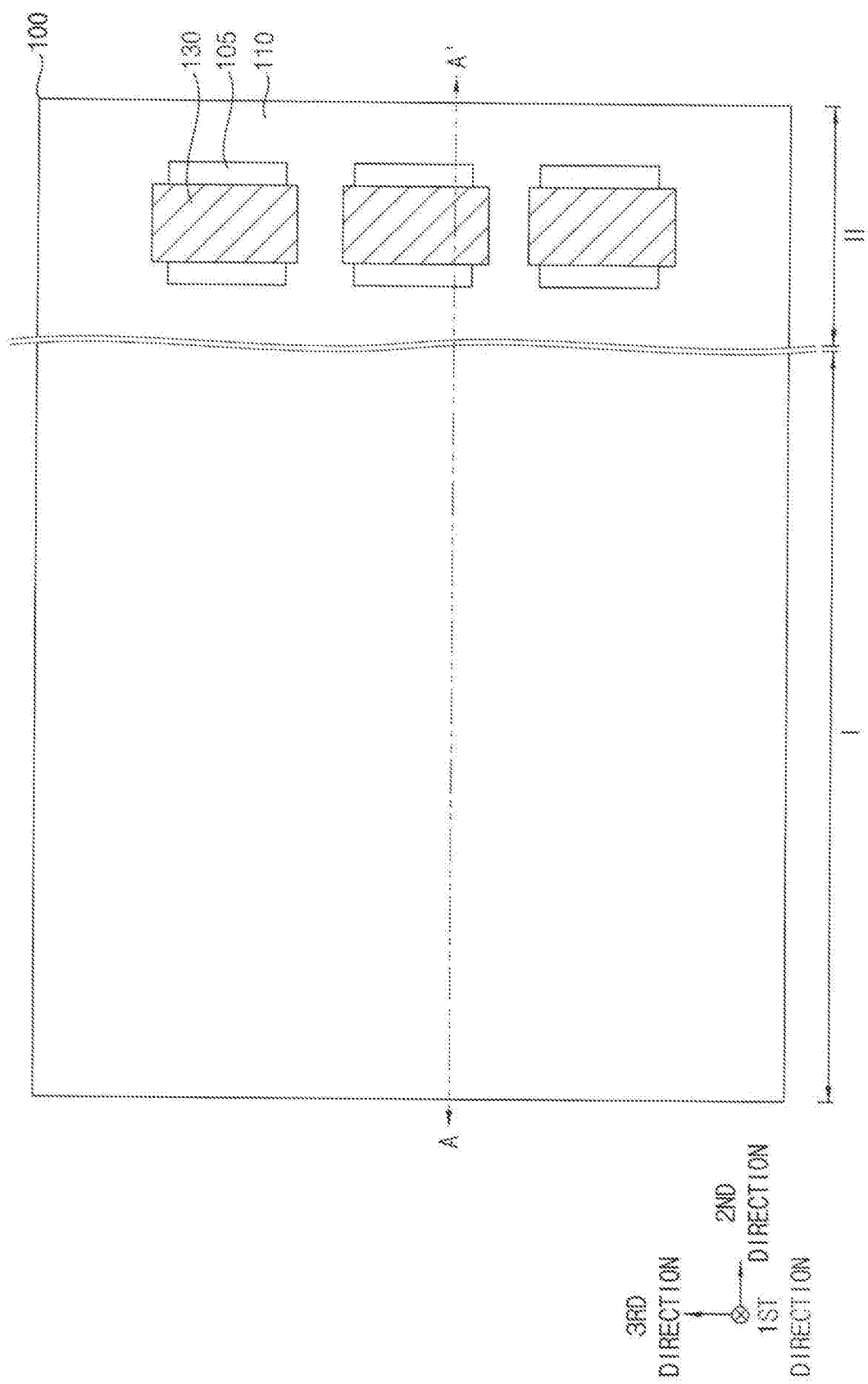
FIGS. 12 to 54 are plan views, cross-sectional views, and perspective views illustrating a method of manufacturing a vertical memory device in accordance with example embodiments.

Referring to FIGS. 12 and 13, a gate structure 140 and a first impurity region 105 may be formed on a second region II of a substrate 100.

The second region II of the substrate 100 may be divided into a field region on which an isolation pattern 110 is formed and an active region on which no isolation pattern is formed.

The gate structure 140 may be formed by sequentially forming and patterning a gate insulation layer and a gate electrode layer on the substrate 100 having the isolation pattern 110 thereon. Thus, the gate structure 140 may include a gate insulation pattern 120 and a gate electrode 130 sequentially stacked. In example embodiments, the gate structure 140 may be formed on the active region of the substrate 100, and may be also formed on a portion of the field region.

The first impurity region 105 may be formed at an upper portion of the active region adjacent the gate structure 140. The first impurity region 105 may be formed by doping n-type or p-type impurities into the upper portion of the active region.

In the figures, three gate structures 140 spaced apart from each other are shown on the second region II of the substrate 100, however, the inventive concepts are not limited thereto. Thus, a plurality of gate structures 140 may be formed in each of the second and third directions by various layouts.

Referring to FIG. 14, a first insulating interlayer 150 may be formed on the second region II of the substrate 100 to cover the gate structure 140.

An insulation layer 160 and a sacrificial layer 170 may be formed on the first region I of the substrate 100 and the first insulating interlayer 150.

The insulation layer 160 and the sacrificial layer 170 may be formed by, e.g., a chemical vapor deposition (CVD) process, an atomic layer deposition (ALD) process, etc.

The sacrificial layer 170 may include a material having an etching selectivity with respect to the insulation layer 160, e.g., silicon nitride.

Referring to FIGS. 15 and 16, a first division layer 180 may be formed through a portion of the sacrificial layer 170 on the first region I of the substrate 100.

The first division layer 180 may be formed by partially removing the sacrificial layer 170 to form a first opening (not shown) therethrough and filling the first opening. In example embodiments, a plurality of first division layers 180 may be formed in the third direction to be spaced apart from each other, and each of the plurality of first division layers 180 may be formed at an area overlapping a conductive connection portion 400 (refer to FIGS. 33 and 36) in the first direction that may be subsequently formed. Thus, the first division layer 180 may be formed to be close to each of opposite ends of the first region I of the substrate 100 in the second direction.

The first division layer 180 may include a material having an etching selectivity with respect to the sacrificial layer 170.

Figure 17:
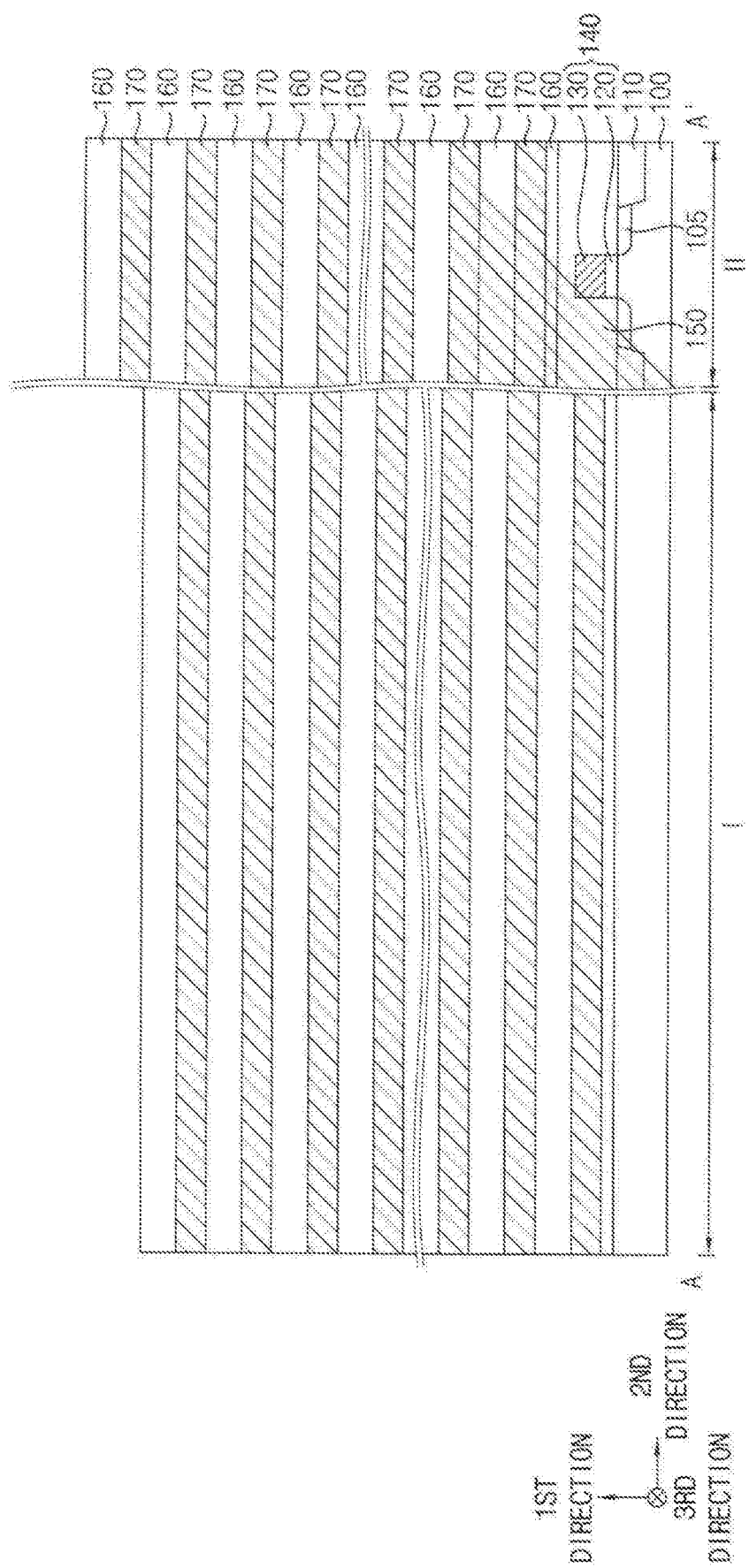
Figure 18:
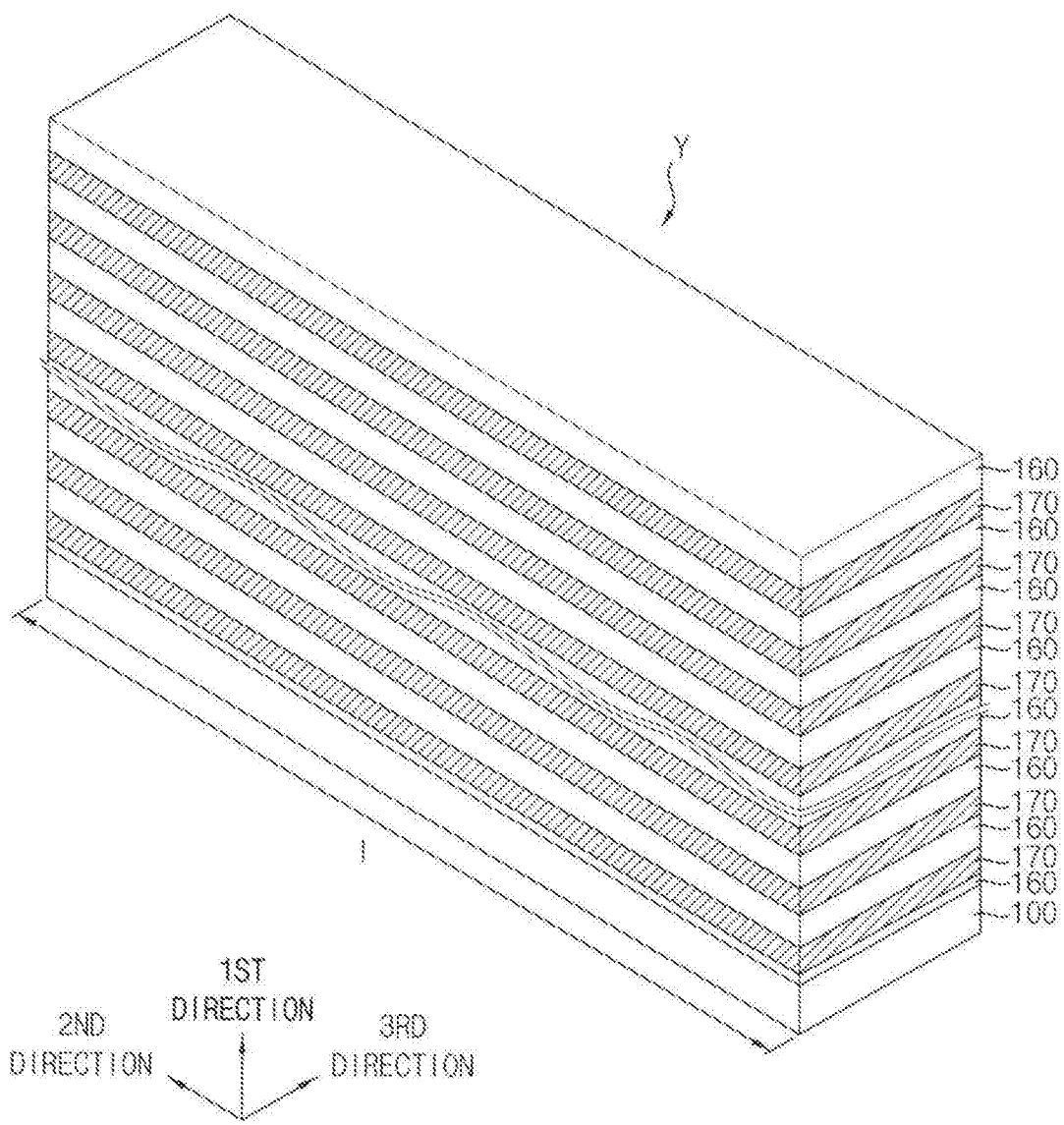

Referring to FIGS. 17 and 18, the insulation layer 160 and the sacrificial layer 170 may be alternately and repeatedly formed on the first region I and the second region II of the substrate 100. Thus, a plurality of insulation layers 160 and a plurality of sacrificial layers 170 may be alternately stacked on each other in the first direction. FIGS. 17 and 18 show eight insulation layers 160 and seven sacrificial layers 170; however, the inventive concepts are not limited thereto.

Figure 19:
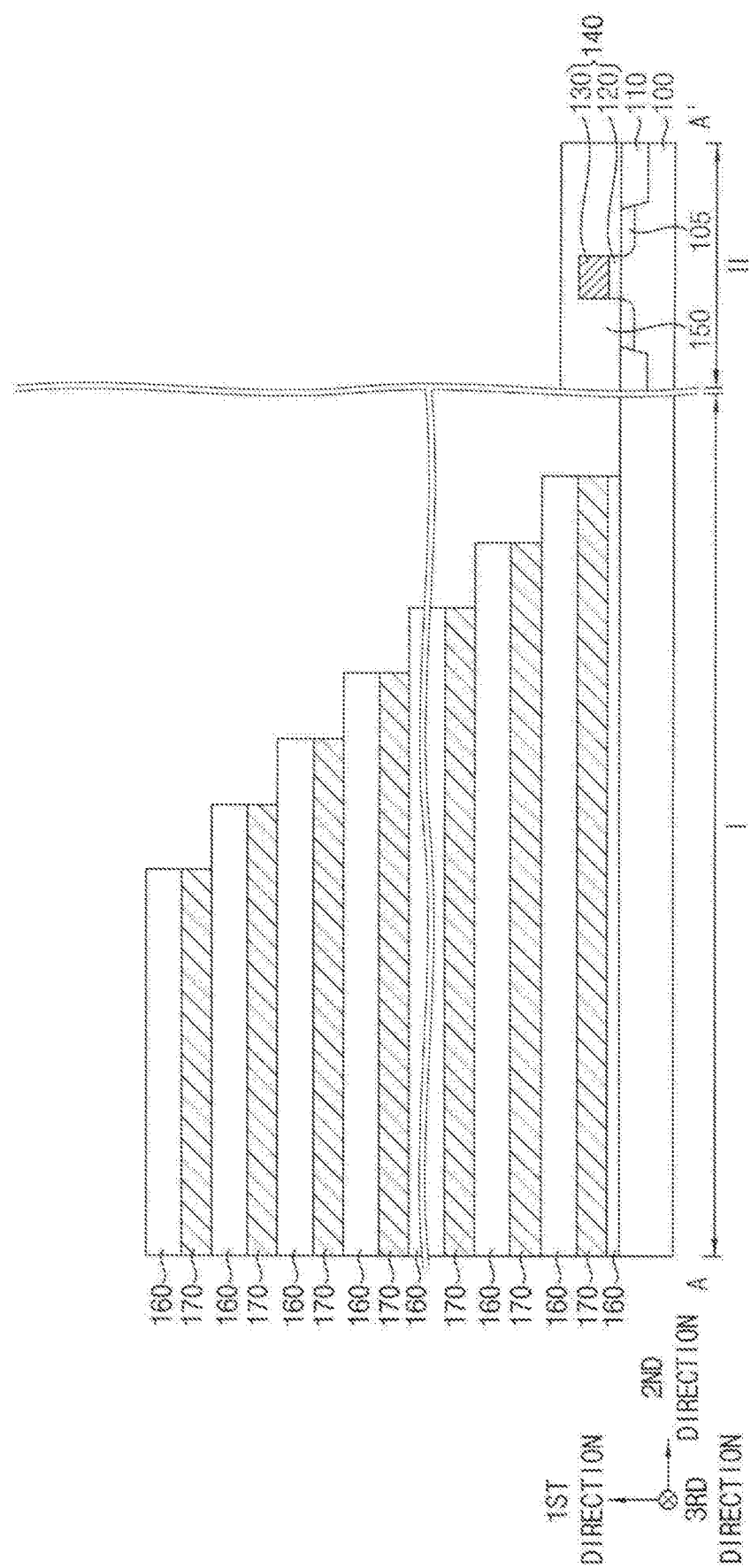
Figure 20:
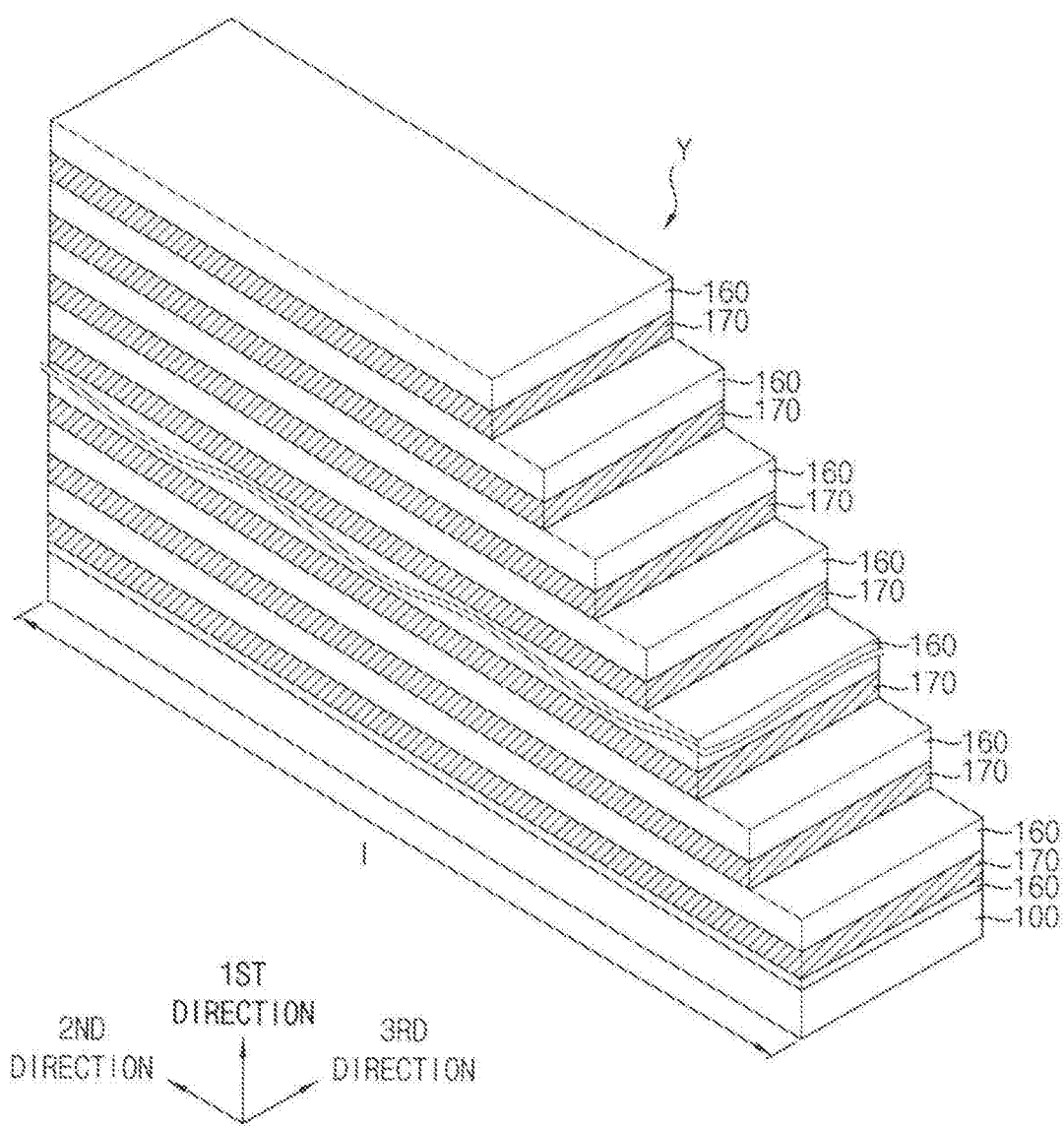

Referring to FIGS. 19 and 20, a photoresist pattern (not shown) may be formed on an uppermost one of the insulation layers 160, and the uppermost one of the insulation layers 160 and an uppermost one of the sacrificial layers 170 may be etched using the photoresist pattern as an etching mask. Thus, a portion of one of the insulation layers 160 directly under the uppermost one of the sacrificial layers 170 may be exposed. A trimming process may be performed. Particularly, after reducing the area of the photoresist pattern by a given ratio, the uppermost one of the insulation layers 160, the uppermost one of the sacrificial layers 170, the exposed one of the insulation layers 160 by the etching process, and one of the sacrificial layers 170 directly under the exposed one of the insulation layers 160 may be etched using the reduced photoresist pattern as an etching mask. The trimming process may be repeatedly performed so that a staircase structure including a plurality of steps each of which may include one sacrificial layer 170 and one insulation layer 160 sequentially stacked may be formed on the first region I of the substrate 100.

Figure 21:
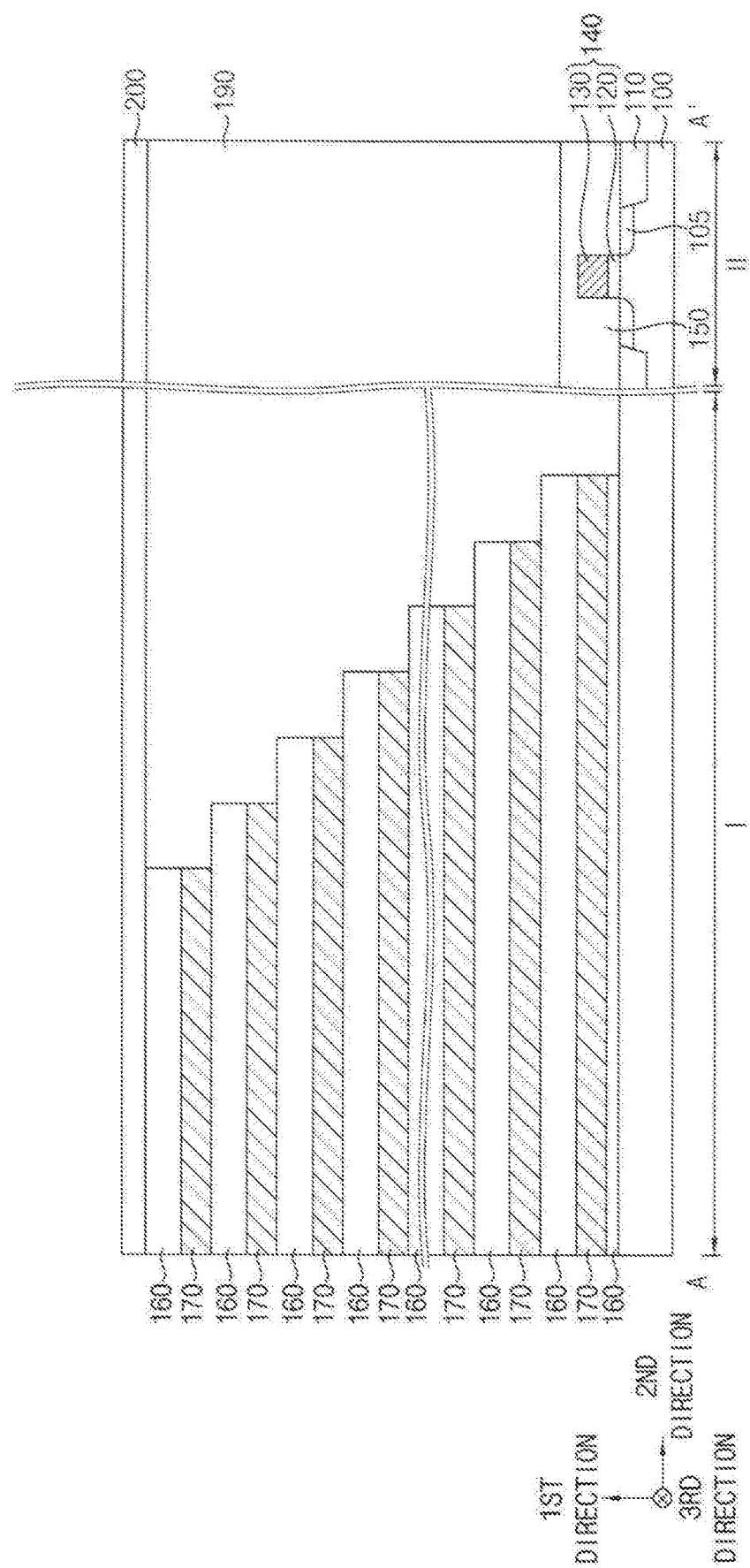

Referring to FIG. 21, a second insulating interlayer 190 may be formed on the substrate 100 to cover the staircase structure, and the second insulating interlayer 190 may be planarized until an upper surface of the uppermost one of the insulation layers 160 may be exposed. Thus, the second insulating interlayer 190 may cover a sidewall of the staircase structure.

The planarization process may include a chemical mechanical polishing (CMP) process and/or an etch back process.

A third insulating interlayer 200 may be formed on upper surfaces of the staircase structure and the second insulating interlayer 190.

Figure 22:
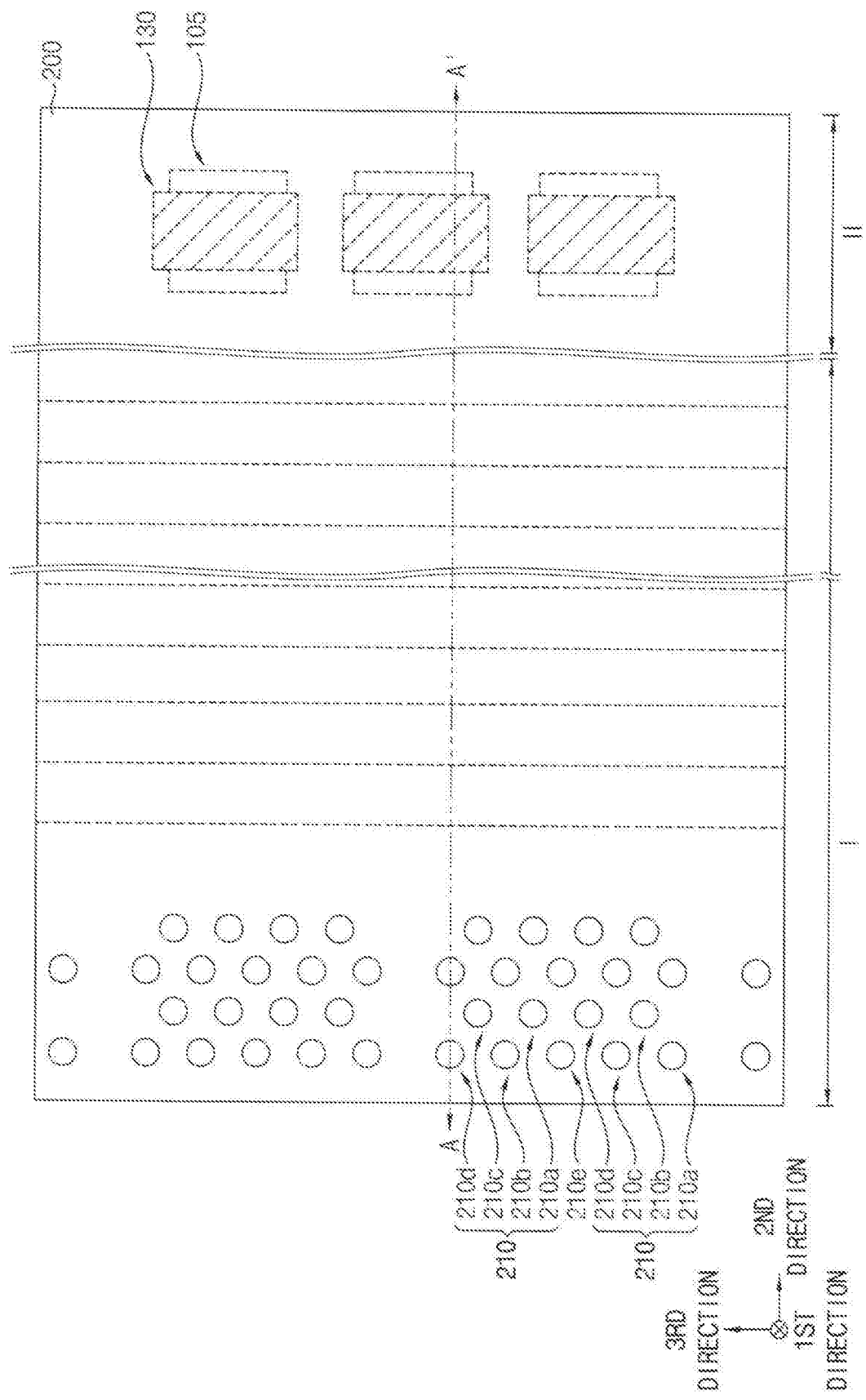
Figure 23:
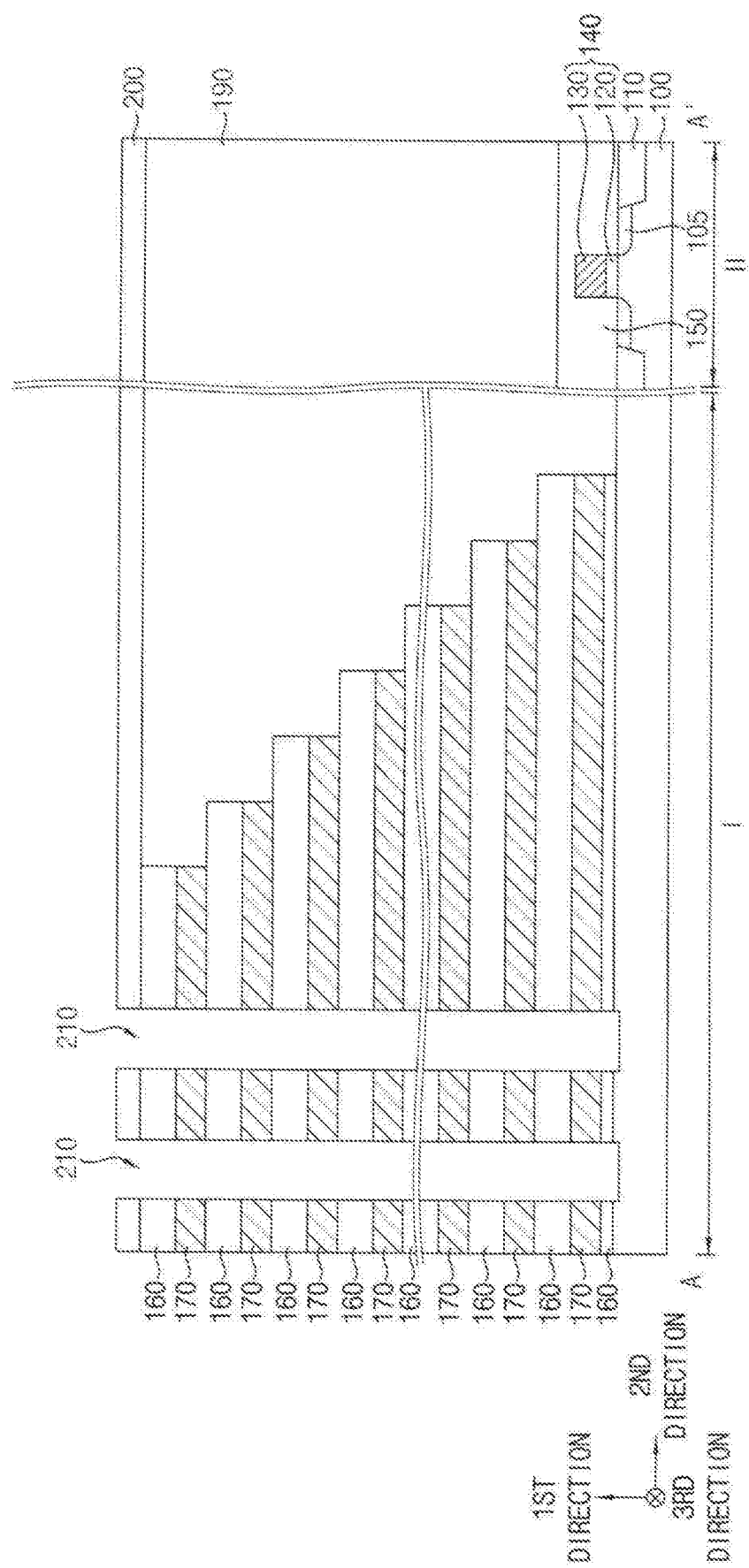

Referring to FIGS. 22 and 23, a first mask (not shown) may be formed on the third insulating interlayer 200, and the third insulating interlayer 200, the insulation layers 160, and the sacrificial layers 170 may be etched using the first mask as an etching mask to form a channel hole 210 therethrough that may expose an upper surface of the first region I of the substrate 100.

A plurality of channel holes 210 may be formed in each of the first and second directions, and thus a channel hole array may be defined. In example embodiments, the channel hole array may include a first channel hole column 210a including first channel holes disposed in the second direction, and a second channel hole column 210b including second channel holes disposed in the second direction and being spaced apart from the first channel hole column 210a in the third direction. The second channel holes may be disposed to have acute angles with the second direction or the third direction from the first channel holes, and the first and second channel holes may be arranged in a zigzag layout along the second direction.

The first and second channel hole columns 210a and 210b may be alternately and repeatedly arranged in the third direction. In example embodiments, five first channel hole columns 210a and four second channel hole columns 210b may be alternately arranged in the third direction, which may form one channel hole group.

Hereinafter, four channel hole columns disposed in the third direction in one channel hole group may be referred to as first, second, third and fourth channel hole columns 210a, 210b, 210c and 210d, respectively, in this order, one channel hole column at a central position in the third direction in the channel hole group may be referred to as a fifth channel hole column 210e, and the other four channel hole columns disposed in the third direction in the channel hole group may be referred to as the first, second, third and fourth channel hole columns 210a, 210b, 210c and 210d, respectively, again in this order.

The first to fourth channel hole columns 210a, 210b, 210c and 210d may define one channel hole block. FIG. 22 shows a channel hole array including two channel hole groups spaced apart from each other in the third direction, each of the channel hole groups includes two channel hole blocks disposed in the third direction, and the fifth channel hole column 210e is disposed between the two channel hole blocks. However, the number of the channel hole blocks in each channel hole group, or the number of the channel hole columns in each channel hole block are not limited thereto.

Figure 24:
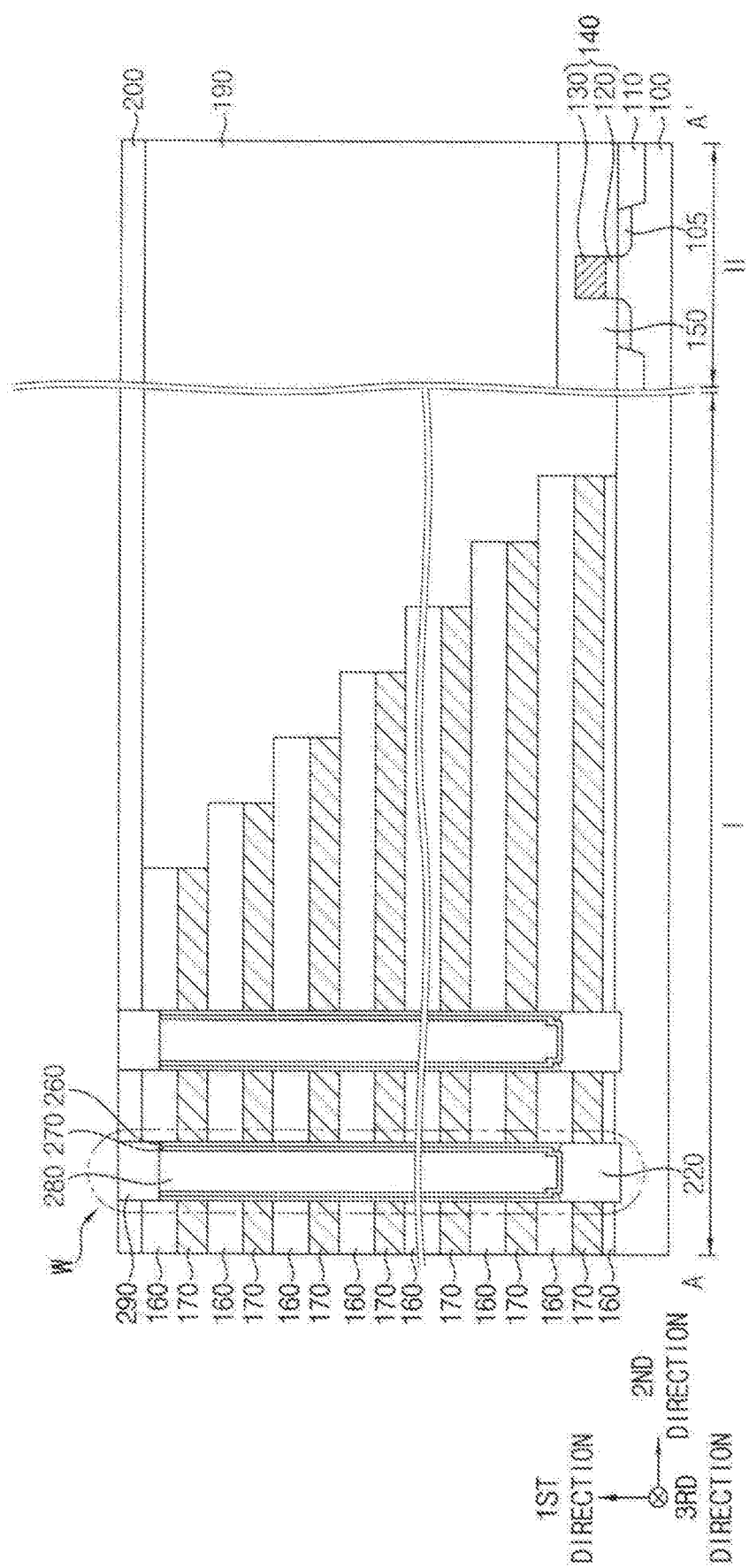
Figure 25:
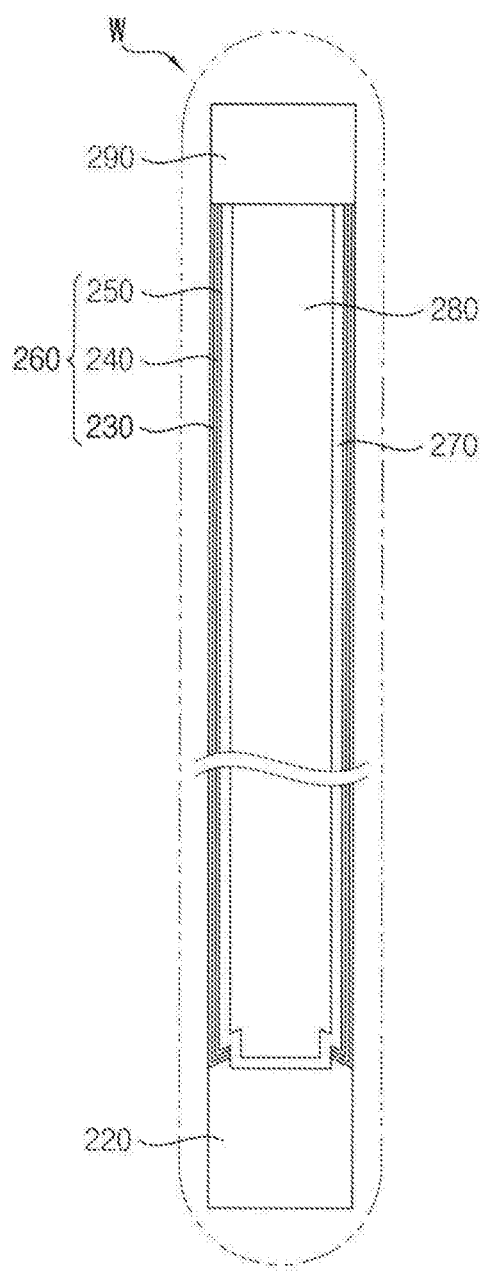

Referring to FIGS. 24 and 25, after removing the first mask, a semiconductor pattern 220 may be formed to partially fill the channel hole 210.

Particularly, a selective epitaxial growth (SEG) may be performed using the upper surfaces of the substrate 100 exposed by the channel holes 210 as a seed to form the semiconductor pattern 220 partially filling the channel hole 210. In example embodiments, an upper surface of the semiconductor pattern 220 may be formed between an upper surface and a lower surface of one of the insulation layers 160 at a second level from the upper surface of the substrate 100.

A first blocking layer, a charge storage layer, a tunnel insulation layer and a first spacer layer (not shown) may be sequentially formed on sidewalls of channel holes 210, an upper surface of the semiconductor pattern 220, and an upper surface of the third insulating interlayer 200, the first spacer layer (not shown) may be anisotropically etched to form a first spacer (not shown) on the sidewalls of the channel holes 210. The tunnel insulation layer, the charge storage layer, and the first blocking layer may be etched using the first spacer as an etching mask to form a tunnel insulation pattern 250, a charge storage pattern 240, and a first blocking pattern 230, respectively, on the semiconductor pattern 220 and the sidewall of each of the channel holes 210. Each of the tunnel insulation pattern 250, the charge storage pattern 240 and the first blocking pattern 230 may have a cup-like shape of which a bottom is opened. Accordingly, a charge storage structure 260 including the tunnel insulation pattern 250, the charge storage pattern 240 and the first blocking pattern 230 may be formed. During the etching process, an upper portion of each of the semiconductor pattern 220 may be also partially removed.

The first spacer layer may include a nitride, e.g., silicon nitride.

After removing the first spacer, a channel layer may be formed on the exposed semiconductor pattern 220, the tunnel insulation pattern 250 and the third insulating interlayer 200, and a filling layer may be formed on the channel layer to fill remaining portions of the channel holes 210. The filling layer and the channel layer may be planarized until the upper surface of the third insulating interlayer 200 may be exposed to form a filling pattern 280 filling the remaining portion of each of the channel holes 210, and the channel layer may be transformed into a channel 270.

As the channel holes 210 may form the first to fifth channel hole columns 210a, 210b, 210c, 210d and 210e, the channel hole block, the channel hole group and the channel hole array, the channel 270 may also form first to fifth channel columns 270a, 270b, 270c, 270d and 270e, a channel block, a channel group and a channel array.

An upper portion of a first structure including the filling pattern 280, the channel 270 and the charge storage structure 260 may be removed to form a trench (not shown), and a capping pattern 290 filling the trench may be formed.

Figure 26:
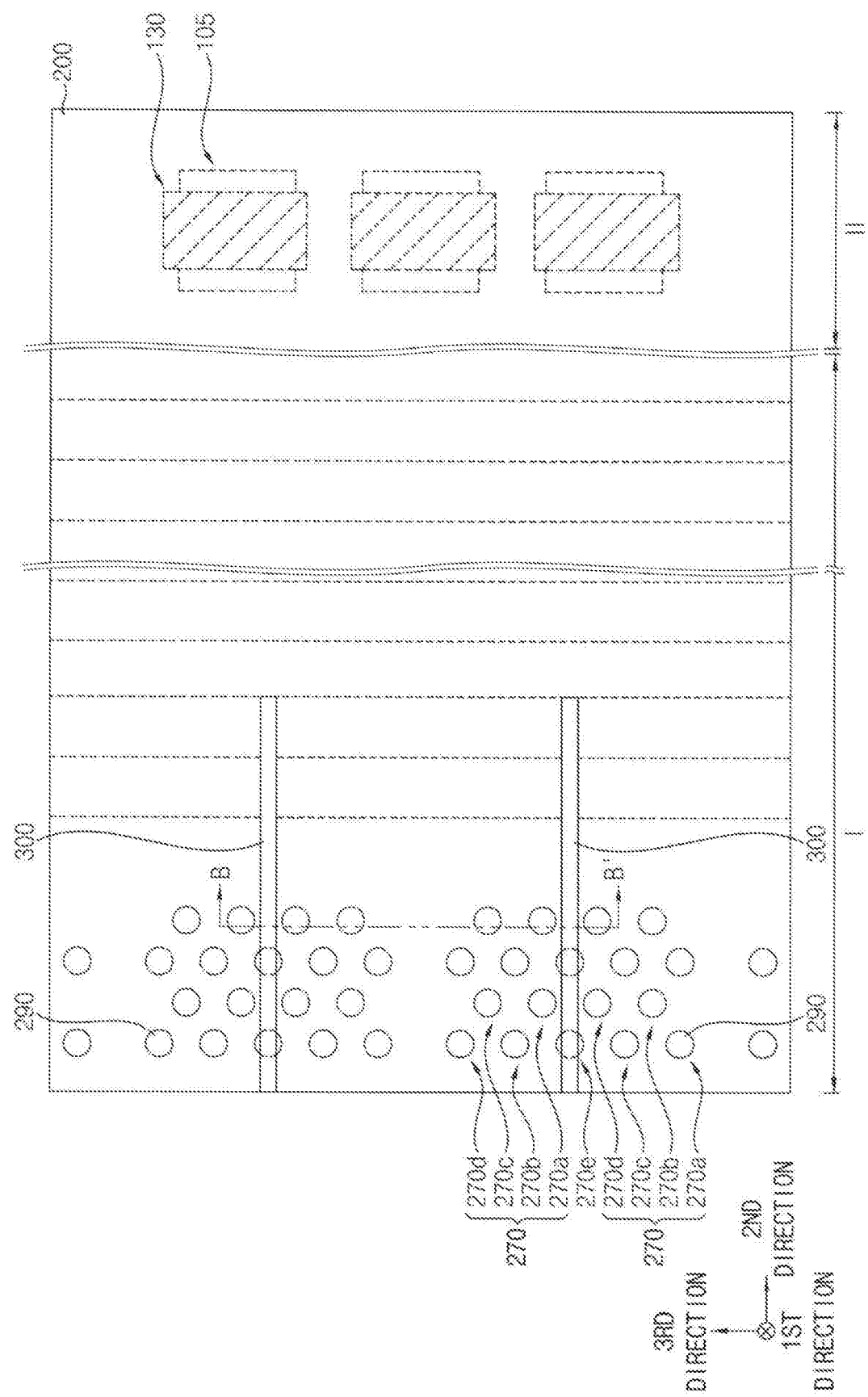
Figure 27:
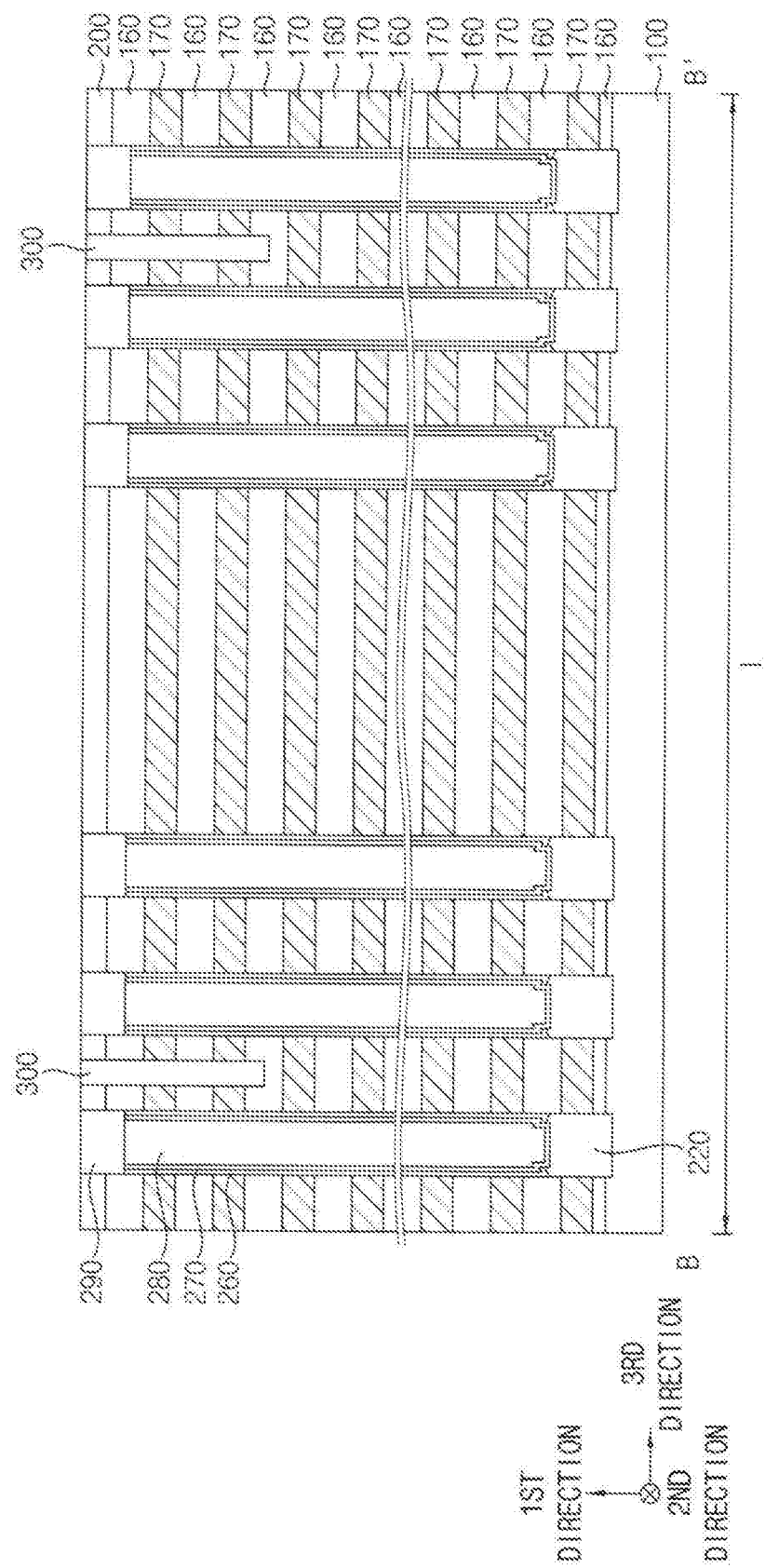

Referring to FIGS. 26 and 27, a second division layer 300 may be formed through some of the sacrificial layers 170 and the insulation layers 160.

The second division layer 300 may be formed by forming a second mask on the third insulating interlayer 200, etching the third insulating interlayer 200 and some of the sacrificial layers 170 and the insulation layers 160 to form a second opening (not shown) therethrough, and fill the second opening with an insulating material.

In example embodiments, the second division layer 300 may extend in the second direction between two channel blocks in one channel group, and may extend through upper portions of the channels 270 included in the fifth channel column 270e.

In example embodiments, the second division layer 300 may extend through not only the upper portions of the channels 270 but also the third insulating interlayer 200, ones of the sacrificial layers 170 at first and second levels from above, and ones of the insulation layers 160 at first and second levels from above, and further extend through an upper portion of one of the insulation layers 160 at a third level from above. The second division layer 300 may extend in the second direction through ones of the steps of the staircase structure at first and second levels from above. Thus, one of the sacrificial layers 170 at each of the first and second levels from above may be divided into two pieces in the third direction by the second division layer 300.

Figure 28:
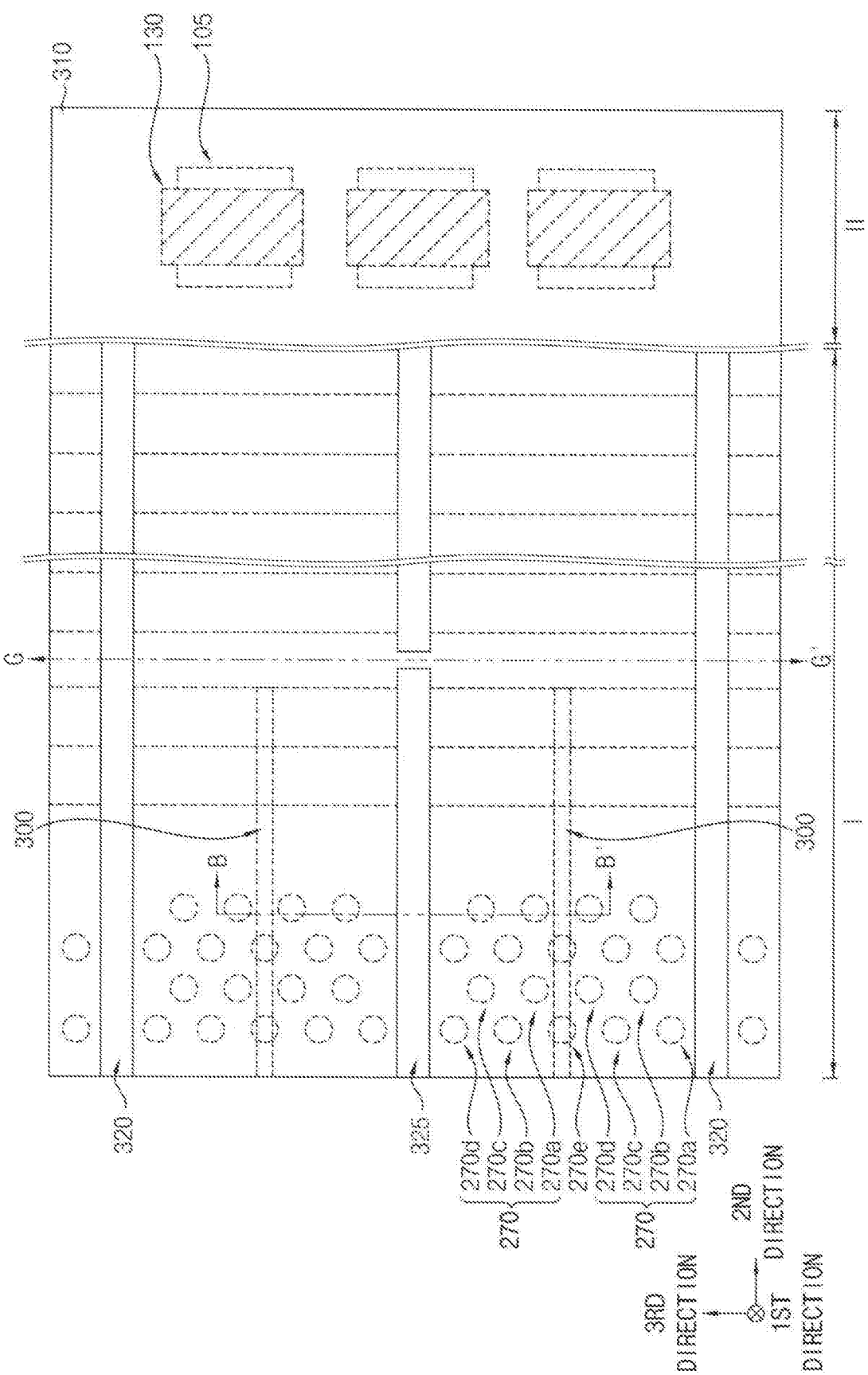

Referring to FIGS. 28 to 30, a fourth insulating interlayer 310 may be formed on the third insulating interlayer 200, the capping pattern 290 and the second division layer 300. A third mask (not shown) may be formed on the fourth insulating interlayer 310, and the third and fourth insulating interlayers 200 and 310, the insulation layers 160, and the sacrificial layers 170 may be etched using the third mask as an etching mask to form third and fourth openings 320 and 325 exposing upper surfaces of the substrate 100.

In example embodiments, each of the third and fourth openings 320 and 325 may extend in the second direction between the channel groups on the first region I of the substrate 100, and a plurality of third openings 320 and a plurality of fourth openings 325 may be formed in the third direction. That is, one channel group may be disposed between neighboring ones of the third and fourth openings 320 and 325 in the third direction, and the channel group may include two channel blocks containing four channel columns that may be disposed at opposite sides of the fifth channel column 270e, respectively.

According as the third and fourth openings 320 and 325 are formed, the insulation layer 160 and the sacrificial layer 170 may be transformed into insulation patterns 165 and sacrificial patterns (not shown), respectively.

In example embodiments, the third and fourth openings 320 and 325 may be alternately formed in the third direction. That is, one fourth opening 325 may be formed between neighboring two of the third openings 320 in the third direction, however, the inventive concepts are not limited thereto.

The fourth opening 325 may not continuously extend to opposite ends of the staircase structure in the second direction, but some portions thereof may be broken at some areas, unlike the third opening 320. In example embodiments, the fourth opening 325 may be broken at an area overlapping the pad region of one of the steps at a third level from above in the first direction, and the area may overlap the first division layer 180 in the first direction.

After removing the third mask, the sacrificial patterns exposed by the third and fourth openings 320 and 325 may be removed to form a gap 330 between neighboring ones of the insulation patterns 165 in the first direction, and a portion of a sidewall of the second division layer 300, a portion of an outer sidewall of the first blocking pattern 230, and a portion of a sidewall of the semiconductor pattern 220 may be exposed by the gap 330.

Figure 31:
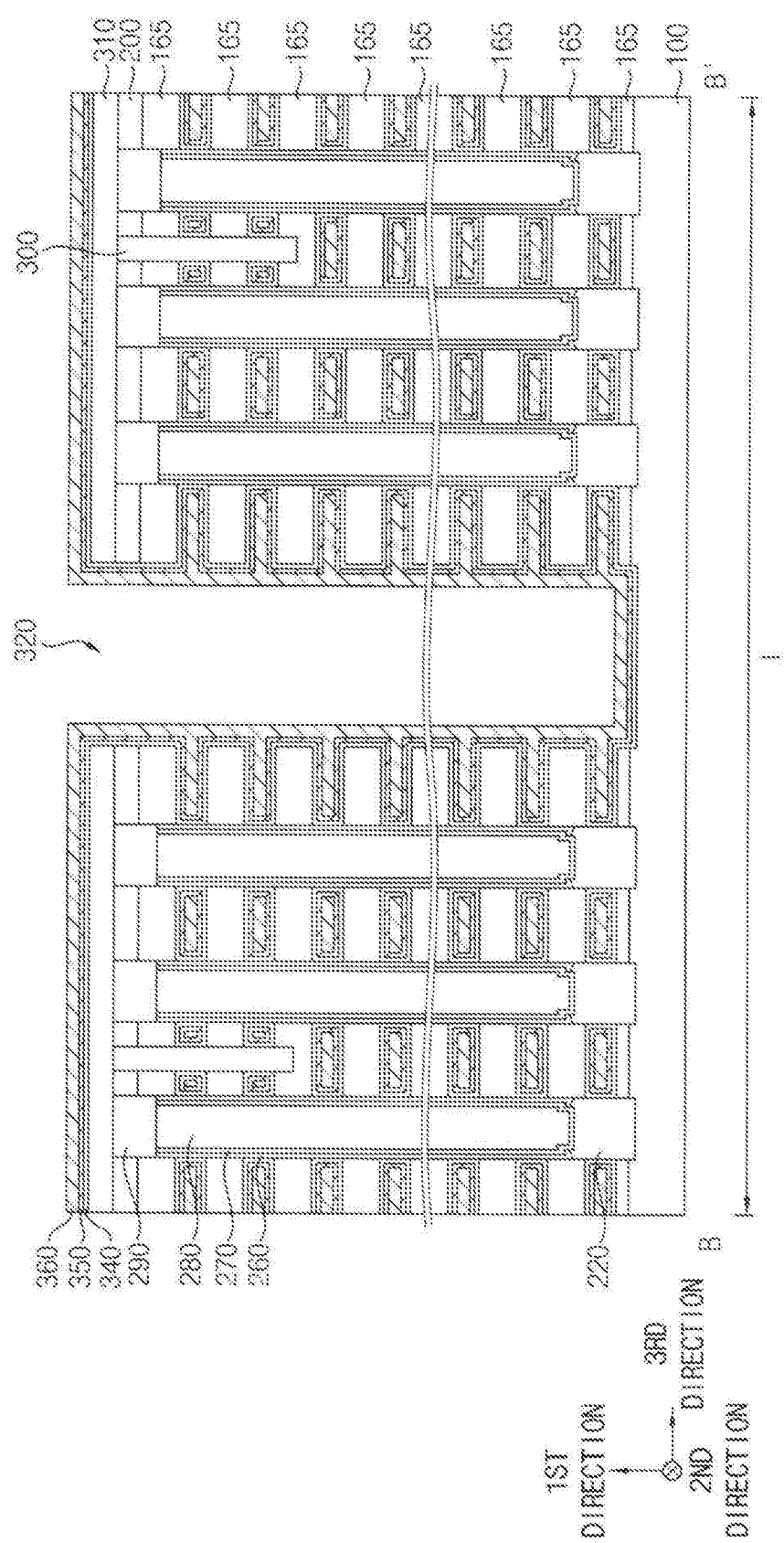

Referring to FIG. 31, after a second blocking layer 340 may be formed on the exposed portion of the sidewall of the second division layer 300, the exposed portion of the outer sidewall of the first blocking pattern 230, the exposed portion of the sidewall of the semiconductor pattern 220, inner walls of the gap 330, surfaces of the insulation patterns 165, and an upper surface of the fourth insulating interlayer 310, a gate barrier layer 350 may be formed on the second blocking layer 340, and a gate conductive layer 360 may be formed on the gate barrier layer 350 to fill remaining portions of the gap 330.

Figure 32:
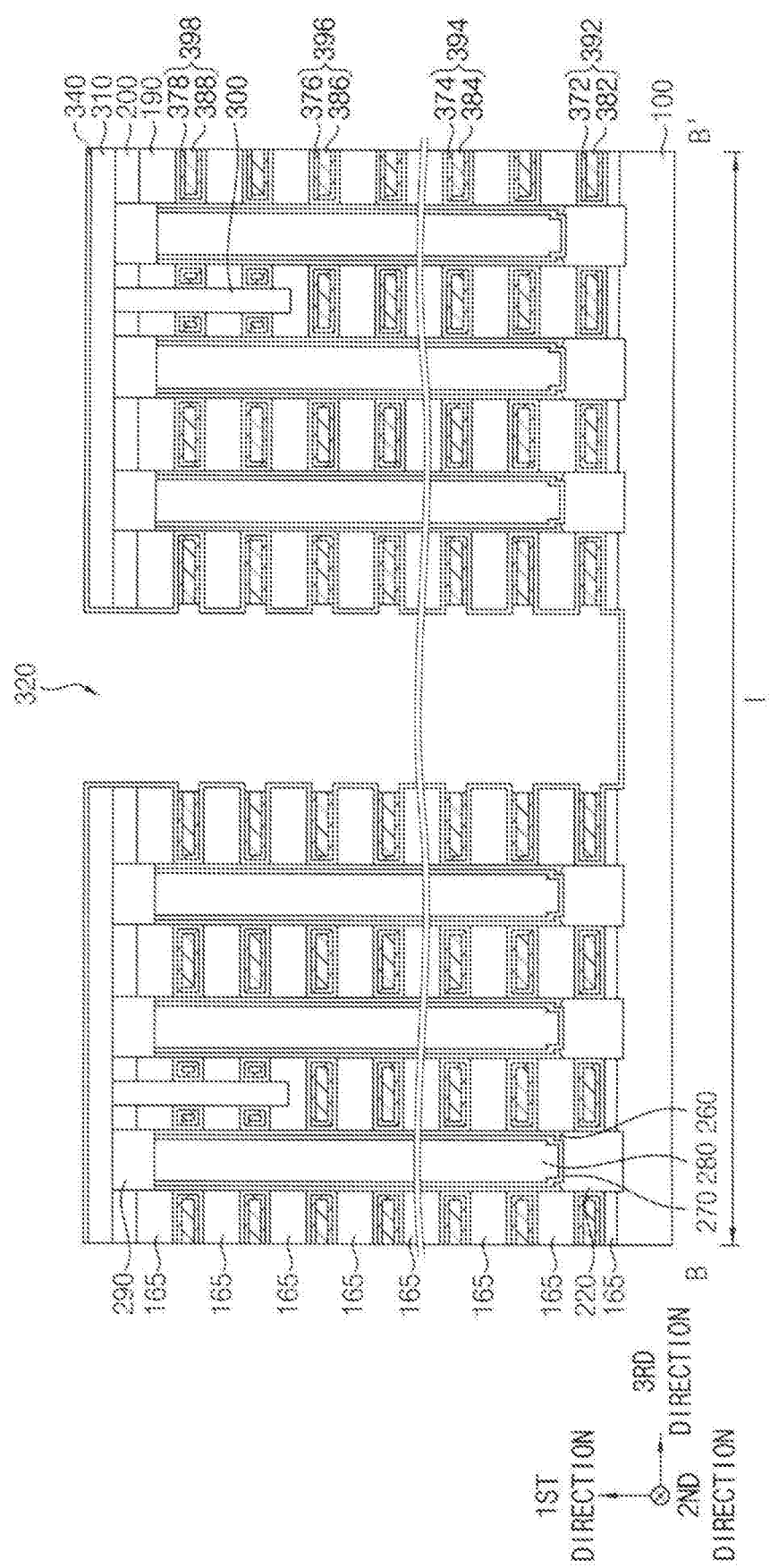
Figure 33:
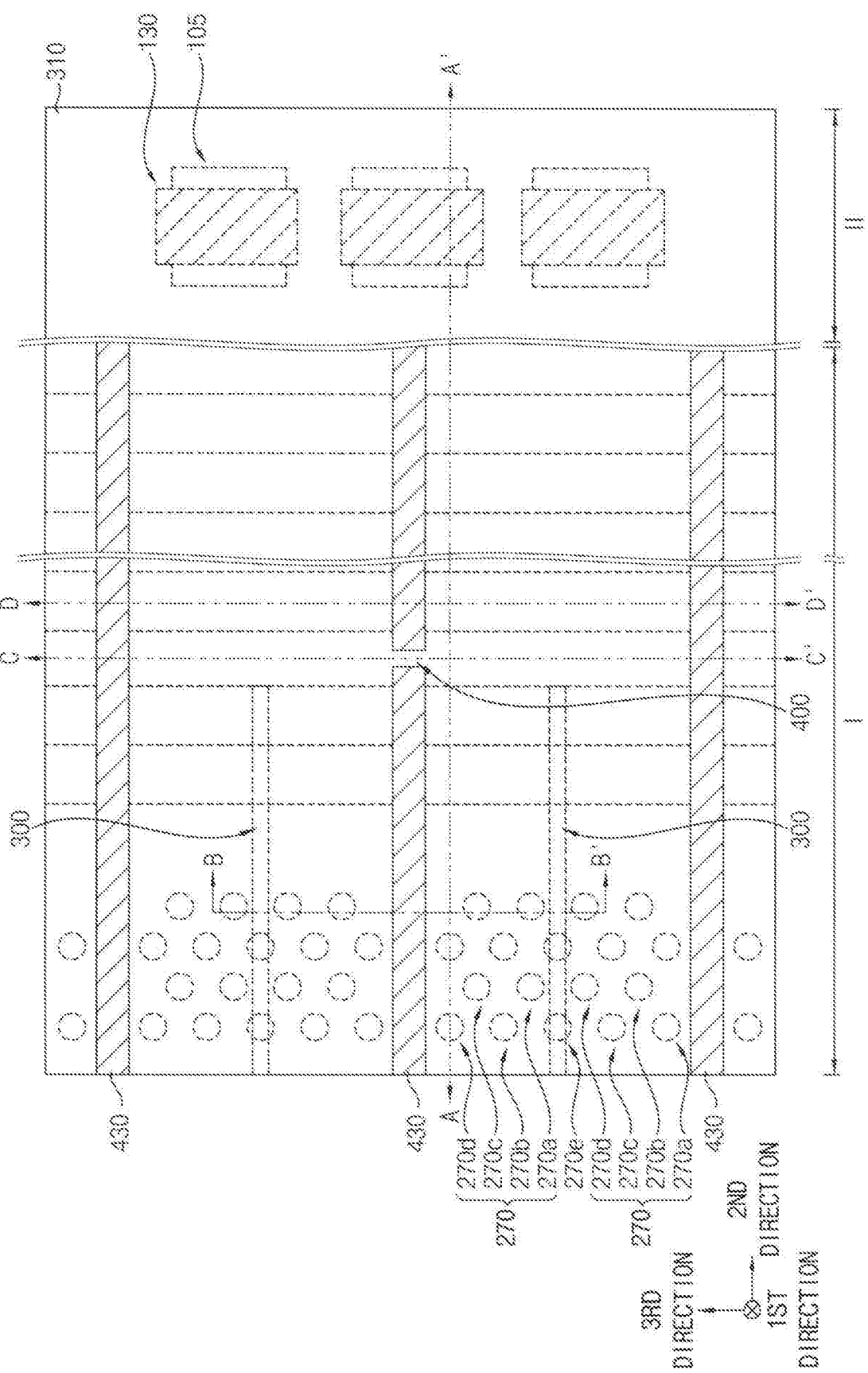
Figure 34:
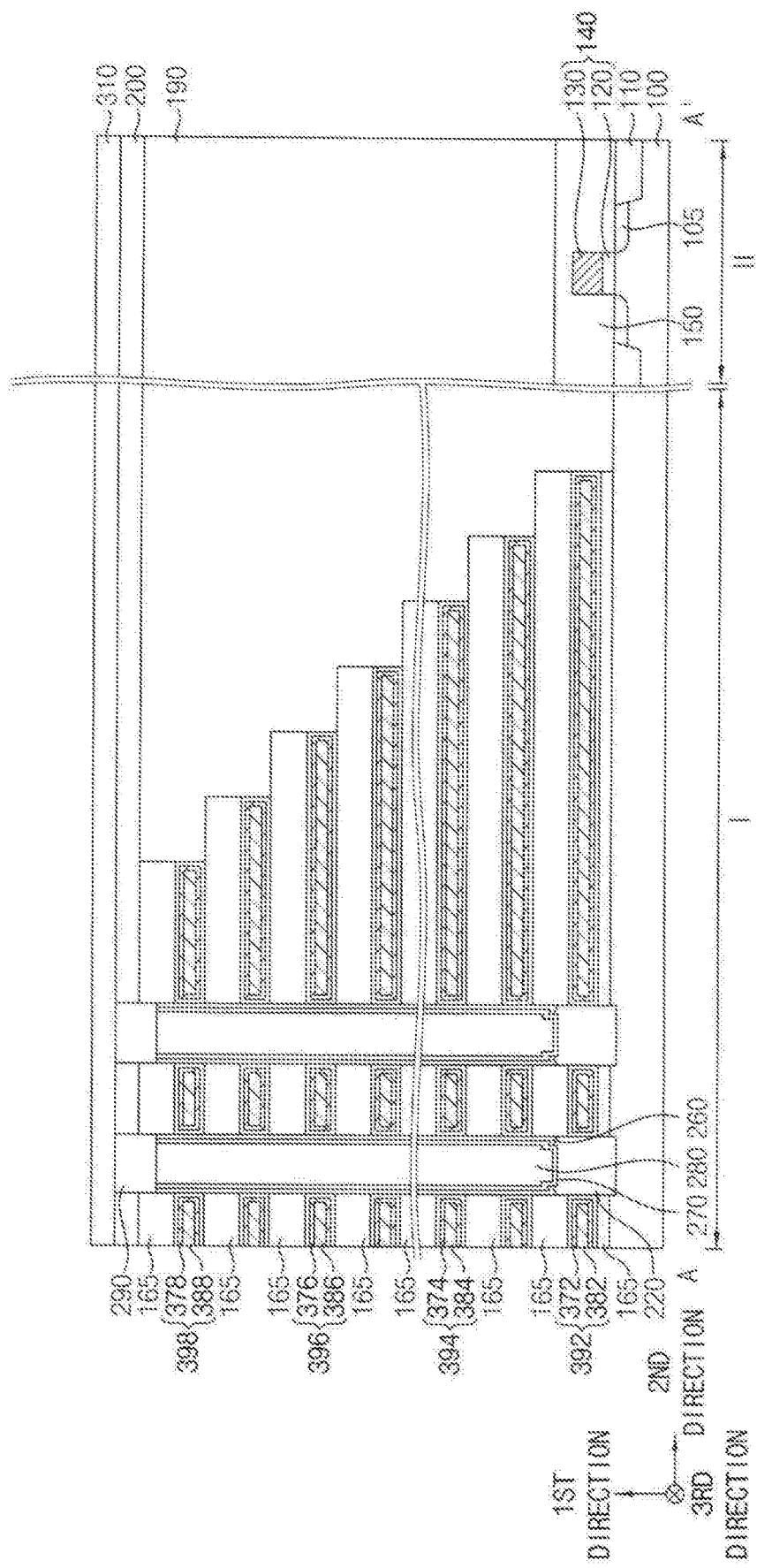
Figure 35:
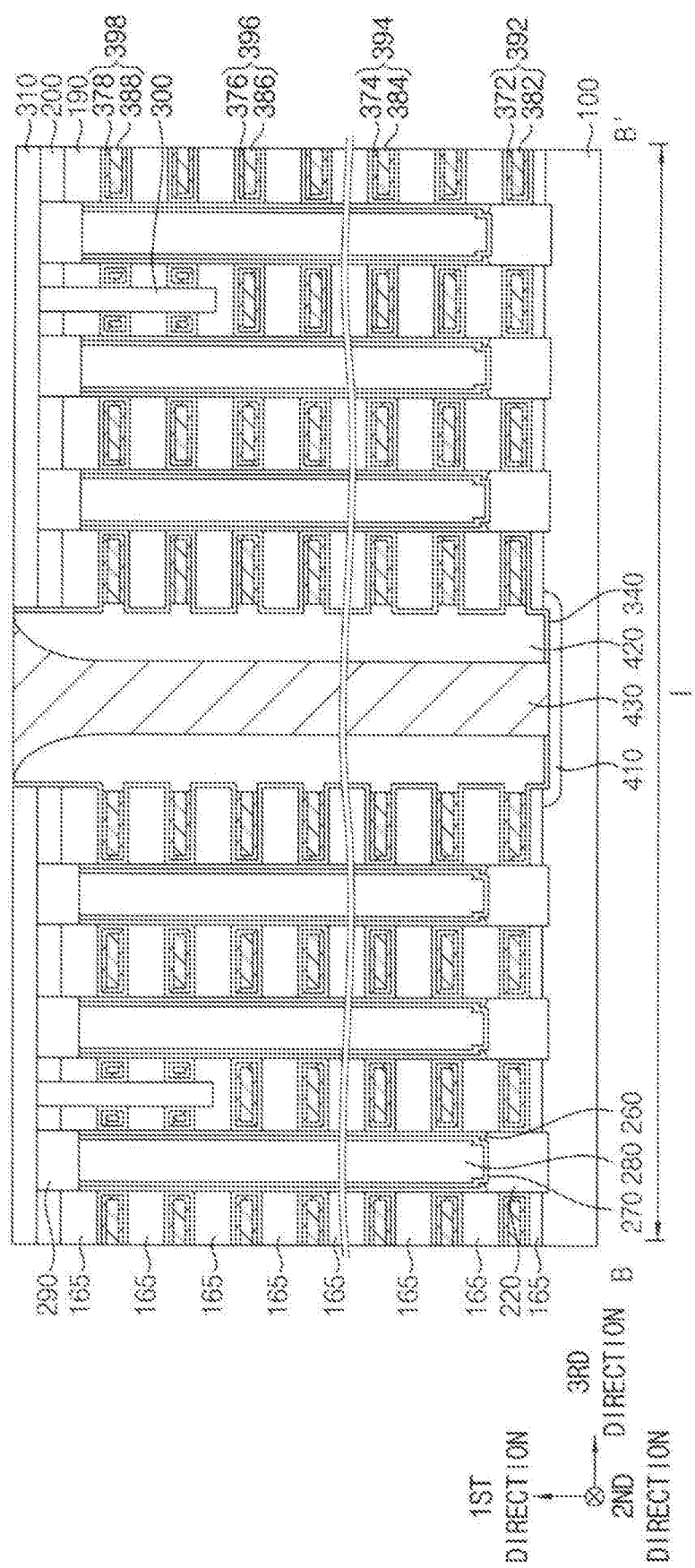

Referring to FIG. 32, the gate conductive layer 360 and the gate barrier layer 350 may be partially removed to form a gate conductive pattern and a gate barrier pattern, respectively, in each of the gap 330, which may form a gate electrode.

In example embodiments, the gate electrode may extend in the second direction, and a plurality of gate electrodes may be formed in the third direction. Thus, the gate electrodes extending in the second direction may be spaced apart from each other by the third and fourth openings 320 and 325. However, the gate electrodes may not completely divided by the fourth opening 325, but may be electrically connected with each other by a conductive connection portion 400 (refer to FIGS. 33 and 36).

In example embodiments, the gate electrodes may be formed at a plurality of levels, respectively, spaced apart from each other in the first direction, and may form a gate electrode structure. The gate electrode structure may include at least one first gate electrode 392, a plurality of second gate electrodes 394, a plurality of third gate electrodes 396, and at least one fourth gate electrode 398 sequentially stacked. The number of levels at which each of the first to fourth gate electrodes 392, 394, 396 and 398 are formed may be changed. That is, the number of gate electrodes may be more or less than four.

Referring to FIGS. 33 to 37, impurities may be implanted into upper portions of the substrate 100 exposed by the third and fourth openings 320 and 325 to form a second impurity region 410.

A second spacer layer may be formed on the exposed upper portion of the substrate 100 by the third and fourth openings 320 and 325, sidewalls of the third and fourth openings 320 and 325, and the upper surface of the fourth insulating interlayer 310, and may be anisotropically etched to form a second spacer 420 on each of the sidewalls of the third and fourth openings 320 and 325.

A common source line (CSL) may be formed on the second impurity region 410 to fill a remaining portion of each of the third and fourth openings 320 and 325.

In example embodiments, a first conductive layer may be formed on the second impurity region 410, the second spacer 420 and the fourth insulating interlayer 310 to fill the third and fourth openings 320 and 325, and may be planarized until the upper surface of the fourth insulating interlayer 310 may be exposed to form the CSL 430. In the planarization process, a portion of the second blocking layer 340 on the fourth insulating interlayer 310 may be also removed. The CSL 430 may be formed in each of the third and fourth openings 320 and 325 to contact an upper surface of the second impurity region 410.

Each of the first to fourth gate electrodes 392, 394, 396 and 398 at the same level may be divided by the CSL 430 and the second spacer 420 in the third and fourth openings 320 and 325 extending in the second direction. However, the fourth opening 325 may have a broken area and thus may not continuously extend to opposite ends of the staircase structure in the second direction, unlike the third opening 320.

Thus, two second gate electrodes 394 neighboring in the third direction at opposite sides of the fourth opening 325 may not be divided from each other but may be electrically connected with each other by the conductive connection portion 400. Likewise, two third gate electrodes 396 neighboring in the third direction at opposite sides of the fourth opening 325 may not be electrically insulated from each other but may be electrically connected with each other by the conductive connection portion 400. The conductive connection portion 400 may include substantially the same material as that of the second and third gate electrodes 394 and 396.

Referring to FIGS. 38 to 41, a fifth insulating interlayer 440 may be formed on the fourth insulating interlayer 310, the CSL 430, the second spacer 420 and the second blocking layer 340, and first to fourth contact plugs 452, 454, 456 and 458 may be formed through the second to fifth insulating interlayers 190, 200, 310 and 440, the insulation pattern 165, the second blocking layer 340, and the respective first to fourth gate barrier patterns 372, 374, 376 and 378 to contact upper surfaces of the respective first to fourth gate conductive patterns 382, 384, 386 and 388. A fifth contact plug 460 may be formed through the first to fifth insulating interlayers 150, 190, 200, 310 and 440 to contact an upper surface of the first impurity region 105.

The first to fifth contact plugs 452, 454, 456, 458 and 460 may be formed by forming first to fourth contact holes (not shown) through the second to fifth insulating interlayers 190, 200, 310 and 400, the insulation pattern 165, the second blocking layer 340, and the respective first to fourth gate barrier patterns 372, 374, 376 and 378 to expose the upper surfaces of the respective first to fourth gate conductive patterns 382, 384, 386 and 388 and a fifth contact hole (not shown) through the first to fifth insulating interlayers 150, 190, 200, 310 and 440 to expose the upper surface of the first impurity region 105, forming a second conductive layer to fill the first to fifth contact holes, and planarizing the second conductive layer until an upper surface of the fifth insulating interlayer 440 may be exposed. That is, the first to fifth contact plugs 452, 454, 456, 458 and 460 may be formed by a single damascene process.

Each of the first to fourth contact plugs 452, 454, 456 and 458 on the first region I of the substrate 100 may be formed on a respective one of the pads.

In example embodiments, the second and third contact plugs 454 and 456 may be alternately formed at opposite ends in the second direction of the word line blocks disposed in the third direction.

Referring to FIGS. 42 to 44, a sixth insulating interlayer 470 may be formed on the fifth insulating interlayer 440 and the first to fifth contact plugs 452, 454, 456, 458 and 460, and a first wiring 480 may be formed through the sixth insulating interlayer 470 to contact an upper surface of the fifth contact plug 460 on the second region II of the substrate 100 by, e.g., a single damascene process.

The first wiring 480 may extend at least in a direction on the second region II of the substrate 100, and may contact at least two of the fifth contact plugs 460 so as to connect them with each other. In example embodiments, a plurality of first wirings 480 may be formed in each of the second and third directions. The layout of the first wirings 480 shown in FIG. 42 is a non-limiting example embodiment, and the first wirings 480 may be disposed by other various layouts.

However, by contrast, no wirings may be formed in the sixth insulating interlayer 470 in the first region I of the substrate 100.

Referring to FIGS. 45 to 49, after forming a seventh insulating interlayer 490 on the sixth insulating interlayer 470 and the first wiring 480, first to seventh vias 502, 504, 506, 508, 520, 542 and 544 and second to seventh wirings 512, 514, 518, 530, 552 and 554 may be formed.

The first via 502 may extend through the sixth and seventh insulating interlayers 470 and 490 to contact an upper surface of the first contact plug 452, and the second wiring 512 may extend through an upper portion of the seventh insulating interlayer 490 to contact an upper surface of the first via 502. The second via 504 may extend through the sixth and seventh insulating interlayers 470 and 490 to contact an upper surface of the second contact plug 454, and the third wiring 514 may extend through an upper portion of the seventh insulating interlayer 490 to contact an upper surface of the second via 504. The third via 506 may extend through the sixth and seventh insulating interlayers 470 and 490 to contact an upper surface of the third contact plug 456. The fourth via 508 may extend through the sixth and seventh insulating interlayers 470 and 490 to contact an upper surface of the fourth contact plug 458, and the fourth wiring 518 may extend through an upper portion of the seventh insulating interlayer 490 to contact an upper surface of the fourth via 508.

Additionally, the fifth via 520 may extend through the seventh insulating interlayer 490 to contact an upper surface of the fifth contact plug 460, and the fifth wiring 530 may extend through an upper portion of the seventh insulating interlayer 490 to contact an upper surface of the fifth via 520. Each of the sixth and seventh vias 542 and 544 may extend through the fourth to seventh insulating interlayers 310, 440, 470 and 490 to contact an upper surface of the capping pattern 290, and each of the sixth and seventh wirings 552 and 554 may extend through an upper portion of the seventh insulating interlayer 490 to contact an upper surface of each of the sixth and seventh vias 542 and 544.

In example embodiments, the first to seventh vias 502, 504, 506, 508, 520, 542 and 544 and the second to seventh wirings 512, 514, 518, 530, 552 and 554 may be formed by a dual damascene process, however, the inventive concepts are not limited thereto.

Referring to FIGS. 50 to 54, an eighth insulating interlayer 560 may be formed on the seventh insulating interlayer 490 and the second to seventh wirings 512, 514, 518, 530, 552 and 554, and sixth and seventh contact plugs 572 and 574 may be formed. The sixth contact plug 572 may extend through the eighth insulating interlayer 560 to contact an upper surface of the third via 506, and the seventh contact plug 574 may extend through the eighth insulating interlayer 560 to contact an upper surface of the fourth wiring 518.

Additionally, eighth to tenth contact plugs 580 may be formed through the eighth insulating interlayer 560. The eighth contact plug 580 may contact an upper surface of the fifth wiring 530, and the ninth and tenth contact plugs 592 and 594 may contact upper surfaces of the sixth and seventh wirings 552 and 554, respectively.

Referring to FIGS. 2 to 11, a ninth insulating interlayer 600 may be formed on the eighth insulating interlayer 560 and the sixth to tenth contact plugs 572, 574, 580, 592 and 594, and eighth and ninth wirings 602 and 604 may be formed through the ninth insulating interlayer 600. The eighth wiring 602 may contact an upper surface of the sixth contact plug 572, and the ninth wiring 604 may contact an upper surface of the seventh contact plug 574.

Additionally, tenth and eleventh wirings 610 and 620 may be formed through the ninth insulating interlayer 600. The tenth wiring 610 may contact an upper surface of the eighth contact plug 580, and the eleventh wirings 620 may contact upper surfaces of the ninth and tenth contact plugs 592 and 594, respectively.

The vertical memory device may be manufactured by the above processes.

Figure 55:
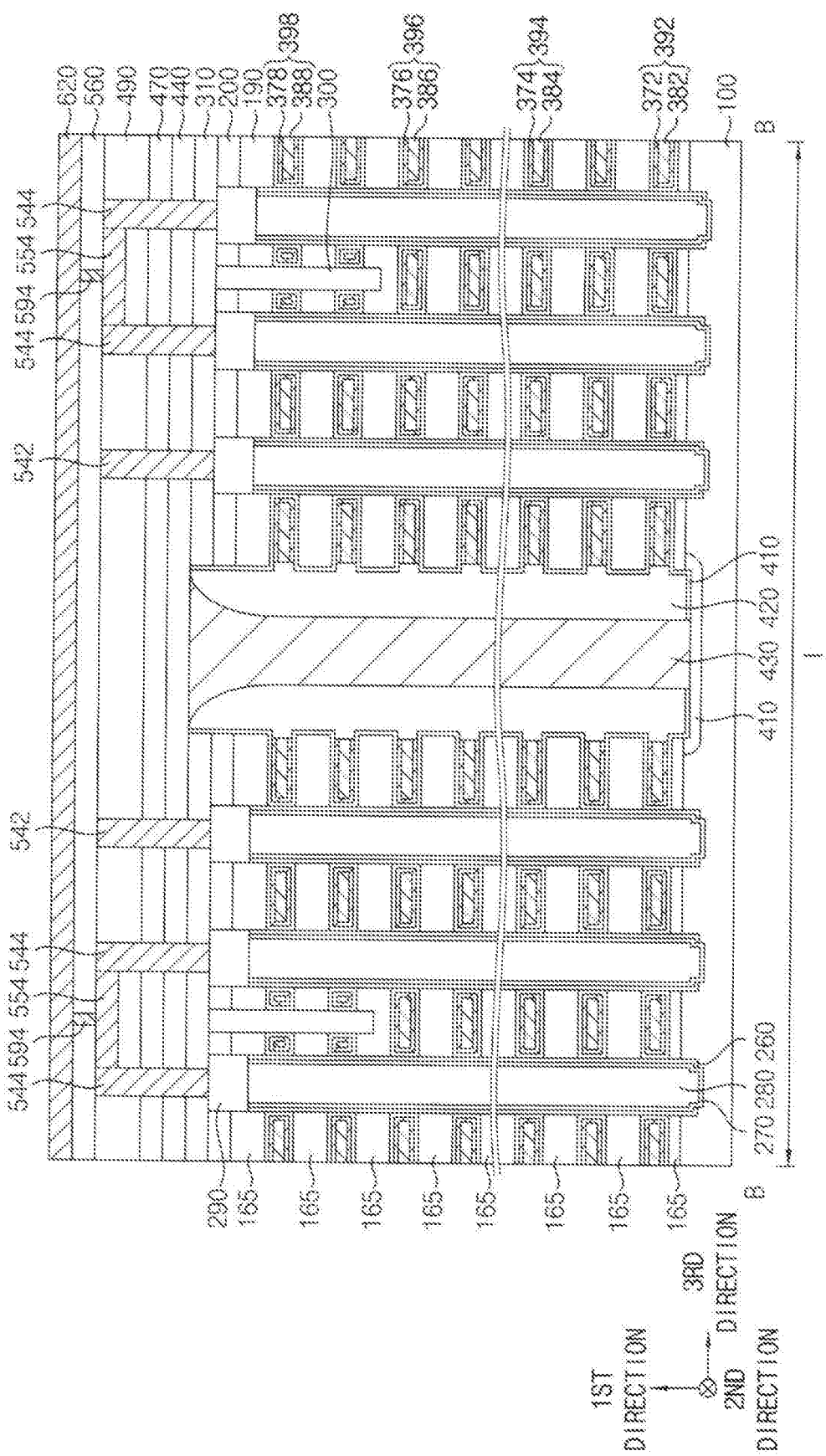
FIGS. 55 and 56 are cross-sectional views illustrating vertical memory devices in accordance with example embodiments.
Figure 56:
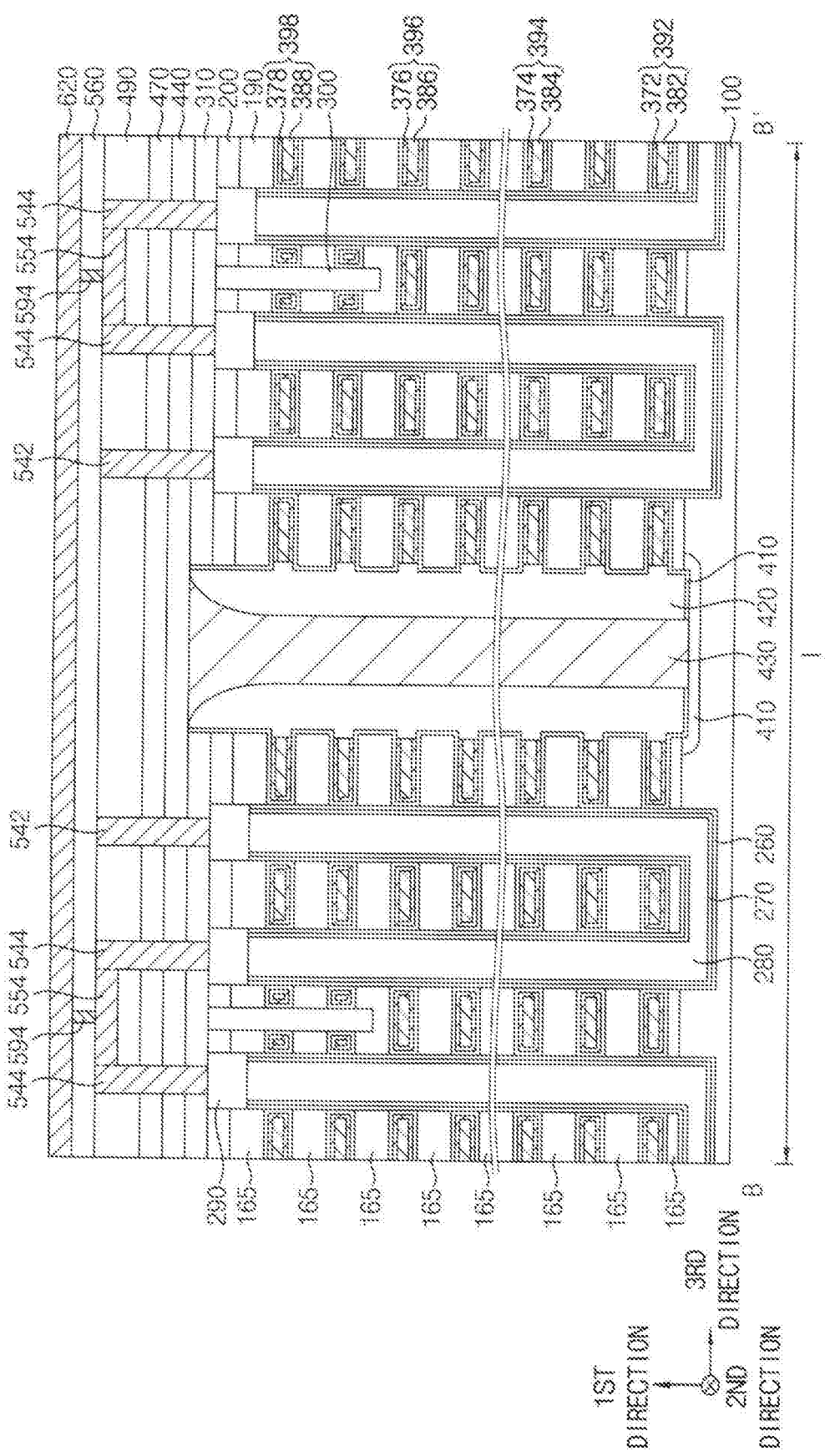

FIGS. 55 and 56 are cross-sectional views illustrating vertical memory devices in accordance with example embodiments. These vertical memory devices may be substantially the same as that of FIGS. 1 to 11, except for the semiconductor pattern, the channel, and the charge storage structure. Thus, like reference numerals refer to like elements, and detailed descriptions thereon are omitted herein for clarity and conciseness.

Referring to FIG. 55, the vertical memory device may include no semiconductor pattern 220. The channel 270 may have a cup-like shape contacting an upper surface of the substrate 100 and the charge storage structure 260 may contact an upper surface of the substrate 100.

Referring to FIG. 56, the vertical memory device may include no semiconductor pattern 220. Neighboring two channels 270 may be connected with each other through a trench at an upper portion of the substrate 100. The charge storage structures covering outer sidewalls of the neighboring two channels 270 may be also connected with each other.

While example embodiments have been particularly shown and described, it will be understood by one of ordinary skill in the art that variations in form and detail may be made therein without departing from the spirit and scope of the claims.

What is claimed is:

1. A vertical memory device comprising:
    a substrate including a cell region and a peripheral circuit region;
    a plurality of first gate electrodes spaced apart from each other on the cell region of the substrate, the plurality of first gate electrodes spaced apart from each other in a first direction substantially perpendicular to an upper surface of the substrate;
    a channel extending through at least a portion of the plurality of first gate electrodes in the first direction on the cell region of the substrate;
    a plurality of first wirings on the cell region of the substrate, the plurality of first wirings being disposed at a plurality of first levels that are higher in the first direction than a plurality of gate electrode levels on which the plurality of first gate electrodes are respectively formed; and
    a plurality of second wirings on the peripheral circuit region of the substrate, the plurality of second wirings being disposed at the plurality of first levels and at a second level that is higher than the plurality of gate electrode levels.

2. The vertical memory device of claim 1, wherein the second level is between an uppermost one of the plurality of gate electrode levels and a lowermost one of the plurality of first levels.

3. The vertical memory device of claim 1, further comprising:
    an active region on the peripheral circuit region of the substrate;
    a second gate electrode on the active region; and
    a second contact plug contacting the active region of the substrate or the second gate electrode, and extending in the first direction,
    wherein a third wiring of the plurality of second wirings is disposed at the second level and contacts an upper surface of the second contact plug.

4. The vertical memory device of claim 3, wherein the second contact plug includes a plurality of second contact plugs, and
    wherein the third wiring commonly contacts upper surfaces of at least two of the plurality of second contact plugs.

5. The vertical memory device of claim 3, wherein the third wiring includes a first portion and a second portion, the first portion extending in a second direction substantially parallel to the upper surface of the substrate, and the second portion extending in a third direction substantially parallel to the upper surface of the substrate and substantially perpendicular to the second direction.

6. The vertical memory device of claim 3, further comprising a plurality of first contact plugs that contact the plurality of first gate electrodes, respectively, each of the plurality of first contact plugs extending in the first direction, and a first contact plug upper surface of each of the plurality of first contact plugs being substantially coplanar with a second contact plug upper surface of the second contact plug.

7. The vertical memory device of claim 6, further comprising a first via contacting a third wiring upper surface of the third wiring and extending in the first direction,
    wherein a fourth wiring of the plurality of second wirings contacts a first upper portion of the first via.

8. The vertical memory device of claim 7, further comprising a plurality of second vias that contact respective first contact plug upper surfaces of the plurality of first contact plugs, respectively, each of the plurality of second vias extending in the first direction, and a second via upper surface of each of the plurality of second vias being substantially coplanar with a third contact plug upper surface of a third contact plug,
    wherein a plurality of fifth wirings of the plurality of first wirings contact second upper portions of the plurality of second vias and are disposed at a fifth wiring level substantially the same as a fourth wiring level of the fourth wiring.

9. The vertical memory device of claim 8, further comprising a third via extending in the first direction to be electrically connected to the channel, a third via upper surface of the third via being substantially coplanar with a first via upper surface and with the second via upper surface,
    wherein a sixth wiring of the plurality of first wirings contacts an upper portion of the third via and is disposed at a sixth wiring level substantially the same as the fourth wiring level and the fifth wiring level.

10. The vertical memory device of claim 9, wherein the third contact plug contacting a sixth wiring upper surface of the sixth wiring and extending in the first direction,
    wherein a seventh wiring of the plurality of first wirings contacts the third contact plug upper surface of the third contact plug and extends in a third direction substantially parallel to the upper surface of the substrate, the seventh wiring serving as a bit line.

11. The vertical memory device of claim 8, further comprising a plurality of fourth contact plugs contacting respective second via upper surfaces of the plurality of second vias, respectively, and extending in the first direction,
    wherein a plurality of eighth wirings of the plurality of first wirings contact fourth contact plug upper surfaces of the plurality of fourth contact plugs, respectively.

12. The vertical memory device of claim 11, further comprising a fifth contact plug contacting a fourth wiring upper surface of the fourth wiring and extending in the first direction, the fifth contact plug being substantially coplanar with the plurality of fourth contact plugs,
    wherein a ninth wiring of the plurality of first wirings contacts a fifth contact plug upper surface of the fifth contact plug and is disposed at a ninth wiring level substantially the same as an eighth wiring level of the plurality of eighth wirings.

13. The vertical memory device of claim 1, wherein the plurality of first gate electrodes have a staircase shape including a plurality of steps of which a plurality of extension lengths in a second direction substantially parallel to the upper surface of the substrate gradually decrease from a lower level toward an upper level, and include a ground select line (GSL), a plurality of word lines, and a string select line (SSL) sequentially stacked from the lower level toward the upper level.

14. The vertical memory device of claim 13, wherein the GSL and a first portion of the plurality of word lines are electrically connected to a fifth wiring through a plurality of first contact plugs and the second via, and
    wherein the SSL and a second portion of the plurality of word lines are electrically connected to an eighth wiring through the plurality of first contact plugs, the second via, and a fourth contact plug.

15. The vertical memory device of claim 13, wherein each of the plurality of word lines at each level includes a plurality of same-level word lines spaced apart from each other in a third direction substantially parallel to the upper surface of the substrate and substantially perpendicular to the second direction, and
    wherein a neighboring two of the plurality of same-level word lines in the third direction at each level are connected with each other by a conductive connection portion to form a word line block.

16. The vertical memory device of claim 15, further comprising a first contact plug electrically connected to the word line block, the first contact plug extending in the first direction.

17. A vertical memory device comprising:
    a substrate including a cell region and a peripheral circuit region;
    a plurality of gate electrodes spaced apart from each other on the cell region of the substrate in a first direction substantially perpendicular to an upper surface of the substrate;
    a channel extending through at least a portion of the plurality of gate electrodes in the first direction on the cell region of the substrate;
    a plurality of first contact plugs contacting gate electrode upper surfaces of the plurality of gate electrodes, respectively, and extending in the first direction;
    a plurality of second contact plugs extending in the first direction on the peripheral circuit region of the substrate, second contact plug upper surfaces of the plurality of second contact plugs being substantially coplanar with first contact plug upper surfaces of the plurality of first contact plugs;
    a plurality of first vias contacting the first contact plug upper surfaces, respectively, and extending in the first direction; and
    a first wiring commonly contacting the second contact plug upper surfaces of at least two of the plurality of second contact plugs on the peripheral circuit region of the substrate,
    wherein the first wiring includes a first portion and a second portion on the peripheral circuit region of the substrate, the first portion extending in a second direction substantially parallel to the upper surface of the substrate, and the second portion extending in a third direction substantially parallel to the upper surface of the substrate and substantially perpendicular to the second direction.

18. The vertical memory device of claim 17, wherein a first via lower surface of the first via is substantially coplanar with a first wiring lower surface of the first wiring, and
    wherein a first via upper surface of the first via is higher than a first wiring upper surface of the first wiring.

19. A vertical memory device comprising:
    a substrate including a cell region and a peripheral circuit region;
    a plurality of gate electrodes spaced apart from each other on the cell region of the substrate in a first direction substantially perpendicular to an upper surface of the substrate;
    a channel extending through at least a portion of the plurality of gate electrodes in the first direction on the cell region of the substrate;
    a plurality of first contact plugs contacting gate electrode upper surfaces of the plurality of gate electrodes, respectively, and extending in the first direction;
    a second contact plug extending in the first direction on the peripheral circuit region of the substrate, a second contact plug upper surface of the second contact plug being substantially coplanar with first contact plug upper surfaces of the plurality of first contact plugs;
    a plurality of first vias contacting the first contact plug upper surfaces of the plurality of first contact plugs, respectively, and extending in the first direction;
    a first wiring including a first portion and a second portion on the peripheral circuit region of the substrate, the first portion extending in a second direction substantially parallel to the upper surface of the substrate, and the second portion extending in a third direction substantially parallel to the upper surface of the substrate and substantially perpendicular to the second direction;
    a second via contacting a first wiring upper surface of the first wiring and extending in the first direction;
    a second wiring contacting a second via upper portion of the second via and extending in at least one of the second direction and the third direction on the peripheral circuit region of the substrate; and
    a third wiring contacting first via upper portions of the plurality of first vias and extending in at least one of the second direction and the third direction on the cell region of the substrate.

* * * * *